United States Patent
Matsuo et al.

(10) Patent No.: US 10,629,810 B2
(45) Date of Patent: Apr. 21, 2020

(54) RESISTANCE-CHANGE TYPE MEMORY DEVICE

(71) Applicant: TOSHIBA MEMORY CORPORATION, Minato-ku, Tokyo (JP)

(72) Inventors: Kouji Matsuo, Ama Aichi (JP); Ryo Fukuoka, Yokkaichi Mie (JP); Yuta Yamada, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/122,616

(22) Filed: Sep. 5, 2018

(65) Prior Publication Data
US 2019/0296233 A1 Sep. 26, 2019

(30) Foreign Application Priority Data

Mar. 20, 2018 (JP) .................................. 2018-052083

(51) Int. Cl.
*H01L 45/00* (2006.01)
*G11C 13/00* (2006.01)

(52) U.S. Cl.
CPC ........ *H01L 45/1233* (2013.01); *G11C 13/003* (2013.01); *H01L 45/1253* (2013.01); *H01L 45/1608* (2013.01)

(58) Field of Classification Search
CPC ............. H01L 27/2463; H01L 27/2481; H01L 27/249; H01L 45/122; H01L 45/1233; H01L 45/1253
See application file for complete search history.

(56) References Cited

U.S. PATENT DOCUMENTS

| 8,436,414 | B2 | 5/2013 | Tanaka et al. |
| 8,633,535 | B2 | 1/2014 | Matsuo et al. |
| 8,642,988 | B2 | 2/2014 | Kinoshita et al. |
| 9,553,101 | B2 | 1/2017 | Kim et al. |
| 9,589,979 | B2 | 3/2017 | Hong |
| 9,666,642 | B2 * | 5/2017 | Park .................... H01L 27/2481 |
| 2015/0340406 | A1 | 11/2015 | Jo |
| 2016/0300850 | A1 | 10/2016 | Tang et al. |
| 2017/0062456 | A1 | 3/2017 | Sugino et al. |

FOREIGN PATENT DOCUMENTS

JP 5722180 B2 5/2015

OTHER PUBLICATIONS

Kinoshita, M., et al., "Scalable 3-D Vertical Chain-Cell-Type Phase-Change Memory with 4F2 Poly-Si Diodes," 2012 Symposium on VLSI Technology Digest of Technical Papers, Jul. 2012, 2 pages.

* cited by examiner

*Primary Examiner* — Allison Bernstein
(74) *Attorney, Agent, or Firm* — Foley & Lardner LLP

(57) ABSTRACT

A resistance-change type memory device includes a substrate, a plurality of electrodes arranged in a first direction parallel to an upper surface of the substrate and extending in a second direction intersecting the upper surface, a resistance-change film provided in a third direction that is parallel to the upper surface and intersects the first direction as viewed from the plurality of electrodes, a semiconductor film provided between the plurality of electrodes and the resistance-change film, and an insulating film provided between the plurality of electrodes and the semiconductor film. The resistance-change film has a resistance value that changes when a current flows therein.

15 Claims, 106 Drawing Sheets

RESISTANCE-CHANGE TYPE MEMORY DEVICE

CROSS-REFERENCE TO RELATED APPLICATION

This application claims the benefit of and priority to Japanese Patent Application No. 2018-052083, filed Mar. 20, 2018, the entire contents of which are incorporated herein by reference.

FIELD

Embodiments described herein relate generally to a resistance-change type memory device.

BACKGROUND

In recent years, there has been proposed a resistance-change type memory device using a resistance-change material having a resistance value that changes when a predetermined amount of current flows therein. In such a resistance-change type memory device, it has also been proposed to improve a degree of integration by three-dimensionally arranging memory cells. In this case, there is a problem in the stability in operation of each memory cell.

DETAILED DESCRIPTION

An embodiment provides a resistance-change type memory device having high stability in operation.

In general, according to some embodiments, a resistance-change type memory device may include a substrate, a plurality of electrodes arranged in a first direction parallel to an upper surface of the substrate and extending in a second direction intersecting the upper surface, a resistance-change film provided in a third direction that is parallel to the upper surface and intersects the first direction as viewed from the electrodes, the resistance-change film having a resistance value that changes when a current flows therein, a semiconductor film provided between an electrode and the resistance-change film, and an insulating film provided between an electrode and the semiconductor film.

First Embodiment

Hereinafter, a first embodiment will be described.

Figure 1:
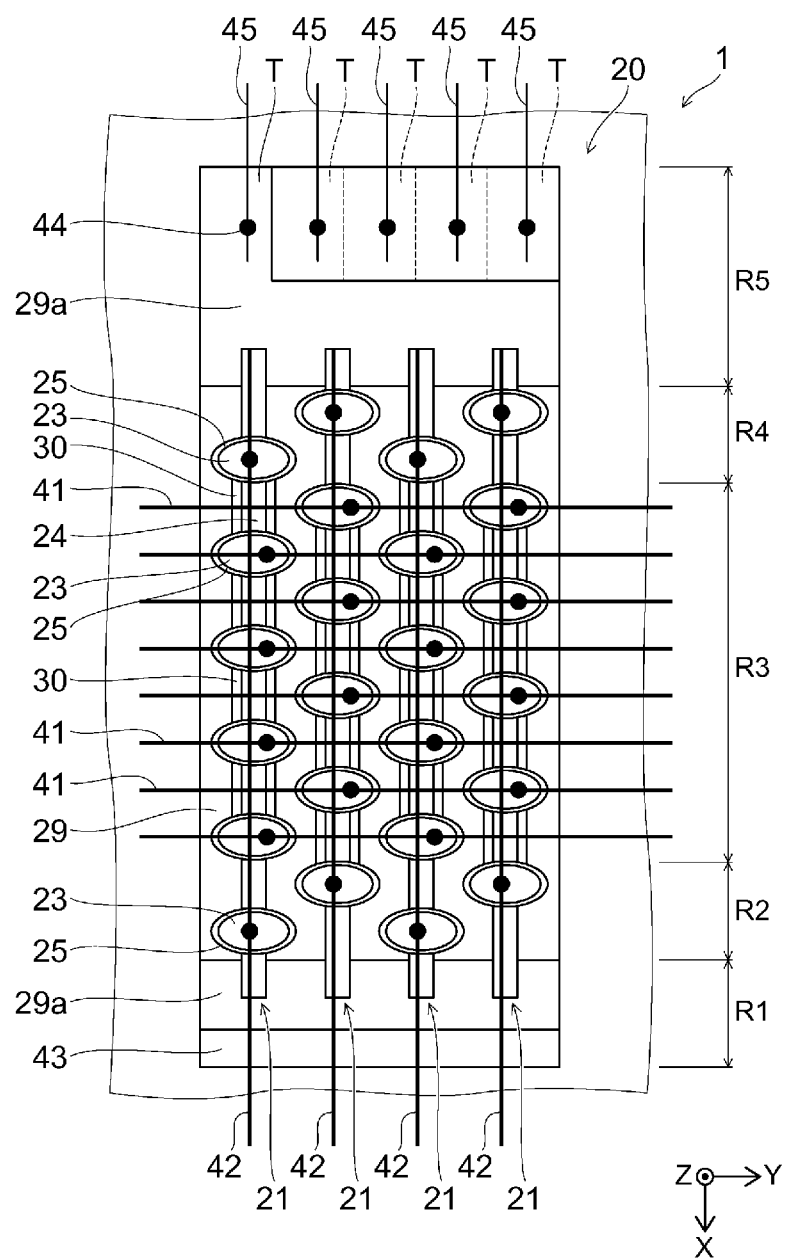
FIG. 1 is a plan view illustrating a resistance-change type memory device according to a first embodiment.

FIG. 1 is a plan view illustrating a resistance-change type memory device according to the first embodiment.

Figure 2A:
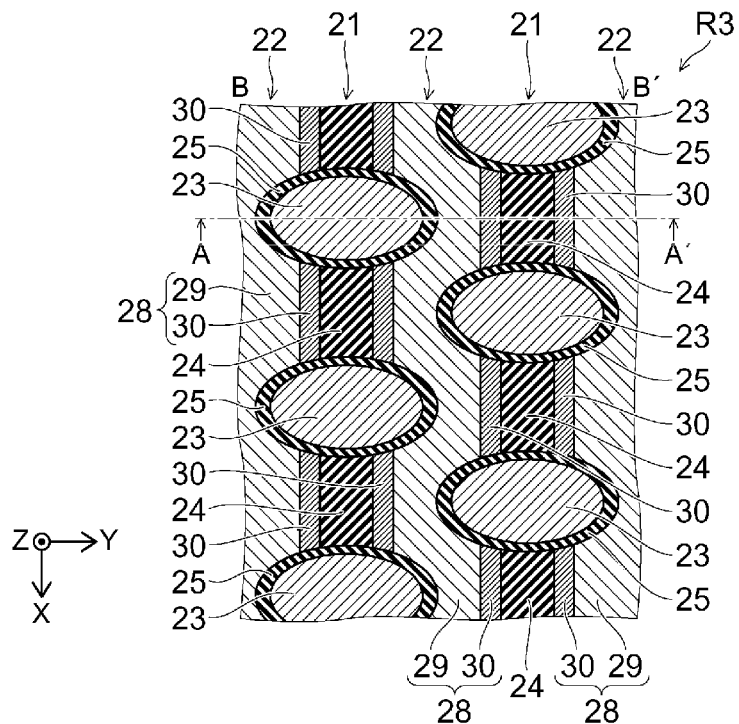
FIG. 2A and FIG. 2B are cross-sectional views illustrating a memory cell region of the resistance-change type memory device according to the first embodiment.
Figure 2B:
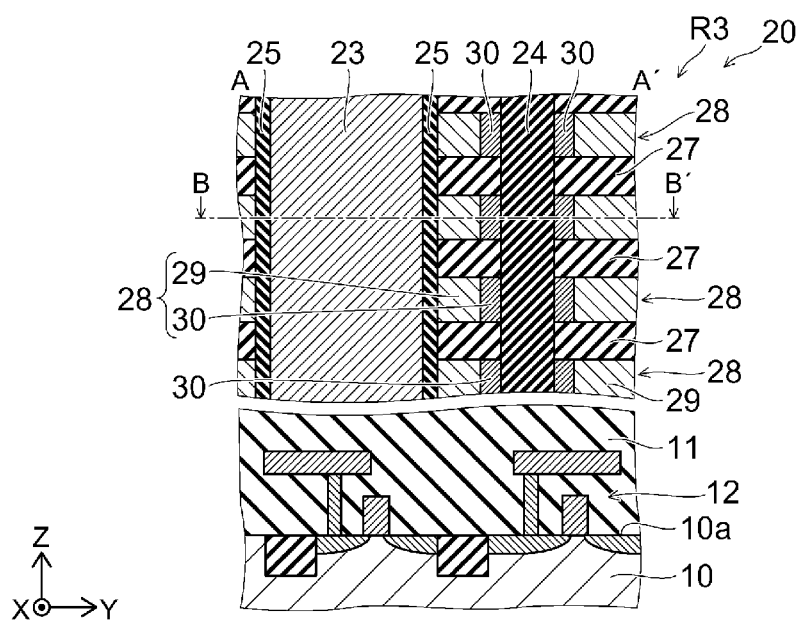

FIG. 2A and FIG. 2B are cross-sectional views illustrating a memory cell region of the resistance-change type memory device according to the first embodiment. FIG. 2B is a cross-sectional view taken along the line A-A' in FIG. 2A, and FIG. 2A is a cross-sectional view taken along the line B-B' in FIG. 2B.

Each drawing may be schematic and may be drawn with exaggeration and omission as appropriate. For example, the components may be shown less or drawn in larger scale than in actual one. In addition, among the drawings, the number of components, the ratio of dimensions, and the like are not necessarily the same.

The resistance-change type memory device according to the first embodiment is a three-dimensional nonvolatile memory device.

As illustrated in FIG. 1, FIG. 2A, and FIG. 2B, a silicon substrate 10 is provided in a resistance-change type memory device 1 according to the first embodiment. The silicon substrate 10 may be made of, for example, a single crystal of silicon. An interlayer insulating film 11 made of, for example, silicon oxide (SiO) may be provided on the silicon substrate 10.

Hereinafter, in the present disclosure, an XYZ orthogonal coordinate system is employed for convenience of explanation. The direction of arrangement of the silicon substrate 10 and the interlayer insulating film 11 is defined as a "Z direction," and two directions which are parallel to an interface between the silicon substrate 10 and the interlayer insulating film 11, that is, an upper surface 10a of the silicon substrate 10 and are orthogonal to each other are defined as an "X direction" and a "Y direction." Further, in the Z direction, a direction from the silicon substrate 10 to the interlayer insulating film is also referred to as "upper," and its reverse direction is referred to as "lower." This expression is for convenience only and is not related to the direction of gravity.

A drive circuit 12 including a metal-oxide-semiconductor field-effect Transistor (MOSFET) or the like may be formed in an upper layer portion of the silicon substrate 10 and a lower layer portion of the interlayer insulating film 11.

A stacked body 20 may be provided on the interlayer insulating film 11. In the stacked body 20, a source region R1, a source-side select transistor region R2, a memory cell region R3, a drain-side select transistor region R4, and a drain region R5 may be set in this order along the X direction.

First, the memory cell region R3 will be described.

As illustrated in FIG. 2A and FIG. 2B, in the memory cell region R3, a plurality of gate structures 21 and a plurality of channel stacked bodies 22 may be provided on the interlayer insulating film 11. The gate structures 21 may have a plate-like shape expanding along the XZ plane. In the memory cell region R3, the gate structures 21 and the channel stacked bodies 22 may be alternately arranged along the Y direction (see FIG. 2A). As illustrated in FIG. 1, the plurality of channel stacked bodies 22 (see FIG. 2A) may be connected to each other in the source-side select transistor region R2 and the drain-side select transistor region R4.

Each of the gate structures 21 may be provided with columnar gate electrodes 23 extending in the Z direction and columnar insulating members 24 extending in the Z direction. The gate electrodes 23 and the insulating members 24 may be alternately arranged along the X direction. The expression of a member "extending in the Z direction" means that the length of the member in the Z direction is longer than the length in the X direction and the length in the Y direction. The same is true for the case of "extending in the X direction" and the case of "extending in the Y direction."

When viewed from the Z direction, the gate electrodes 23 may be arranged in a zigzag pattern. That is, in two gate structures 21 adjacent to each other in the Y direction, the positions of the gate electrodes 23 in the X direction may be displaced from each other (see FIG. 2A), and in the gate structures 21 arranged at every other position in the Y direction, the positions of the gate electrodes 23 in the X direction may be the same as each other. In the two adjacent gate structures 21, the positions of the gate electrodes 23 of one gate structure 21 in the X direction may be the same as the positions of the insulating members 24 of the other gate structure 21 in the X direction (see FIG. 2A).

Each gate electrode 23 may be formed of a conductive material such as, for example, tungsten (W). The gate electrode 23 may have, for example, a substantially elliptic cylindrical shape in which the central axis extends in the Z direction, the major axis direction of the ellipse is the Y direction, and the minor axis direction is the X direction. A gate insulating film 25 made of, for example, silicon oxide may be provided on the lateral surface of the gate electrode 23. Each insulating member 24 may be formed of an insulating material such as, for example, silicon oxide. The insulating member 24 may have, for example, a substantially quadrangular prism shape. The insulating member 24 may be in contact with the gate insulating film 25. The length of the gate electrode 23 in the Y direction may be longer than the length of the insulating member 24 in the Y direction. Therefore, the gate electrode 23 and the gate insulating film 25 may overhang both sides in the Y direction with respect to the insulating member 24.

In the channel stacked body 22, insulating films 27 and conductive films 28 may be alternately stacked in the Z direction. The insulating films 27 and the conductive films 28 may extend in the X direction. Each insulating film 27 may be formed of an insulating material such as, for example, silicon oxide, and may be in contact with the insulating member 24 and the gate insulating film 25.

Each conductive film 28 may be provided with one silicon film 29 extending in the substantially X direction and a plurality of resistance-change films 30. In the source-side select transistor region R2, the memory cell region R3, and the drain-side select transistor region R4, the silicon film 29 may be a semiconductor film. The silicon film 29 may be in contact with the gate insulating film 25 and the resistance-change film 30. The gate insulating film 25 may be interposed between the silicon film 29 and the gate electrode 23. The resistance-change film 30 may be interposed between the silicon film 29 and the insulating member 24.

With respect to the Y direction, the resistance-change film 30 may be disposed between the silicon film 29 and the insulating member 24. With respect to the X direction, the resistance-change film 30 may be disposed for each portion projecting from the insulating member 24 in the gate insulating film 25. The resistance-change film 30 may be a film having a resistance value that changes when a current flows therein, and is, for example, a phase change memory (PCM) film. The resistance-change film 30 is not limited to the PCM film, but may be, for example, a filament type resistance-change film made of a metal oxide, or a conductive bridging memory (CBM) film.

The stacked body 20 may be provided with a plurality of gate lines 41 extending in the Y direction. Each gate line 41 may be commonly connected to the gate electrodes 23 at the same position in the X direction, that is, every single gate electrode 23 belonging to every other gate structure 21 in the Y direction (see FIG. 1).

Next, the source-side select transistor region R2 and the drain-side select transistor region R4 will be described.

As illustrated in FIG. 1, the resistance-change film 30 is not provided in the source-side select transistor region R2 and the drain-side select transistor region R4. As illustrated in FIG. 1, the silicon film 29 may be in contact with the gate insulating film 25. In some embodiments, the gate electrode 23 is not connected to the gate line 41, and may be connected to a select gate line 42. The select gate line 42 may be disposed on the gate line 41 and may extend in the X direction.

Next, the source region R1 and the drain region R5 will be described.

In some embodiments, in the source region R1 and the drain region R5, the gate structure 21 is not provided. In the silicon film 29 of the channel stacked body 22, an n+ type portion 29a containing a high concentration of an impurity serving as a donor may be formed and is made of a conductive film. The n+ type portion 29a may connect the silicon films 29 of the plurality of channel stacked bodies 22 arranged along the Y direction in the memory cell region R3.

The source region R1 may be provided with a plate-like through source line 43 made of a conductive material such as tungsten and expanding along the YZ plane. The through source line 43 may be commonly connected to the n+ type portions 29a of all the silicon films 29 stacked in the Z direction.

In the drain region R5, the end portion of the stacked body 20 may be formed into a step shape (not illustrated), and a terrace T may be formed for each silicon film 29. A contact 44 may be provided on the terrace T, which is connected to the silicon film 29. The contact 44 may be connected to a bit line 45 extending in the X direction.

Next, an operation of the resistance-change type memory device according to the first embodiment will be described.

Figure 3A:
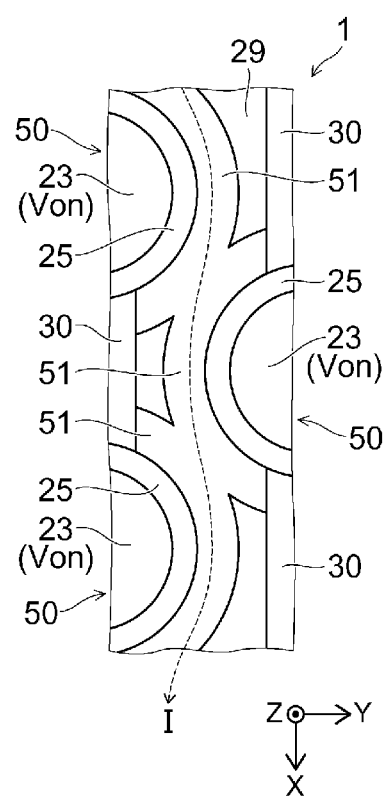
FIG. 3A and FIG. 3B are views illustrating an operation of the resistance-change type memory device according to the first embodiment.
Figure 3B:
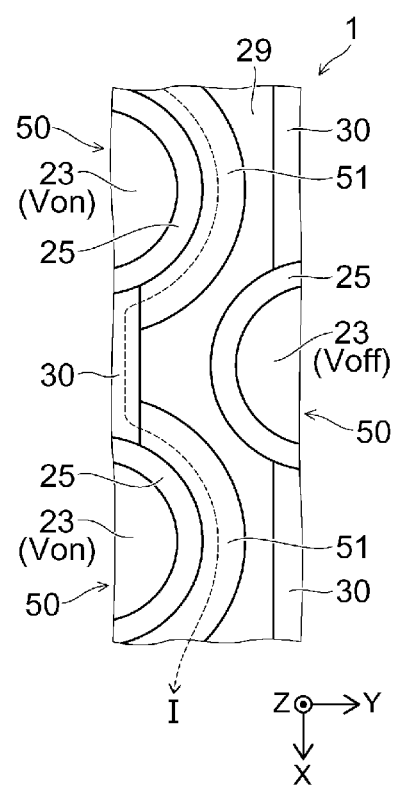

FIG. 3A and FIG. 3B are views illustrating an operation of the resistance-change type memory device according to the first embodiment. FIG. 3A illustrates a state where no memory cell is selected, and FIG. 3B illustrates a state where one memory cell is selected.

As illustrated in FIG. 3A and FIG. 3B, the resistance-change type memory device 1 may be provided with field effect transistors 50 each including a gate electrode 23 as a gate, a gate insulating film 25 as a gate insulating film, and a silicon film 29 as a channel. In the memory cell region R3, a resistance-change film 30 may be provided for each transistor 50 to constitute a memory cell. In each memory cell, the silicon film 29 as a channel of the transistor 50 and the resistance-change film 30 may form a parallel current path.

Meanwhile, in the source-side select transistor region R2 and the drain-side select transistor region R4, the transistor 50 may function as a select transistor for selecting a channel. Since the resistance-change film 30 is not provided in the source-side select transistor region R2 and the drain-side select transistor region R4, the current path may be formed only by the silicon film 29 which is the channel of the transistor 50.

It is preferable that a resistance value Ron of the silicon film 29 when the transistor 50 is turned ON is lower than a resistance value RL when the resistance-change film 30 is in a low resistance state. That is, it is preferable that Ron<RL. It is more preferable that the resistance value Ron is less than $\frac{1}{10}$ of the resistance value RL. That is, it is more preferable that Ron<(0.1×RL). As a result, when the transistor 50 is turned ON, the current flowing between the bit line 45 and the through source line 43 can mainly flow through the silicon film 29.

Meanwhile, it is preferable that a resistance value Roff of the silicon film 29 when the transistor 50 is turned OFF is higher than a resistance value RH when the resistance-change film 30 is in a high resistance state. That is, it is preferable that RH<Roff. It is more preferable that the resistance value Roff is larger than 10 times the resistance value RH. That is, it is more preferable that (10×RH)<Roff. As a result, when the transistor 50 is turned OFF, the current flowing between the bit line 45 and the through source line 43 can mainly flow through the resistance-change film 30.

In summary, it is desirable that Ron<RL<RH<Roff, and preferably, Ron<0.1×RL)<(10×RH)<Roff, where Ron is an ON resistance of the transistor 50, Roff is an OFF resistance, RL is a low resistance of the resistance-change film 30, and RH is a high resistance.

Hereinafter, descriptions will be made on an operation of selecting one memory cell from the memory cell region R3.

As illustrated in FIG. 1, a predetermined level of voltage may be applied between the through source line 43 and one bit line 45 (hereinafter, referred to as a "bit-source voltage"). For example, a ground potential (GND) is applied to the through source line 43, a predetermined positive potential is applied to one bit line 45, and a ground potential is applied to another bit line 45. The potential applied to the bit line 45 may be transmitted to the silicon film 29 disposed at a predetermined position in the Z direction via the contact and the n+ type portion 29a. As a result, the Z coordinate of the selected memory cell can be determined.

Further, a potential at which the transistor 50 is turned ON (hereinafter, referred to as "ON potential Von") may be applied to two adjacent select gate lines 42, and a potential at which the transistor 50 is turned OFF (hereinafter, referred to as "OFF potential Voff") may be applied to the other select gate lines 42. Therefore, the silicon film 29 between the two select gate lines 42 to which the ON potential Von is applied can go into a conductive state, and the bit-source voltage can be transmitted to one silicon film 29. As a result, the Y coordinate of the selected memory cell can be determined.

Further, an OFF potential may be applied to one gate line 41 and an ON potential may be applied to another gate line 41. The potential applied to the gate lines 41 may be transmitted to the gate electrodes 23. As a result, the X coordinate of the selected memory cell can be determined. In this manner, one memory cell can be selected. Hereinafter, this operation will be described in detail.

As illustrated in FIG. 3A, when an ON potential Von is applied to a gate electrode 23, a depletion layer 51 may be formed in a portion of the silicon film 29 located around the gate electrode 23, so that a conduction state is established. When the ON potential Von is applied to all the gate electrodes 23 located on both sides of a certain silicon film 29 in the Y direction, the depletion layers 51 may be connected to form a current path formed of the depletion layers 51 over the entire length of the silicon film 29 in the X direction, and a current I may flow through this current path.

Meanwhile, as illustrated in FIG. 3B, when an OFF potential Voff is applied to one gate electrode 23 and an ON potential Von is applied to the other gate electrodes 23, no depletion layer 51 is formed around the gate electrode 23 to which the OFF potential Voff is applied, so that the current path formed by the depletion layers 51 is discontinued. Then, in this discontinued portion, the current I may flow through the resistance-change film 30, and a bit-source voltage may be applied to the resistance-change film 30. In this manner, the X coordinate of the selected memory cell can be determined. In this description, voltage drop in the portion other than the resistance-change film 30 in the current path is ignored. The same is true for other embodiments to be described later.

Next, descriptions will be made on a write operation, a read operation, and an erasing operation of data for the memory cell selected as described above.

At the time of the write operation, the bit-source voltage may serve as a set voltage. The set voltage may be a voltage at which the resistance-change film 30 changes from a high resistance state to a low resistance state. As a result, the resistance-change film 30 of the selected memory cell can change from the high resistance state to the low resistance state, and data can be written in the memory cell.

At the time of the read operation, the bit-source voltage may serve as a read voltage. The read voltage may be a voltage capable of detecting the resistance state of the resistance-change film 30 without changing the resistance state of the resistance-change film 30. As a result, the data can be read out from the selected memory cell.

At the time of the erasing operation, the bit-source voltage may serve as a reset voltage. The reset voltage may be a voltage at which the resistance-change film 30 changes from a low resistance state to a high resistance state. As a result, the data can be erased from the selected memory cell. In this manner, the resistance-change type memory device 1 according to the first embodiment can be driven.

Next, effects of the first embodiment will be described.

In the first embodiment, in each memory cell, the silicon film 29, which is a channel of the transistor 50, and the resistance-change film 30 may form a parallel current path. As a result, when the transistor 50 is turned ON, the current I can mainly flow through the silicon film 29, and when the transistor 50 is turned OFF, the current I can mainly flow through the resistance-change film 30. In this manner, it is possible to freely supply and cut off the current to the resistance-change film 30. As a result, the resistance-change type memory device 1 according to the first embodiment can have high stability in operation.

In the first embodiment, the resistance value Ron of the silicon film 29 when the transistor 50 is turned ON may be set to be lower than the resistance value RL when the resistance-change film 30 is in the low resistance state, and the resistance value Roff of the silicon film 29 when the transistor 50 is turned OFF may be set to be higher than the resistance value RH when the resistance-change film 30 is in the high resistance state. As a result, it is possible to more effectively switch the path of the current I. It is more effective when the resistance value Ron is set to be less than ¹/₁₀ of the resistance value RL and the resistance value Roff is set to be higher than 10 times the resistance value RH.

Furthermore, in the first embodiment, the resistance-change film 30 may be divided and disposed for each memory cell. Therefore, in a portion of the current path where the resistance-change film 30 is not provided, the current I may flow reliably in the silicon film 29 which is the channel of the transistor 50. Thus, the path of the current I may be effectively controlled by driving the transistor 50. Further, since the resistance-change film 30 is divided for each memory cell, interference between memory cells may be reduced. Therefore, the stability of the operation may also be improved.

Next, a method of manufacturing the resistance-change type memory device according to the first embodiment will be described.

FIG. 4A and FIG. 4B to FIG. 16A and FIG. 16B are cross-sectional views illustrating a method for manufacturing the resistance-change type memory device according to the first embodiment.

Figure 4A:
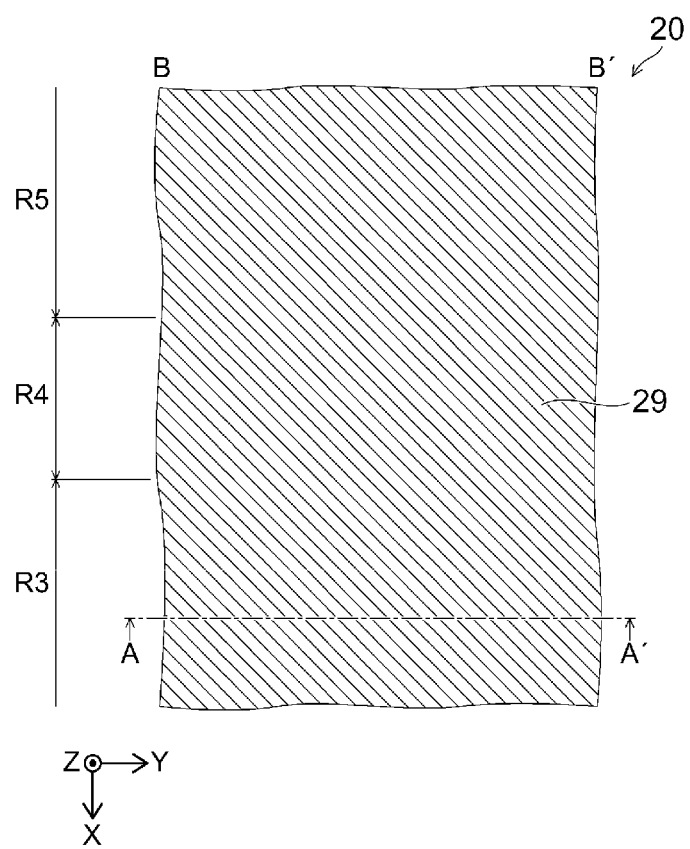
FIG. 4A and FIG. 4B are cross-sectional views illustrating a method for manufacturing the resistance-change type memory device according to the first embodiment.
Figure 4B:
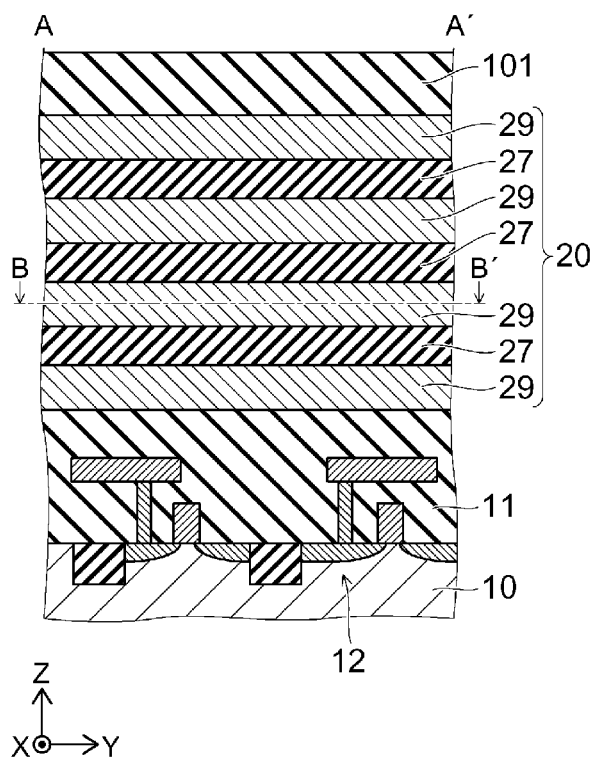

FIG. 4B is a cross-sectional view taken along the line A-A' in FIG. 4A, and FIG. 4A is a cross-sectional view taken along the line B-B' in FIG. 4B. The same is true for FIG. 5A to FIG. 16B.

First, as illustrated in FIG. 4A and FIG. 4B, an interlayer insulating film 11 may be formed on a silicon substrate 10, and a drive circuit 12 may be formed in an upper layer portion of the silicon substrate 10 and a lower layer portion of the interlayer insulating film 11. Next, silicon films 29 made of polysilicon and insulating films 27 made of silicon oxide may be alternately deposited on the interlayer insulating film 11 to form a stacked body 20. Next, a hard mask 101 may be formed on the stacked body 20.

Figure 5A:
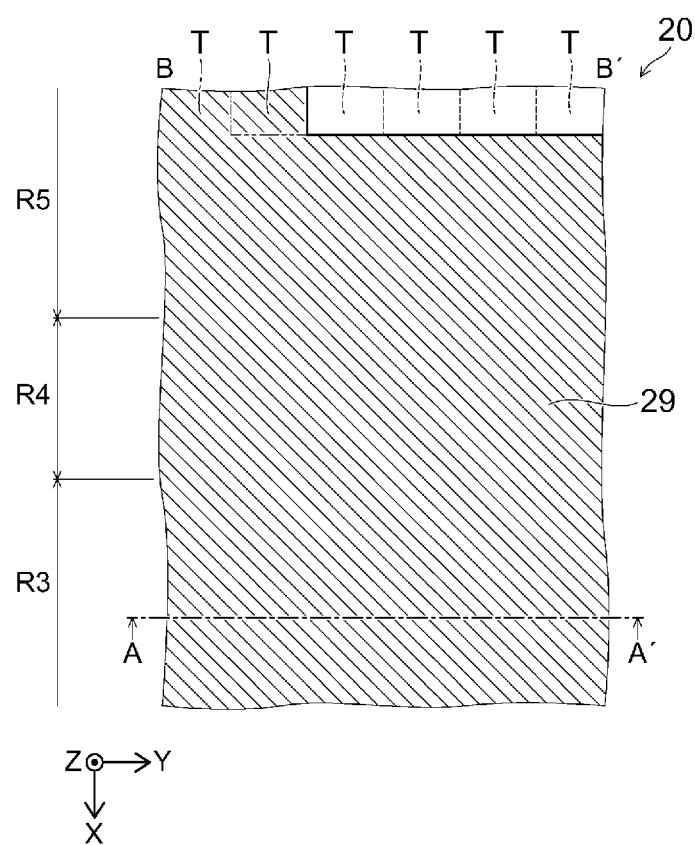
FIG. 5A and FIG. 5B are cross-sectional views illustrating a method for manufacturing the resistance-change type memory device according to the first embodiment.
Figure 5B:
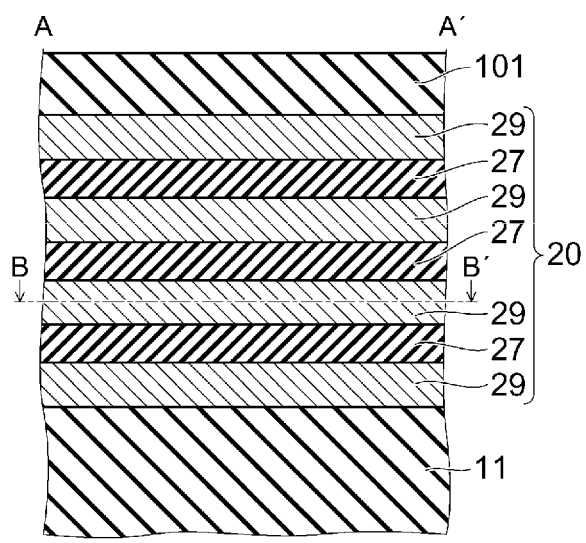

Next, as illustrated in FIG. 5A and FIG. 5B, etching using the hard mask 101 as a mask and reduction of the hard mask 101 may be repeatedly performed such that the end portion on the side of the drain region R5 in the stacked body 20 is processed into a step shape (not illustrated). As a result, a terrace T can be formed for each silicon film 29. In FIG. 5B and the subsequent figures, the silicon substrate 10 and the drive circuit 12 are omitted.

Figure 6A:
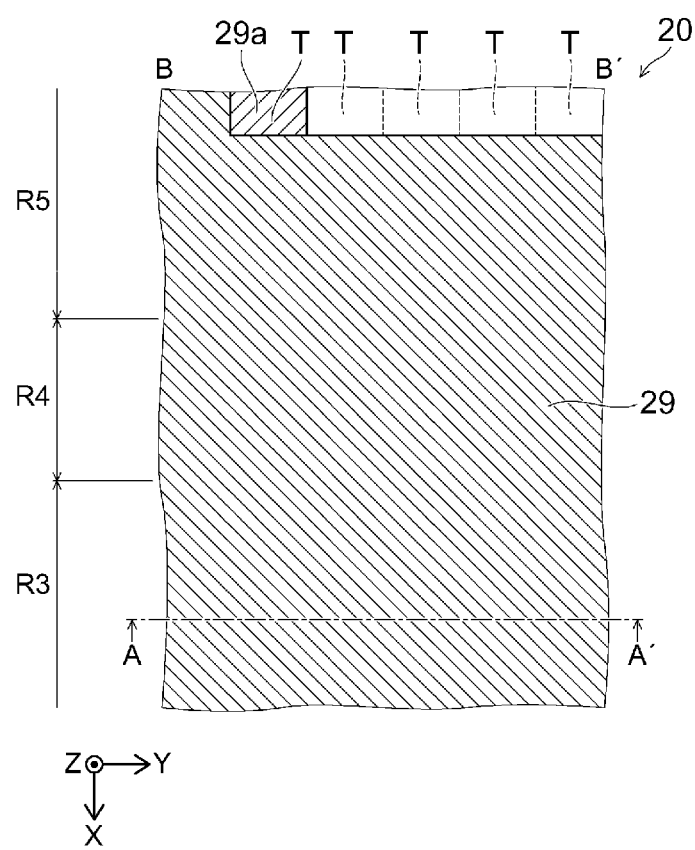
FIG. 6A and FIG. 6B are cross-sectional views illustrating a method for manufacturing the resistance-change type memory device according to the first embodiment.
Figure 6B:
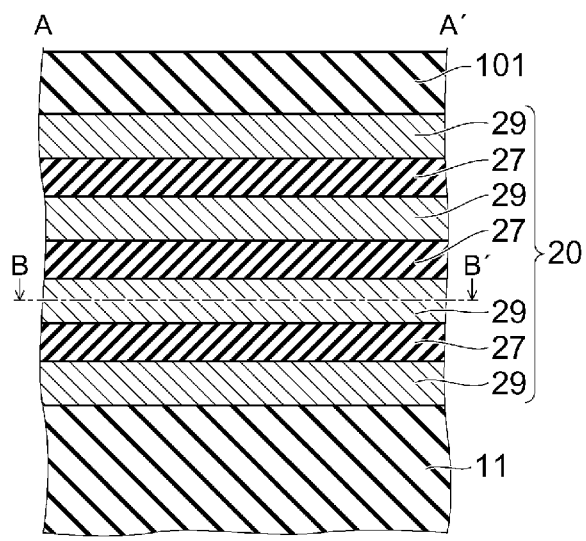

Next, as illustrated in FIG. 6A and FIG. 6B, an impurity serving as a donor, for example, phosphorus (P) may be ion-implanted using the hard mask 101 as a mask. As a result, an n+ type portion 29a can be formed in the exposed portion of the terrace T in each silicon film 29.

Figure 7A:
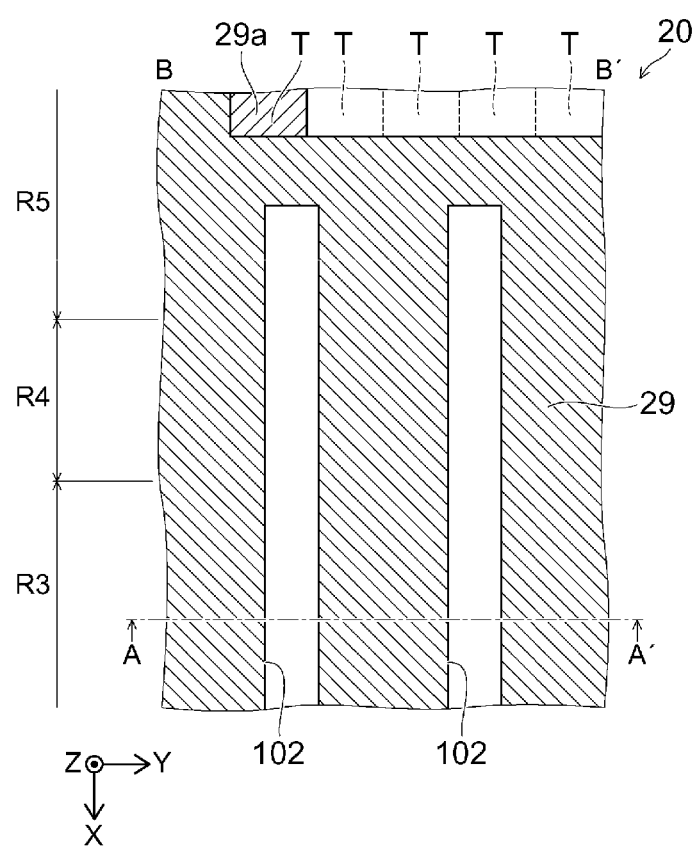
FIG. 7A and FIG. 7B are cross-sectional views illustrating a method for manufacturing the resistance-change type memory device according to the first embodiment.
Figure 7B:
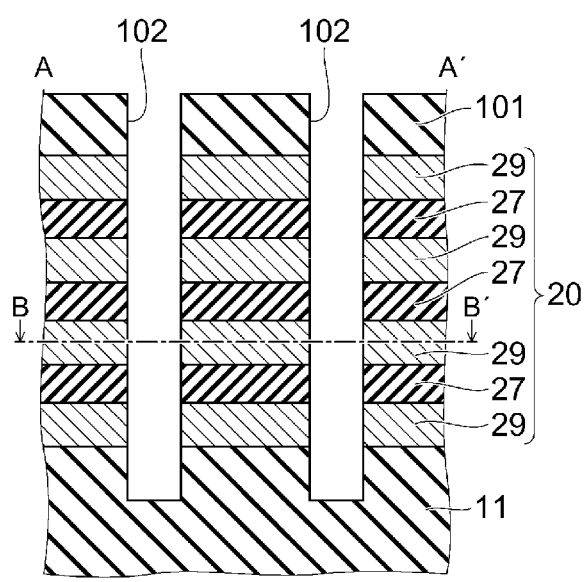

Next, as illustrated in FIG. 7A and FIG. 7B, trenches 102 extending in the X direction may be formed in the stacked body 20. The trenches 102 may be formed over a portion of the source region R1 (see FIG. 1) on the source-side select transistor region R2 (see FIG. 1) side, the entire length of the source-side select transistor region R2, the entire length of the memory cell region R3, the entire length of the drain-side select transistor region R4, and a portion of the drain region R5 on the drain-side select transistor region R4 side, in the X direction. The trenches 102 may penetrate the stacked body 20 and enter the upper layer portion of the interlayer insulating film 11.

Figure 8A:
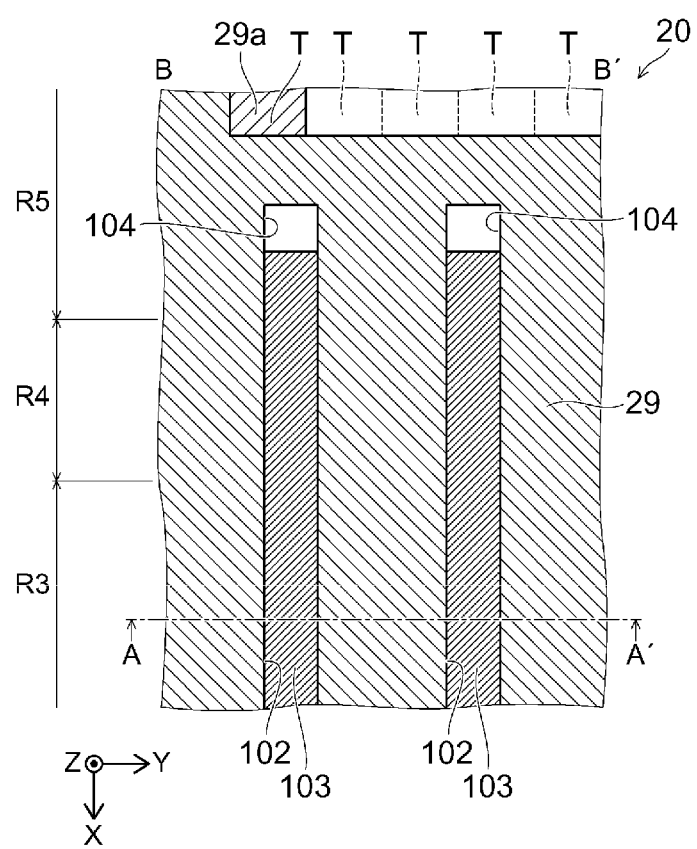
FIG. 8A and FIG. 8B are cross-sectional views illustrating a method for manufacturing the resistance-change type memory device according to the first embodiment.
Figure 8B:
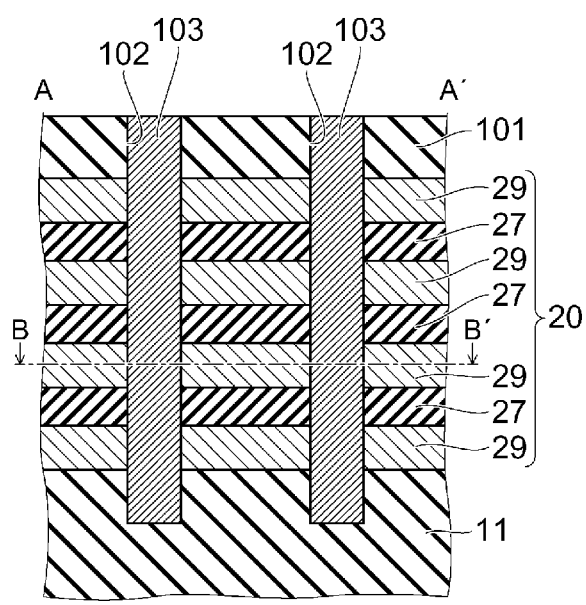

Next, as illustrated in FIG. 8A and FIG. 8B, for example, a sacrificial member 103 containing carbon (C) may be embedded in each trench 102. Next, the sacrificial member 103 may be removed at both ends of the trench 102 in the X direction. As a result, holes 104 can be formed at both ends of the trench 102 in the X direction.

Figure 9A:
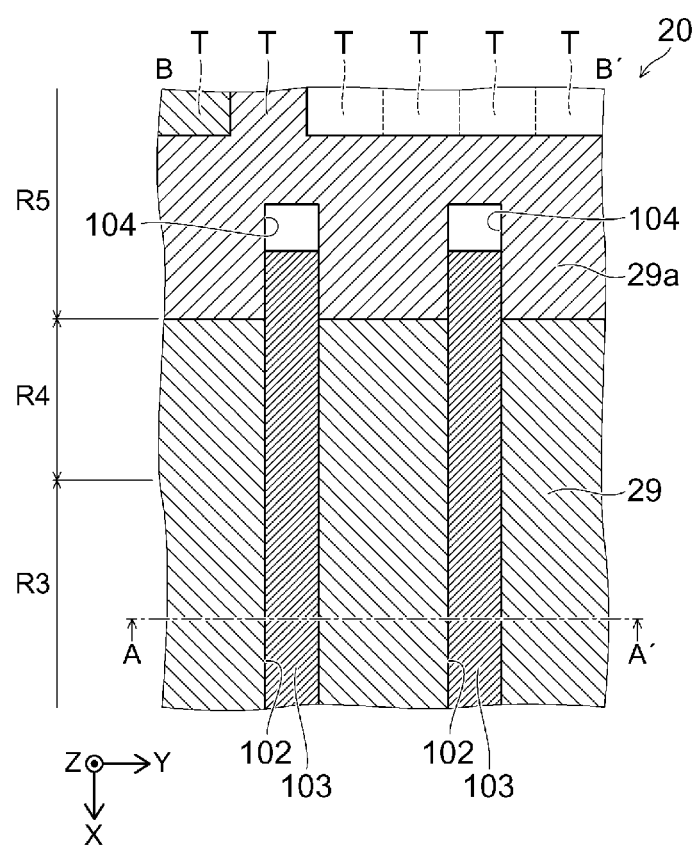
FIG. 9A and FIG. 9B are cross-sectional views illustrating a method for manufacturing the resistance-change type memory device according to the first embodiment.
Figure 9B:
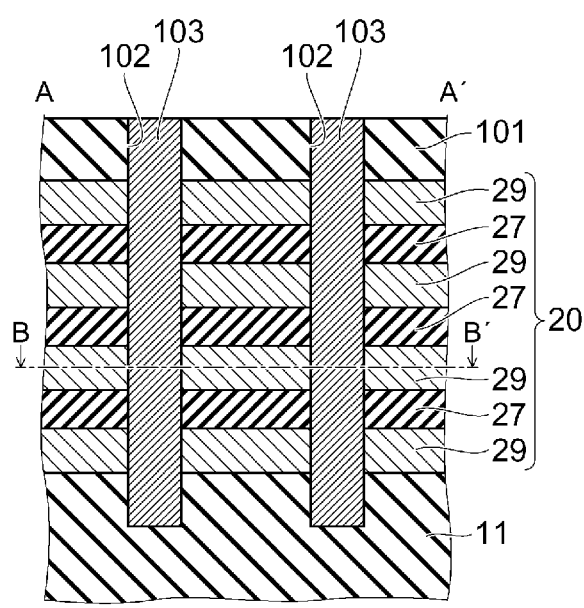

Next, as illustrated in FIG. 9A and FIG. 9B, phosphorus may be introduced into the silicon film 29 by gas phase diffusion through the holes 104. As a result, the n+ type portion 29a can be formed in the portion of the silicon film 29 located in the source region R1 (see FIG. 1) and the drain region R5.

Figure 10A:
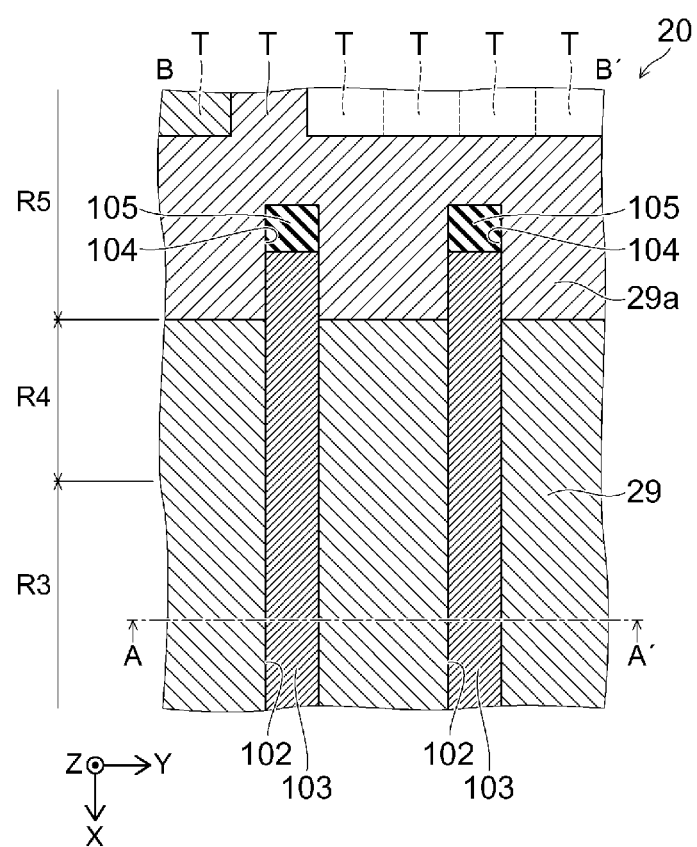
FIG. 10A and FIG. 10B are cross-sectional views illustrating a method for manufacturing the resistance-change type memory device according to the first embodiment.
Figure 10B:
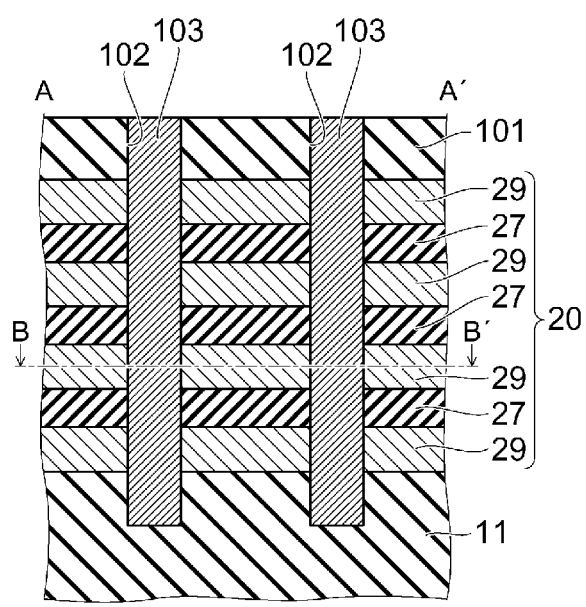

Next, as illustrated in FIG. 10A and FIG. 10B, the silicon oxide may be embedded in the hole 104 to form a silicon oxide member 105.

Figure 11A:
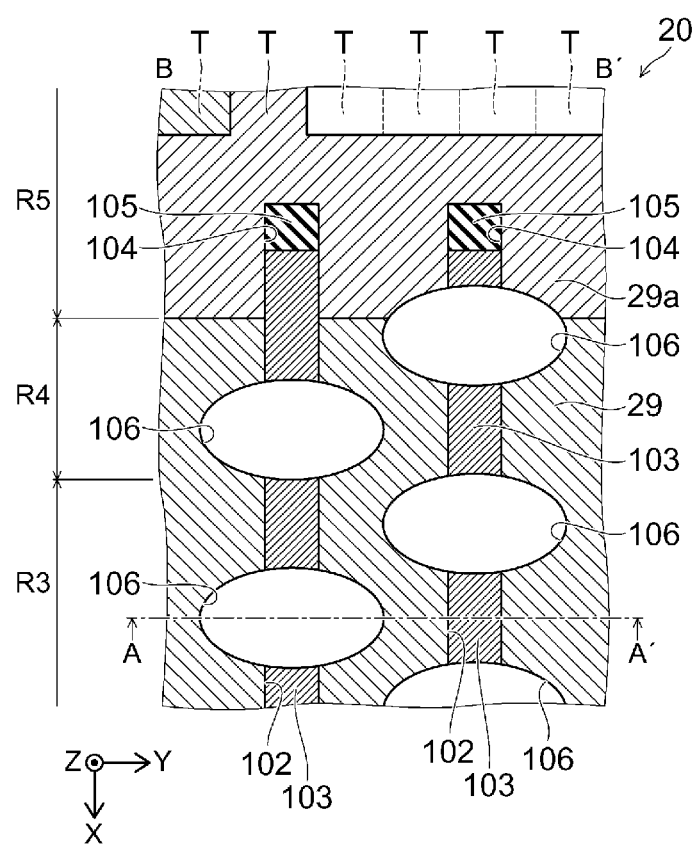
FIG. 11A and FIG. 11B are cross-sectional views illustrating a method for manufacturing the resistance-change type memory device according to the first embodiment.
Figure 11B:
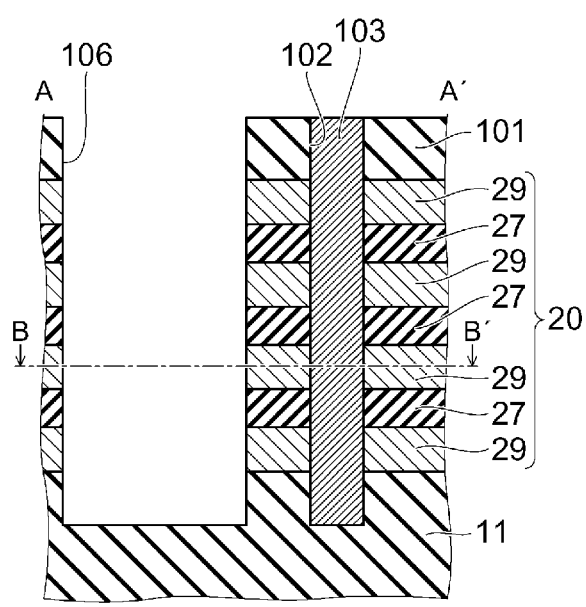

Next, as illustrated in FIG. 11A and FIG. 11B, holes 106 may be formed. The holes 106 may be arranged in a zigzag pattern so as to divide the sacrificial members 103. When viewed from the Z direction, each hole 106 may have, for example, an elliptical shape in which the long axis direction is the X direction and the short axis direction is the Y axis direction. The holes 106 may penetrate the stacked body 20 and enter the upper layer portion of the interlayer insulating film 11.

Figure 12A:
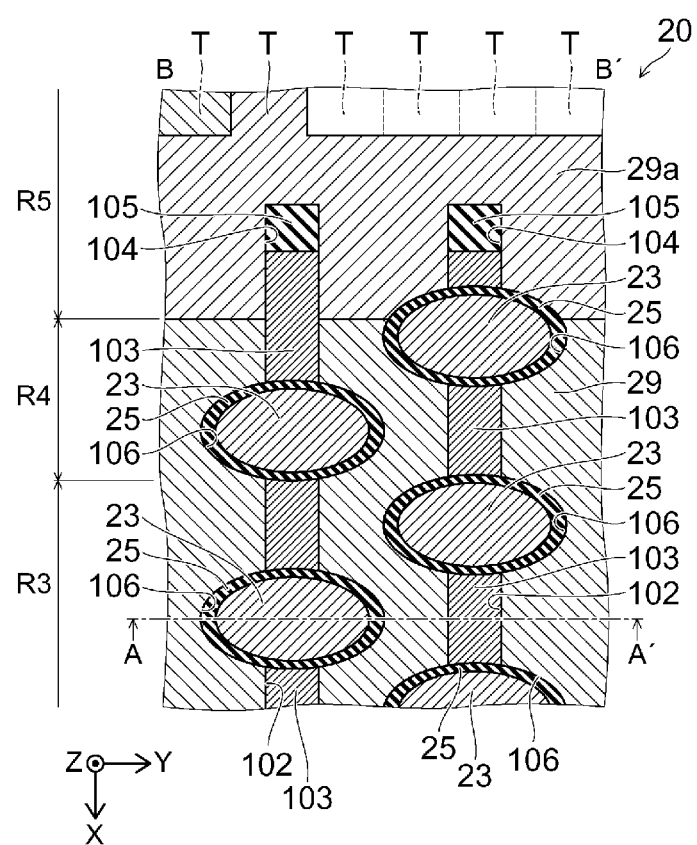
FIG. 12A and FIG. 12B are cross-sectional views illustrating a method for manufacturing the resistance-change type memory device according to the first embodiment.
Figure 12B:
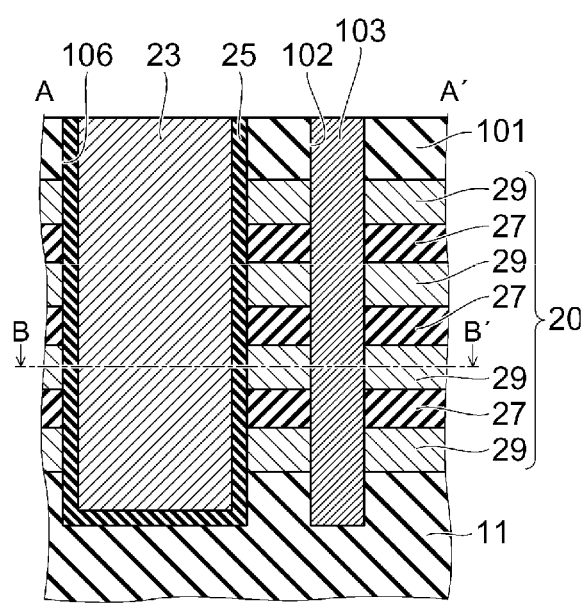

Next, as illustrated in FIG. 12A and FIG. 12B, for example, silicon oxide may be deposited to form a gate insulating film 25 on the inner surface of each hole 106. Next, for example, tungsten may be deposited to form a gate electrode 23 in the hole 106 and on the gate insulating film 25.

Figure 13A:
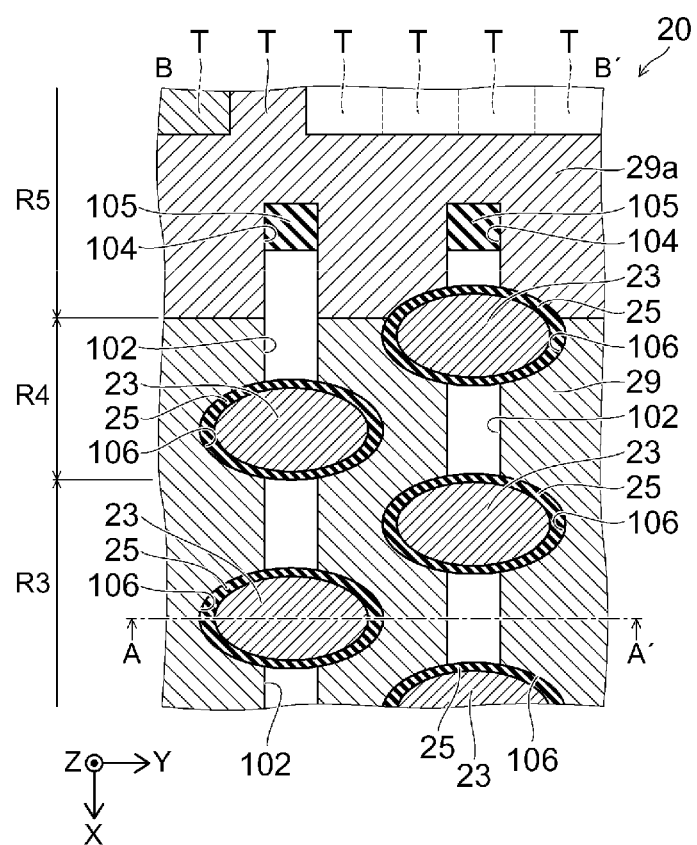
FIG. 13A and FIG. 13B are cross-sectional views illustrating a method for manufacturing the resistance-change type memory device according to the first embodiment.
Figure 13B:
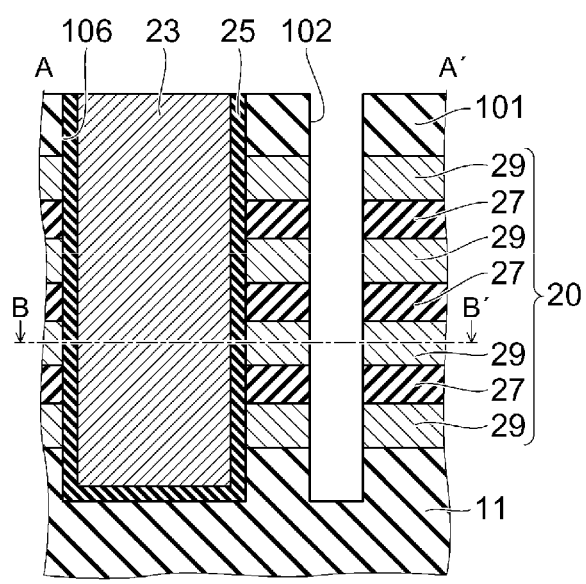

Next, as illustrated in FIG. 13A and FIG. 13B, the sacrificial members 103 (see FIG. 12A and FIG. 12B) may be removed by, for example, wet etching.

Figure 14A:
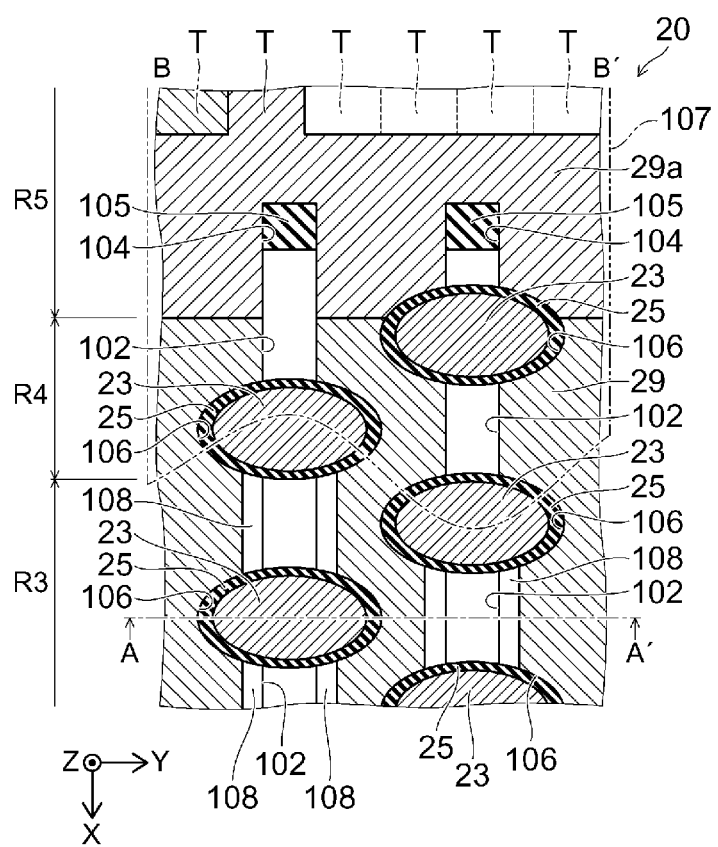
FIG. 14A and FIG. 14B are cross-sectional views illustrating a method for manufacturing the resistance-change type memory device according to the first embodiment.
Figure 14B:
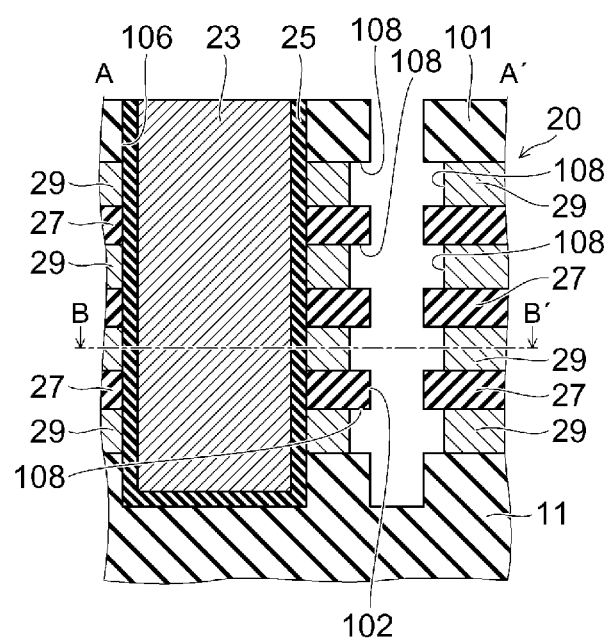

Next, as illustrated in FIG. 14A and FIG. 14B, a resist mask 107 may be formed so as to cover the source region R1 (see FIG. 1), the source-side select transistor region R2 (see FIG. 1), the drain-side select transistor region R4, and the drain region R5 and may expose the memory cell region R3. Next, the resist mask 107 may be used as a mask to etch the silicon film 29 through the trench 102. As a result, in the memory cell region R3, the lateral surface of the silicon film 29 exposed in the trench 102 can be recessed, so that a recessed portion 108 is formed. Then, the resist mask 107 can be removed.

Figure 15A:
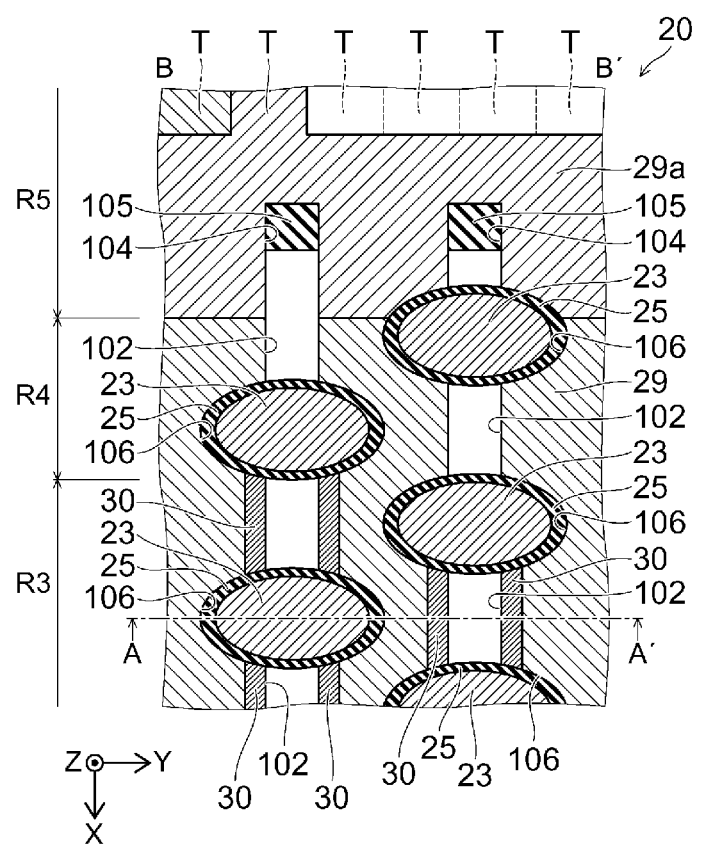
FIG. 15A and FIG. 15B are cross-sectional views illustrating a method for manufacturing the resistance-change type memory device according to the first embodiment.
Figure 15B:
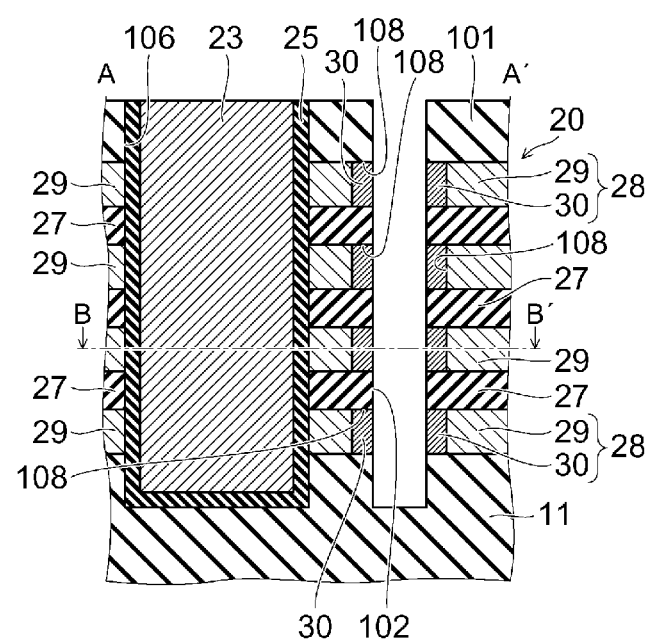
Figure 15B:
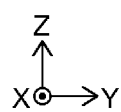

Next, as illustrated in FIG. 15A and FIG. 15B, a resistance-change material may be deposited on the entire surface and etched back to form a resistance-change film 30 in the recessed portion 108. A conductive film may be formed by the silicon film 29 and the resistance-change film 30.

Figure 16A:
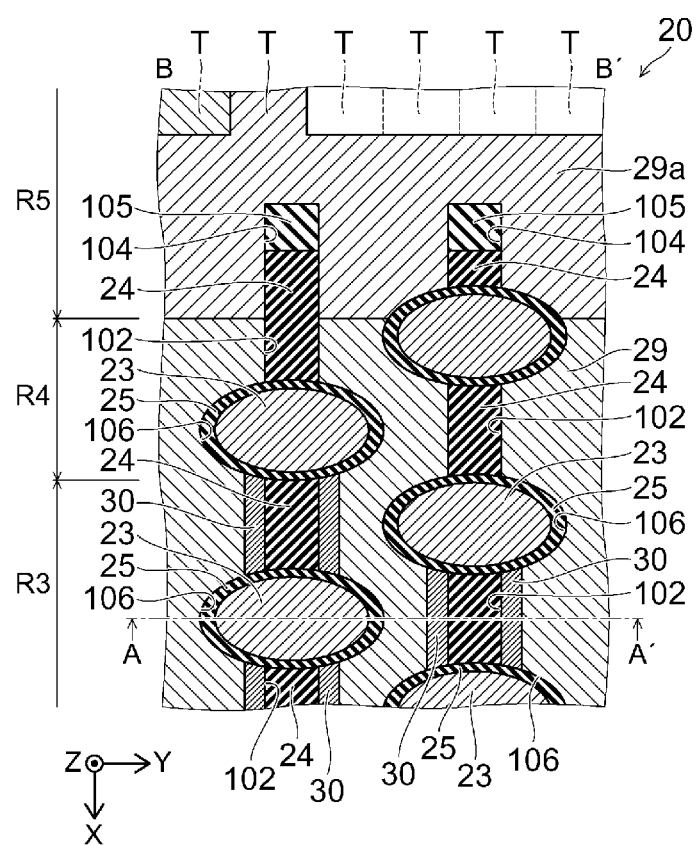
FIG. 16A and FIG. 16B are cross-sectional views illustrating a method for manufacturing the resistance-change type memory device according to the first embodiment.
Figure 16B:
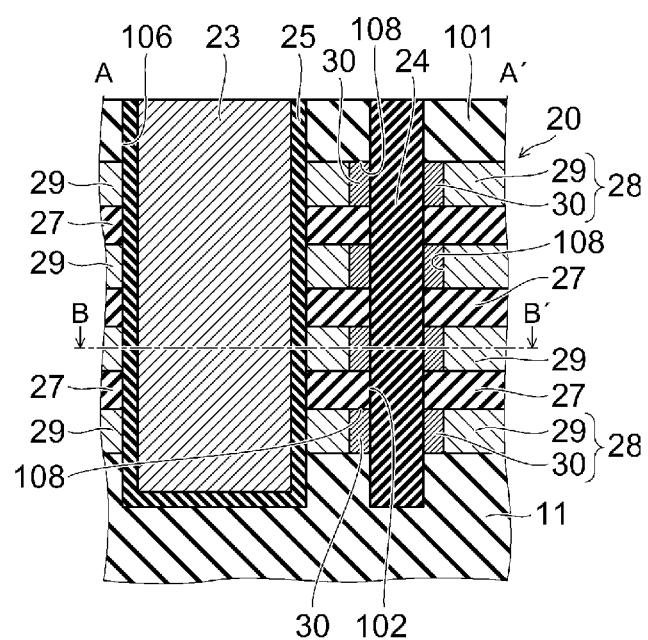

Next, as illustrated in FIG. 16A and FIG. 16B, silicon oxide may be embedded in the trench 102 to form an insulating member 24. At this time, the silicon oxidation member 105 may become a part of the insulating member 24.

Next, a trench may be formed in the source region R1, and a conductive material such as tungsten may be embedded to form a through source line 43. The through source line 43 is connected to the n+ type portions 29a of all the silicon films 29.

Next, a contact 44, a gate line 41, a bit line 45, and a select gate line 42 may be formed on the stacked body 20. In this manner, the resistance-change type memory device 1 according to the first embodiment is manufactured.

Second Embodiment

Next, a second embodiment will be described.

Figure 17:
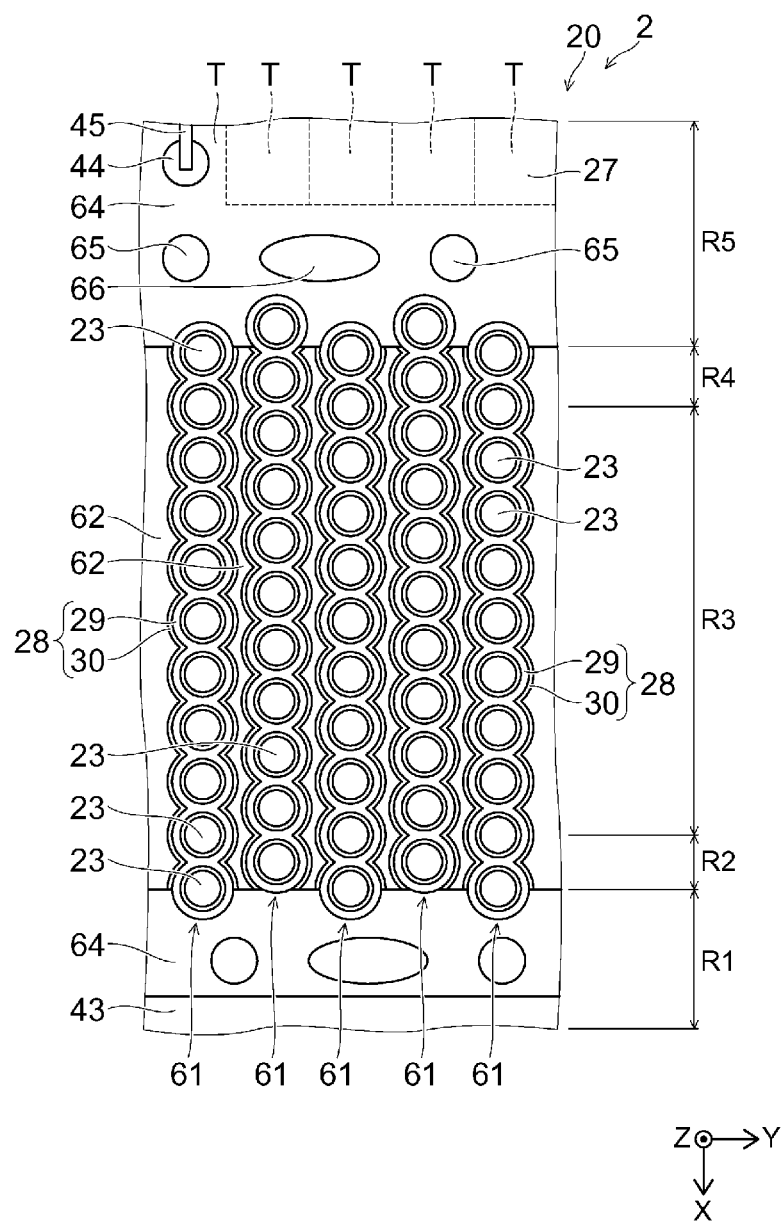
FIG. 17 is a plan view illustrating a resistance-change type memory device according to a second embodiment.

FIG. 17 is a plan view illustrating a resistance-change type memory device according to the second embodiment.

Figure 18:
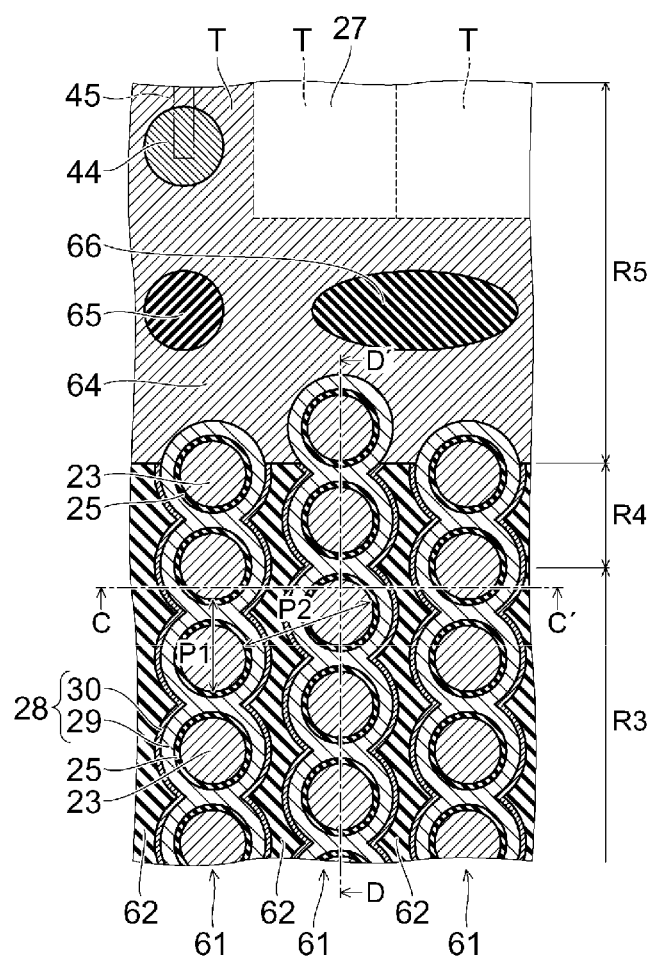
FIG. 18 is a cross-sectional view illustrating a memory cell region, a drain-side select transistor region, and a drain region of the resistance-change type memory device according to the second embodiment.

FIG. 18 is a cross-sectional view illustrating a memory cell region, a drain-side select transistor region, and a drain region of the resistance-change type memory device according to the second embodiment.

Figure 19A:
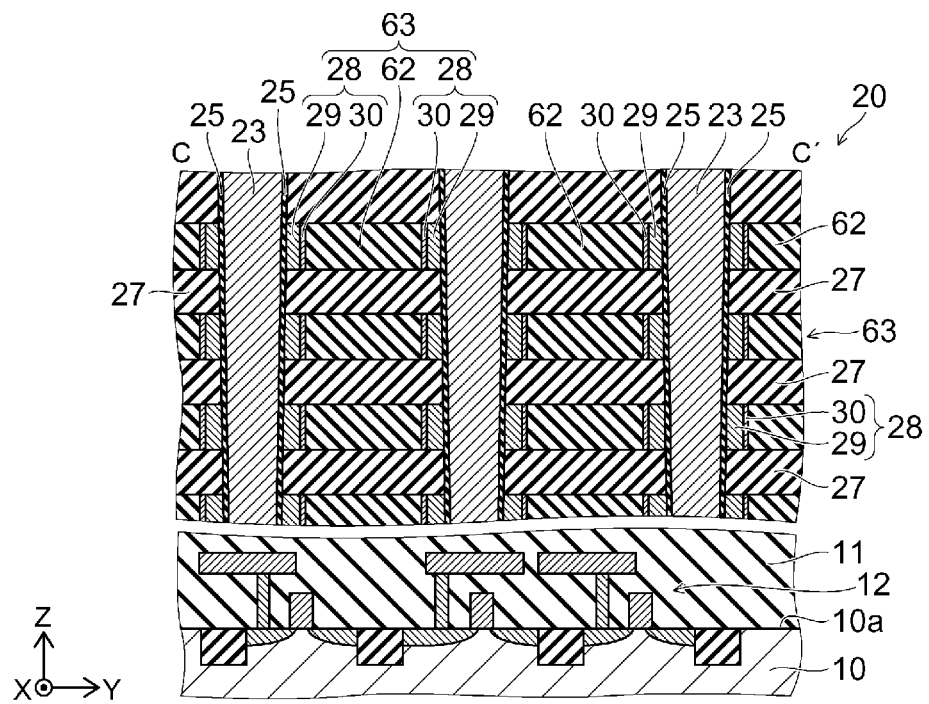
FIG. 19A is a cross-sectional view taken along the line C-C' in FIG. 18.
Figure 19B:
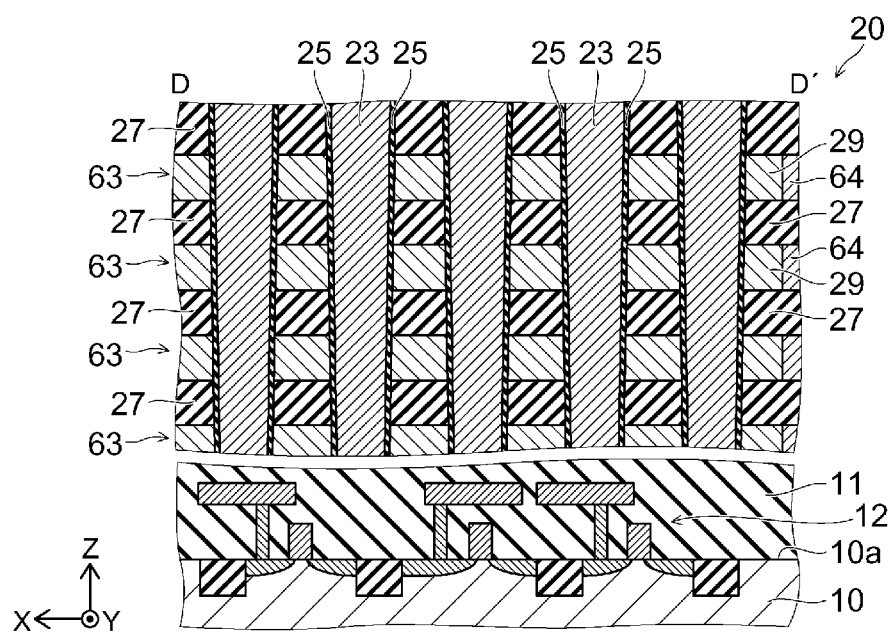
FIG. 19B is a cross-sectional view taken along the line D-D' in FIG. 18.

FIG. 19A is a cross-sectional view taken along the line C-C' in FIG. 18, and FIG. 19B is a cross-sectional view taken along the line D-D' in FIG. 18.

Figure 20:
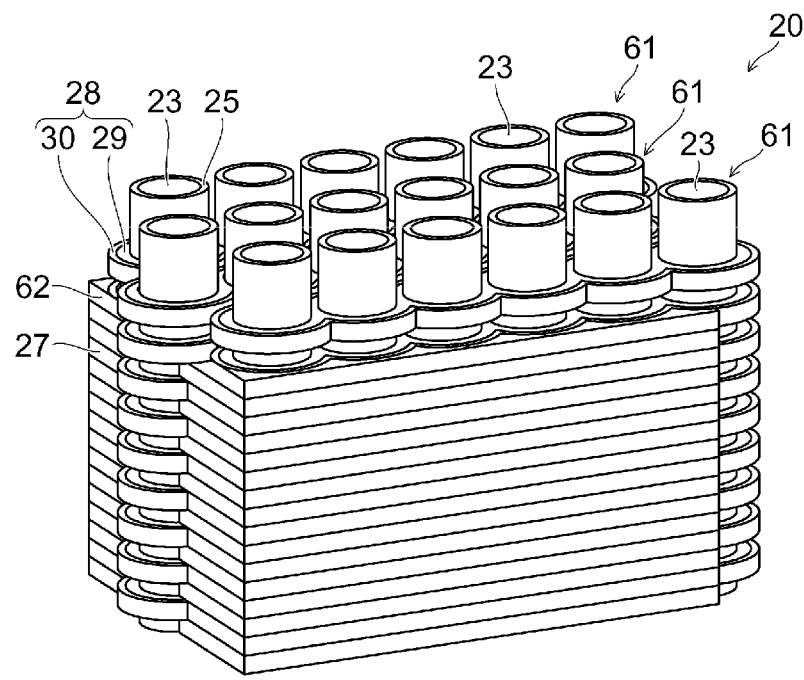
FIG. 20 is a perspective view illustrating the memory cell region of the resistance-change type memory device according to the second embodiment.

FIG. 20 is a perspective view illustrating the memory cell region of the resistance-change type memory device according to the second embodiment.

As illustrated in FIG. 17 to FIG. 20, in a resistance-change type memory device 2 according to the second embodiment, a silicon substrate 10 may be provided in a manner similar to the resistance-change type memory device 1 according to the first embodiment described above (see FIG. 1, FIG. 2A, and FIG. 2B), and an interlayer insulating film 11 may be provided on the silicon substrate 10. A drive circuit 12 may be formed in an upper layer portion of the silicon substrate 10 and a lower layer portion of the interlayer insulating film 11. A stacked body 20 is provided on the interlayer insulating film 11. In the stacked body 20, a source region R1, a source-side select transistor region R2, a memory cell region R3, a drain-side select transistor region R4, and a drain region R5 may be set in this order along the X direction.

The source-side select transistor region R2, the memory cell region R3, and the drain-side select transistor region R4 will be described.

As illustrated in FIG. 18, FIG. 19A, FIG. 19B, and FIG. 20, in the source-side select transistor region R2, the memory cell region R3, and the drain-side select transistor region R4, a plurality of structures 61 may be provided in the stacked body 20. The structures 61 may have a plate-like shape expanding along the XZ plane. In the regions R2 to R4, a plurality of structures 61 may be arranged separately from each other in the Y direction.

Each of the structures 61 may be provided with a plurality of gate electrodes 23 extending in the Z direction. The plurality of gate electrodes 23 may be arranged in a row in the X direction, periodically, and separately from each other. Each gate electrode 23 may have a columnar shape in which the central axis extends in the Z direction, for example, a substantially cylindrical shape. The gate electrode 23 may be formed of a conductive material such as, for example, tungsten. A gate insulating film 25 made of, for example, silicon oxide may be provided on the lateral surface of the gate electrode 23.

In the whole of the regions R2 to R4, the gate electrodes 23 may be arranged in a zigzag pattern when viewed from the Z direction. That is, in two structures 61 adjacent to each other in the Y direction, the positions of the gate electrodes 23 in the X direction may be displaced from each other, and in the structures 61 arranged at every other position in the Y direction, the positions of the gate electrodes 23 in the X direction may be the same as each other. Further, an arrangement period P1 of the gate electrodes 23 in the X direction may be shorter than an arrangement period P2 of the gate electrodes 23 in another direction intersecting the X direction. That is, P1<P2.

Further, when viewed from the Z direction, a silicon film 29 as a semiconductor layer may be provided around each gate electrode 23. Each structure 61 may be provided with a plurality of silicon films 29 which are arranged separately from each other in the Z direction. Each silicon film 29 may be continuously arranged between and around all the gate electrodes 23 belonging to each structure 61. That is, the silicon film 29 may extend in the X direction as a whole and may be provided over the entire length of the structure 61 in the X direction. A gate insulating film 25 may be interposed between each gate electrode 23 and the silicon film 29.

A resistance-change film 30 may be provided on the lateral surface of the silicon film 29. The resistance-change film 30 may be continuously arranged on both sides of the silicon film 29 in the Y direction and may be in contact with the silicon film 29. As described in the first embodiment, the resistance-change film 30 may be a film having a resistance value that changes when a current flows therein, and may be, for example, a PCM film, a filament type resistance-change film, or a CBM film. A conductive film 28 may include the silicon film 29 and the resistance-change film 30.

An insulating film 62 made of silicon nitride (SiN) may be provided between conductive films 28 belonging to adjacent structures 61. A structure film 63 may include two conductive films 28 and one insulating film 62 located therebetween. An insulating film 27 made of, for example, silicon oxide may be provided between structure films 63 adjacent to each other in the Z direction. That is, between the structures 61, insulating films 27 and structure films 63 may be alternately stacked in the Z direction. The conductive films 28 belonging to the same structure 61 may be insulated from each other by the insulating film 27. Further, the conductive films 28 belonging to adjacent structures 61 may be insulated from each other by the insulating film 27 and the insulating film 62.

A plurality of gate lines 41 extending in the Y direction (see FIG. 1) may be provided on a plurality of structures 61. Each gate line 41 may be commonly connected to the gate electrodes 23 at the same position in the X direction, that is, every single gate electrode 23 belonging to every other structure 61 in the Y direction (see FIG. 1). Further, a select gate line 42 extending in the X direction (see FIG. 1) may be connected to the gate electrodes 23 located at both end portions of each structure 61 in the X direction and disposed in the source-side select transistor region R2 and the drain-side select transistor region R4.

Next, the source region R1 and the drain region R5 will be described.

As illustrated in FIG. 17, the structures 61 may be terminated in the source region R1 and the drain region R5. In some embodiments, the resistance-change film 30 is not provided at the both end portions of each structure 61 in the X direction, that is, in the portions located in the source region R1 and the drain region R5. Further, in the source region R1 and the drain region R5, insulating films 27 and conductive films 64 may be alternately stacked in the Z direction. Each conductive film 64 may be formed of a conductive material such as, for example, tungsten, and may be commonly connected to the silicon films 29 arranged in the Y direction. Further, insulating members 65 and 66 may be provided to extend in the Z direction and penetrate the stacked body 20. The insulating members 65 and 66 may be formed of, for example, silicon oxide.

The source region R1 may be provided with a plate-like through source line 43 made of a conductive material such as tungsten and expanding along the YZ plane. The through source line 43 may be commonly connected to all the conductive films 64 stacked in the Z direction.

In the drain region R5, the end portion of the stacked body 20 may be formed into a step shape (not illustrated), and a terrace T may be formed for each conductive film 64. A contact 44 may be provided on the terrace T, which is connected to the conductive film 64. The contact 44 may be connected to a bit line 45 extending in the X direction.

Next, an operation of the resistance-change type memory device according to the second embodiment will be described.

Figure 21A:
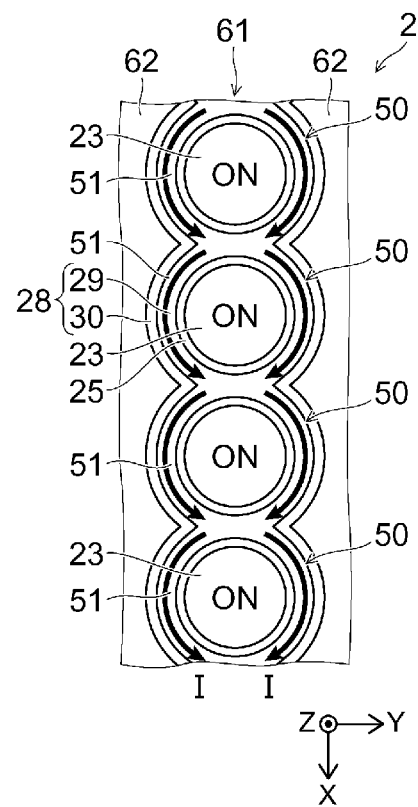
FIG. 21A and FIG. 21B are views illustrating an operation of the resistance-change type memory device according to the first embodiment.
Figure 21B:
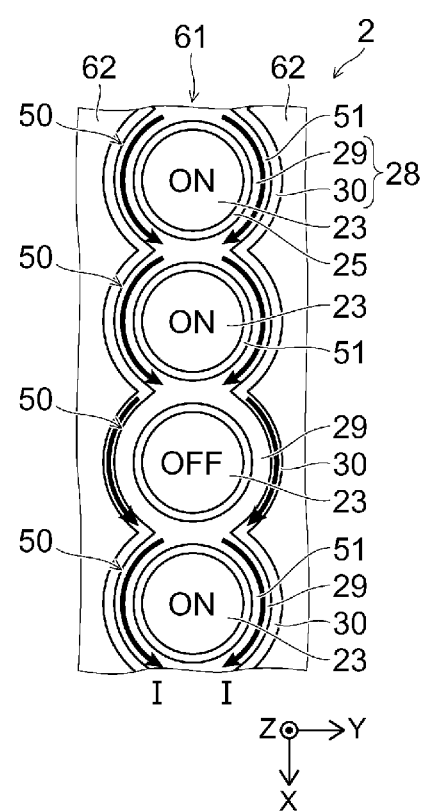

FIG. 21A and FIG. 21B are views illustrating an operation of the resistance-change type memory device according to the second embodiment. FIG. 21A illustrates a state where no memory cell is selected, and FIG. 21B illustrates a state where one memory cell is selected.

As illustrated in FIG. 21A and FIG. 21B, the resistance-change type memory device 2 may be provided with field effect transistors 50 each including a gate electrode 23 as a gate, a gate insulating film 25 as a gate insulating film, and a silicon film 29 as a channel. In addition, in the memory cell region R3, a resistance-change film 30 may be provided along the silicon film 29 to constitute a memory cell. One memory cell may be formed for each intersection of one gate electrode 23 and one conductive film 28. Therefore, in each memory cell, the silicon film 29, which is a channel of the transistor 50, and the resistance-change film 30 can form a parallel current path. Meanwhile, the resistance-change film 30 may be also provided in the source-side select transistor region R2 and the drain-side select transistor region R4, but the transistor 50 may function not as a memory cell for storing data but as a select transistor for selecting a structure 61.

A preferable relationship between the ON resistance Ron and the OFF resistance Roff of the transistor 50 and the low resistance RL and the high resistance RH of the resistance-change film 30 is the same as in the first embodiment. That is, it is preferable that Ron<RL<RH<Roff, and it is more preferable that Ron<(0.1×RL)<(10×RH)<Roff.

The method of determining the Z coordinate and the Y coordinate of the selected memory cell in the second embodiment is the same as that in the first embodiment. Hereinafter, descriptions will be made on a method of determining the X coordinate of the selected memory cell.

As illustrated in FIG. 21A, when an ON potential Von is applied to a gate electrode 23, a depletion layer 51 may be formed in an annular portion of the silicon film 29 located around the gate electrode 23, so that a conduction state is established. When the ON potential Von is applied to all the gate electrodes 23 belonging to a certain structure 61, the depletion layers 51 may be connected to form a current path formed of the depletion layers 51 over the entire length of the silicon film 29 in the X direction, and a current I can flow through this current path.

Meanwhile, as illustrated in FIG. 21B, when an OFF potential Voff is applied to one gate electrode 23 and an ON potential Von is applied to the other gate electrode 23, no depletion layer 51 is formed around the gate electrode 23 to which the OFF potential Voff is applied, so that the current path formed by the depletion layers 51 is discontinued. Then, in this discontinued portion, the current I may flow through the resistance-change film 30, and a bit-source voltage may be applied to the resistance-change film 30. In this manner, the X coordinate of the selected memory cell can be determined. The bit-source voltage in the write operation, the read operation, and the erasing operation is the same as that described in the first embodiment.

Next, effects of the second embodiment will be described.

Also in the second embodiment, as in the first embodiment, in each memory cell, the silicon film 29, which is a channel of the transistor 50, and the resistance-change film 30 may form a parallel current path. Therefore, the supply and cutoff of the current to the resistance-change film 30 may be selected by switching the transistor 50. Therefore, it is possible to implement a resistance-change type memory device having high stability in operation.

The configuration, operation, and effect other than those described above in the second embodiment are the same as those in the first embodiment.

Next, a method of manufacturing the resistance-change type memory device according to the second embodiment will be described.

FIG. 22A and FIG. 22B to FIG. 30A and FIG. 30B are cross-sectional views illustrating a method for manufacturing the resistance-change type memory device according to the second embodiment.

Figure 22A:
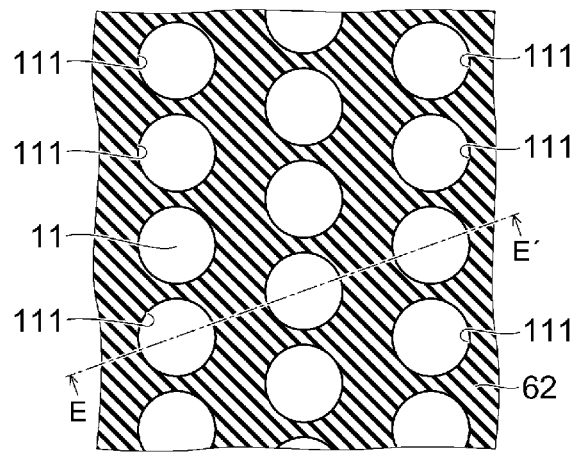
FIG. 22A is a cross-sectional view illustrating a method for manufacturing the resistance-change type memory device according to the second embodiment.
Figure 22B:
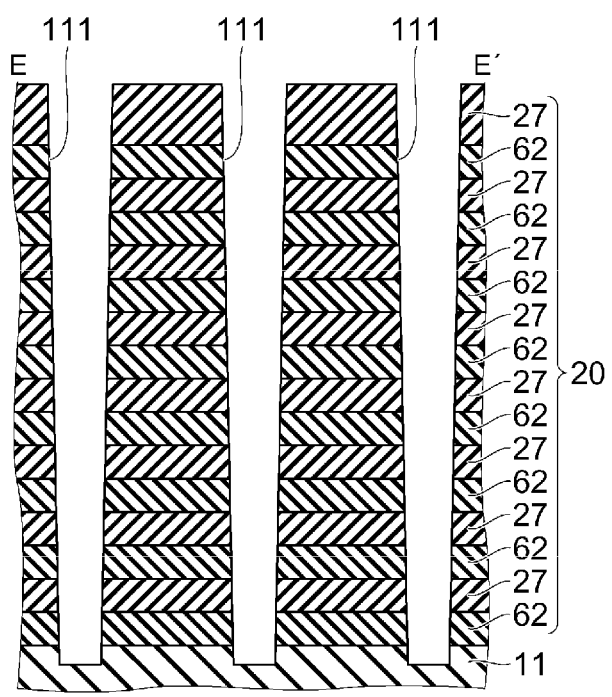
FIG. 22B is a cross-sectional view taken along the line E-E' in FIG. 22A.

FIG. 22B is a cross-sectional view taken along the line E-E' in FIG. 22A. The same is true for FIG. 23A to FIG. 25B. FIG. 26B is a cross-sectional view taken along the line F-F' in FIG. 26A. The same is true for FIG. 27A to FIG. 30B.

First, as illustrated in FIG. 19A and FIG. 19B, an interlayer insulating film 11 may be formed on a silicon substrate 10, and a drive circuit 12 may be formed in an upper layer portion of the silicon substrate 10 and a lower layer portion of the interlayer insulating film 11.

Next, as illustrated in FIG. 22A and FIG. 22B, insulating films 62 made of silicon nitride and insulating films 27 made of silicon oxide may be alternately deposited on the interlayer insulating film 11 to form a stacked body 20. Next, the end portion on the side of the drain region R5 (see FIG. 17) in the stacked body 20 may be processed into a step shape (not illustrated). As a result, a terrace T (see FIG. 17) can be formed for each insulating film 62. Next, an interlayer insulating film may be formed so as to embed the stacked body 20. Hereinafter, the interlayer insulating film is illustrated integrally with the uppermost insulating film 27 as necessary.

Next, a plurality of holes 111 may be formed in the stacked body 20 by, for example, a lithography method and a reactive ion etching (RIE) method. The holes 111 may be arranged in a zigzag pattern when viewed from the Z direction. The arrangement period of the holes 111 in the X direction may be set to be shorter than the arrangement period of the holes 111 in another direction. Each hole 111 may penetrate the stacked body 20 and enter the upper layer portion of the interlayer insulating film 11.

Figure 23A:
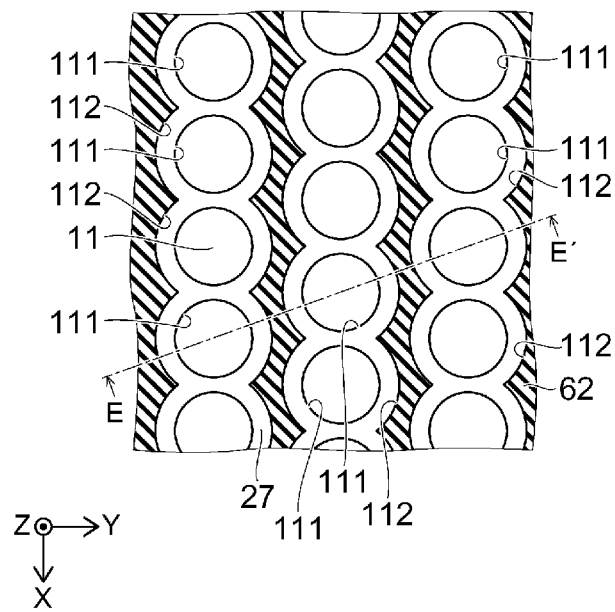
FIG. 23A is a cross-sectional view illustrating a method for manufacturing the resistance-change type memory device according to the second embodiment.
Figure 23B:
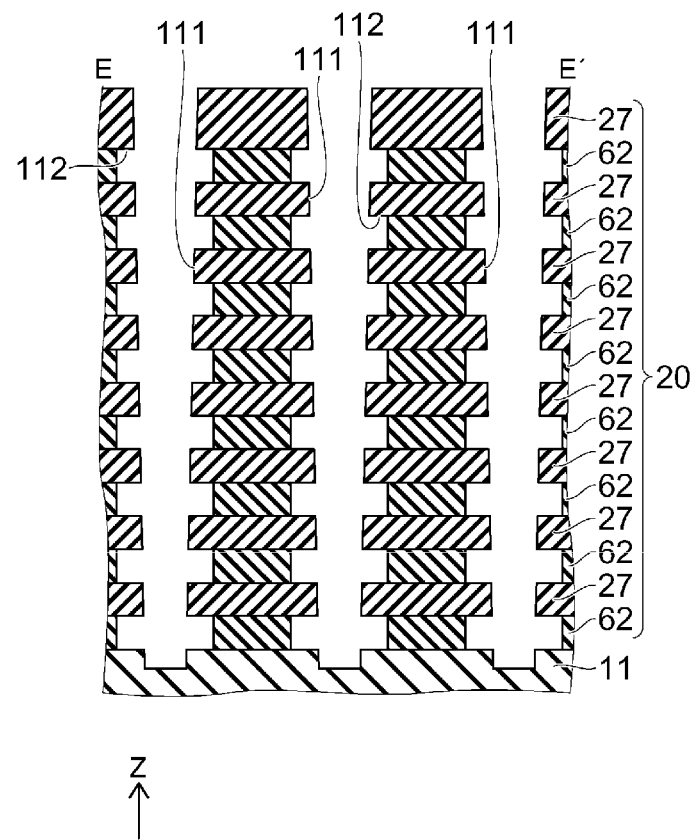
FIG. 23B is a cross-sectional view taken along the line E-E' in FIG. 23A.

Next, as illustrated in FIG. 23A and FIG. 23B, for example, isotropic etching may be performed to recess (e.g., partly remove) the insulating films 62 made of silicon nitride through the holes 111. As a result, the portions of the insulating films 62 exposed on the inner surfaces of the holes 111 can be removed, so that recessed portions 112 are formed. The recessed portions 112 may be formed annularly starting from the holes 111. The etching amount to form the recess may be set to such an extent that the recessed portions 112 formed on the inner surfaces of the holes 111 adjacent to each other in the X direction communicate with each other and the recessed portions 112 formed on the inner surfaces of the holes 111 adjacent to each other in other directions (e.g., the Y direction) do not communicate with each other. As a result, the recessed portions 112 starting from the holes 111 arranged in a row in the X direction can communicate with each other, and become one large recessed portion 112 extending in the X direction as a whole. Meanwhile, the recessed portions 112 adjacent to each other in the Y direction may remain separated by the insulating films 62. Further, an insulating film 27 may be interposed between the recessed portions 112 adjacent to each other in the Z direction (see FIG. 23B).

Figure 24A:
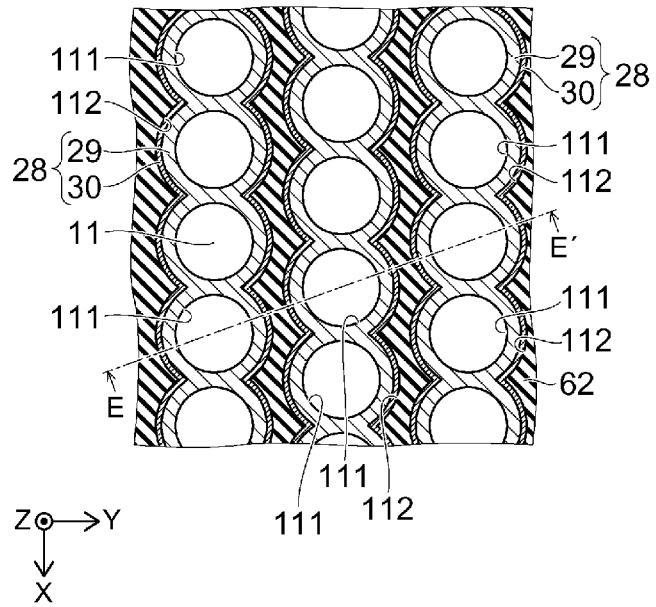
FIG. 24A is a cross-sectional view illustrating a method for manufacturing the resistance-change type memory device according to the second embodiment.
Figure 24B:
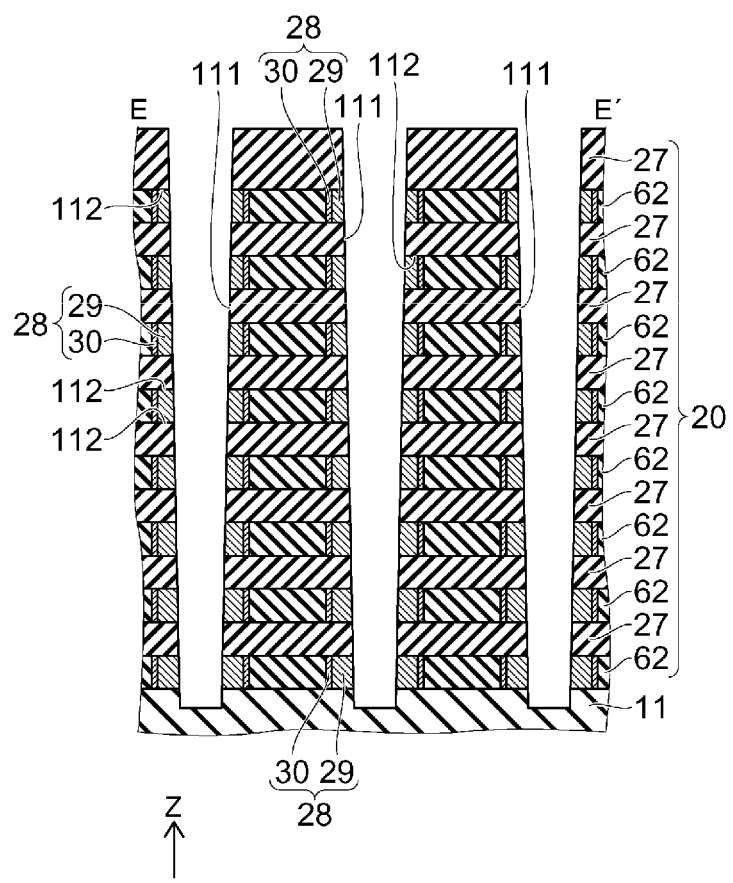
FIG. 24B is a cross-sectional view taken along the line E-E' in FIG. 24A.

Next, as illustrated in FIG. 24A and FIG. 24B, a resistance-change material, for example, a PCM material may be deposited on the entire surface and etched back to form a resistance-change film 30 on the back surface of a recessed portion 112, that is, on the exposed surface of an insulating film 62. Next, silicon may be deposited on the entire surface and etched back to form a silicon film 29 in the recessed portion 112. A conductive film 28 may be formed by the resistance-change film 30 and the silicon film 29. The conductive film 28 may be continuously arranged so as to surround a row of the holes 111 arranged in a row along the X direction.

Figure 25A:
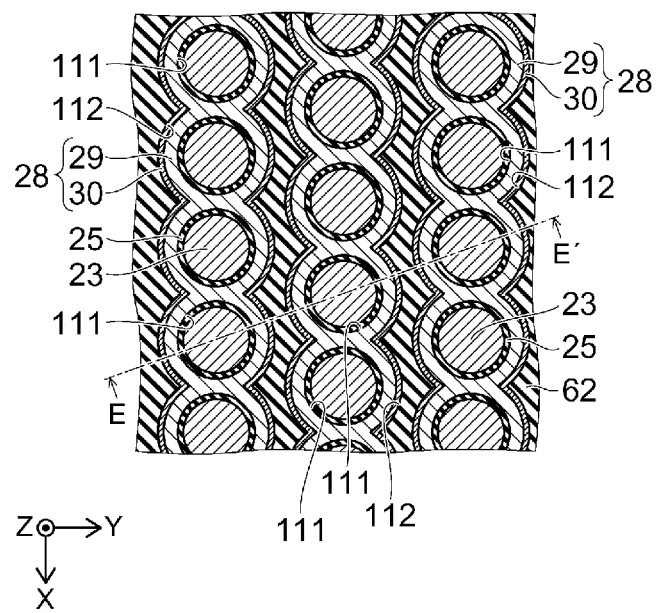
FIG. 25A is a cross-sectional view illustrating a method for manufacturing the resistance-change type memory device according to the second embodiment.
Figure 25B:
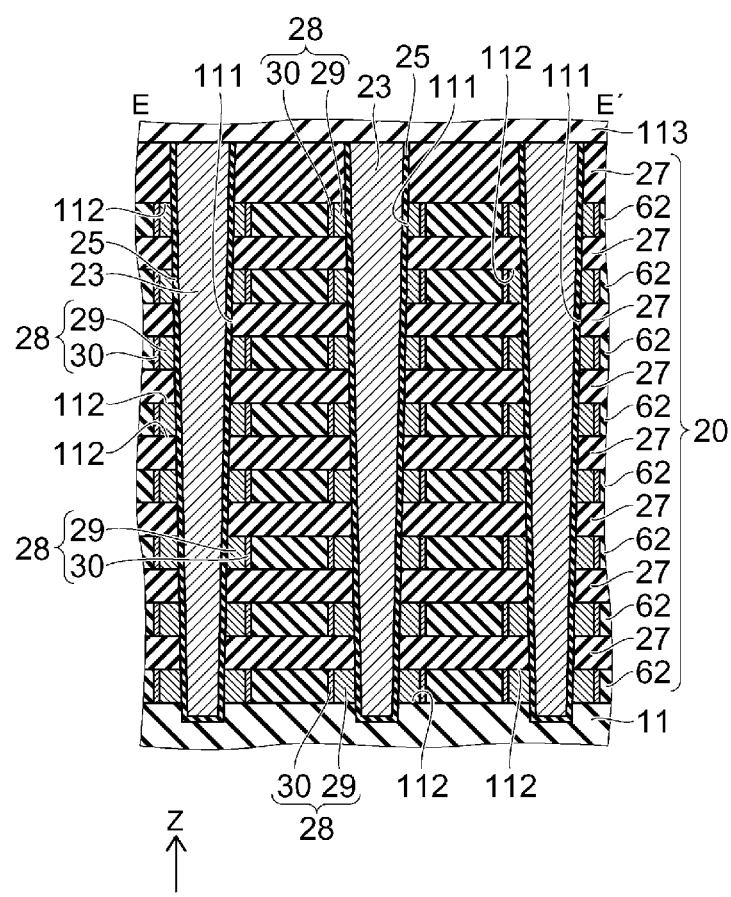
FIG. 25B is a cross-sectional view taken along the line E-E' in FIG. 25A.

Next, as illustrated in FIG. 25A and FIG. 25B, for example, silicon oxide may be deposited to form a gate insulating film 25 on the inner surface of each hole 111. Next, for example, tungsten may be deposited to embed a gate electrode 23 in the hole 111. Next, a silicon oxide film 113 may be formed on the stacked body 20.

Figure 26A:
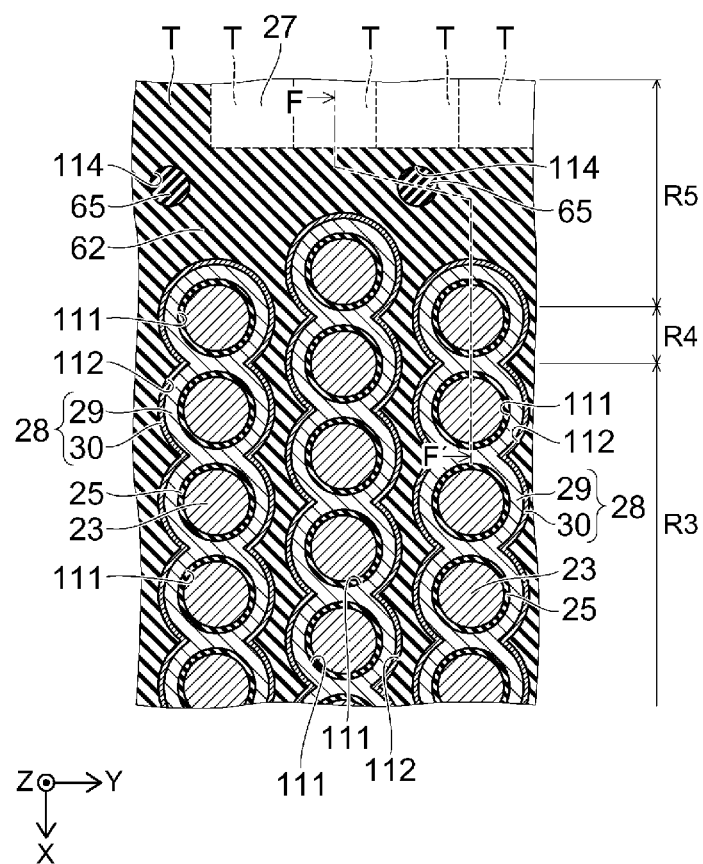
FIG. 26A is a cross-sectional view illustrating a method for manufacturing the resistance-change type memory device according to the second embodiment.
Figure 26B:
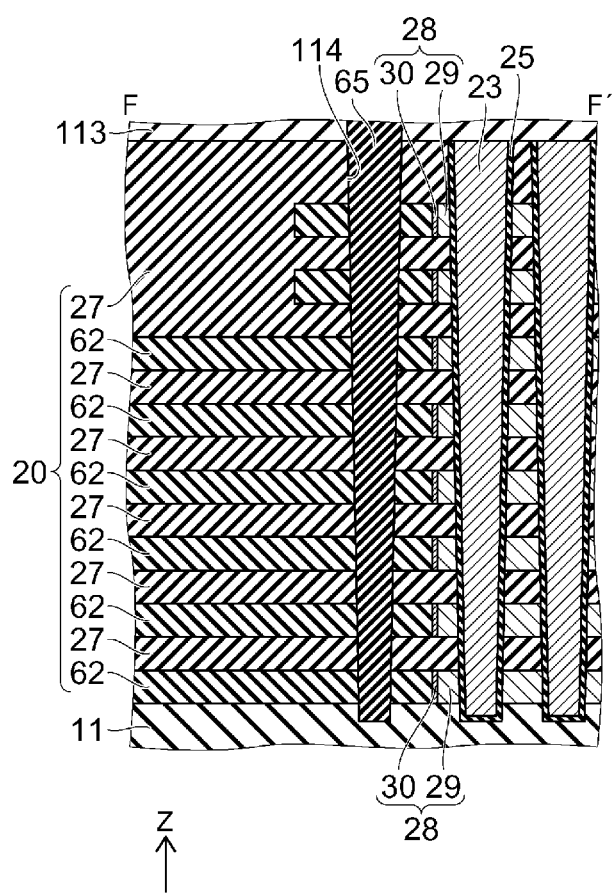
FIG. 26B is a cross-sectional view taken along the line F-F' in FIG. 26A.

Next, as illustrated in FIG. 26A and FIG. 26B, holes 114 may be formed in the source region R1 (see FIG. 17) and the drain region R5. The holes 114 may penetrate the stacked body 20 and enter the upper layer portion of the interlayer insulating film 11. Next, an insulating material such as silicon oxide may be embedded in each hole 114 to form an insulating member 65.

Figure 27A:
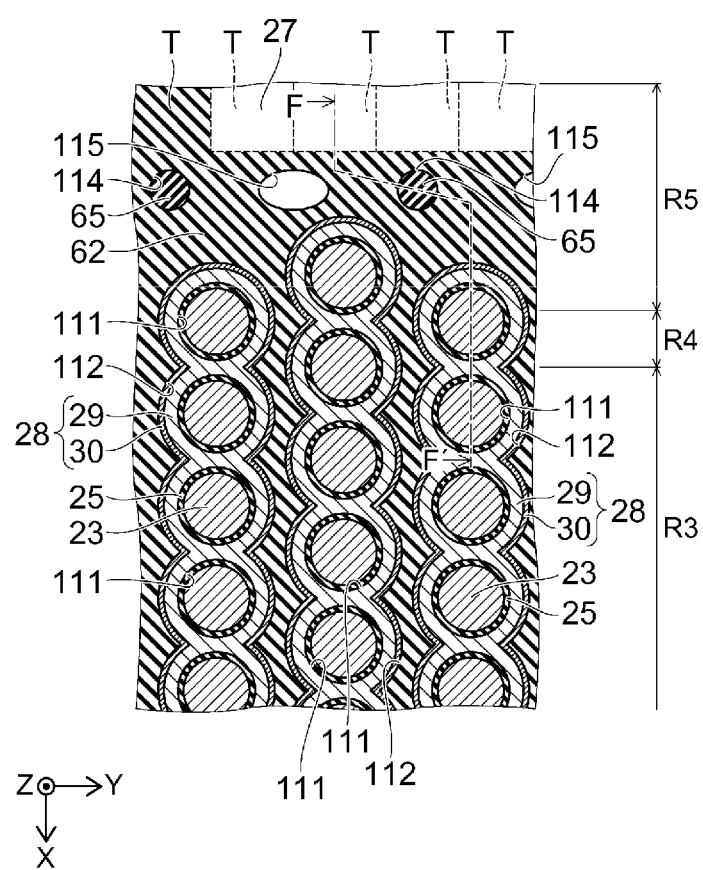
FIG. 27A is a cross-sectional view illustrating a method for manufacturing the resistance-change type memory device according to the second embodiment.
Figure 27B:
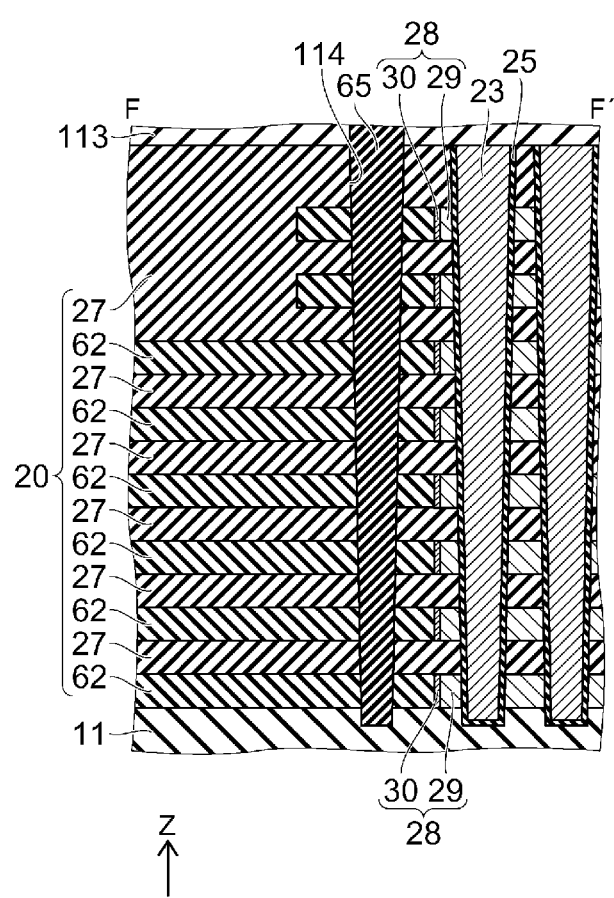
FIG. 27B is a cross-sectional view taken along the line F-F' in FIG. 27A.

Next, as illustrated in FIG. 27A and FIG. 27B, holes 115 may be formed in the source region R1 (see FIG. 17) and the drain region R5. The holes 115 may penetrate the stacked body 20 and enter the upper layer portion of the interlayer insulating film 11.

Figure 28A:
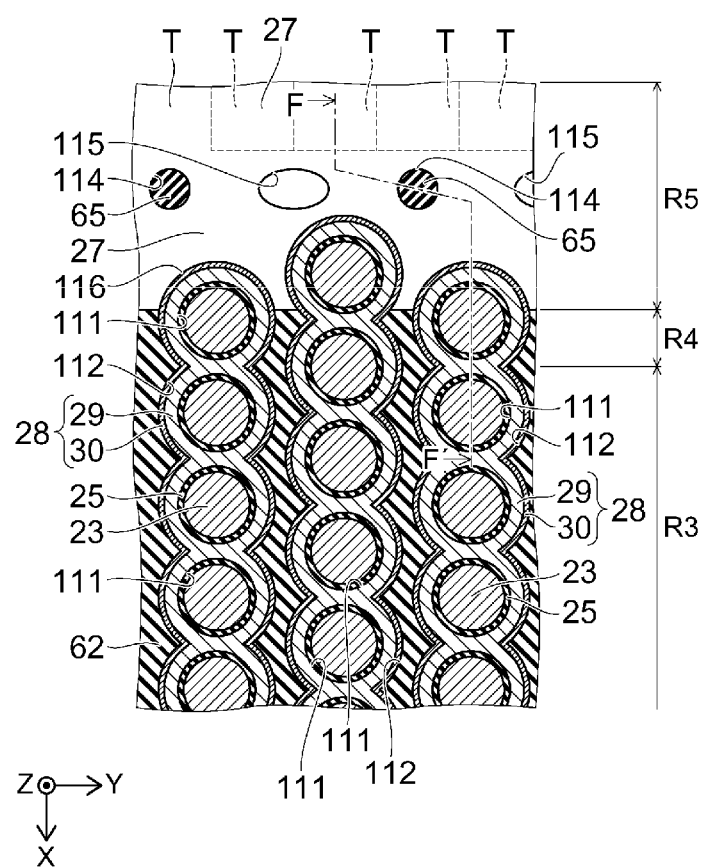
FIG. 28A is a cross-sectional view illustrating a method for manufacturing the resistance-change type memory device according to the second embodiment.
Figure 28B:
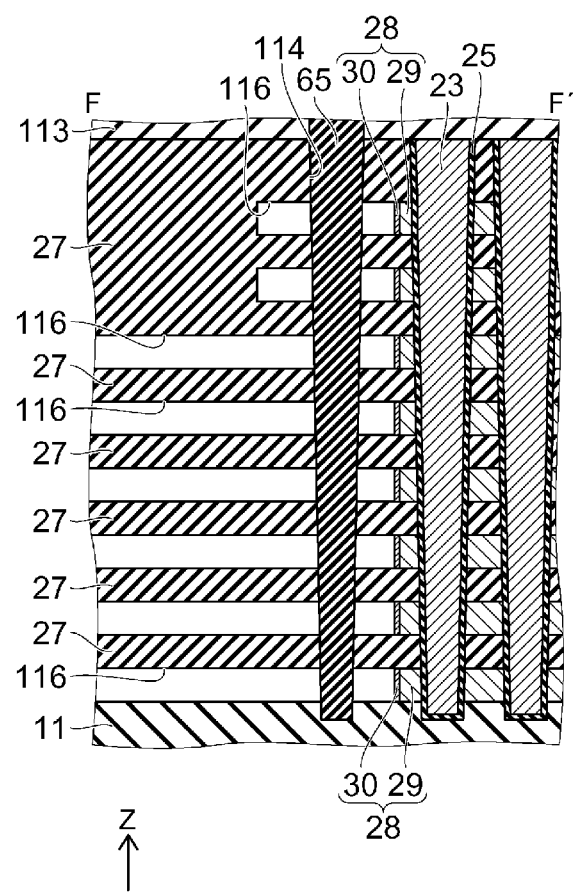
FIG. 28B is a cross-sectional view taken along the line F-F' in FIG. 28A.

Next, as illustrated in FIG. 28A and FIG. 28B, isotropic etching such as wet etching may be performed to remove the insulating films 62 made of silicon nitride from the source region R1 (see FIG. 17) and the drain region R5 through the holes 115. At this time, the insulating films 27 made of silicon oxide and the insulating members 65 may remain without being removed. Thus, after the insulating films 62 in the source region R1 (see FIG. 17) and the drain region R5 is removed, spaces 116 may be formed (see FIG. 28B). Both end portions of each resistance-change film 30 in the X direction may be exposed in each space 116. Meanwhile, the insulating films 62 may remain in the source-side select transistor region R2, the memory cell region R3, and the drain-side select transistor region R4.

Figure 29A:
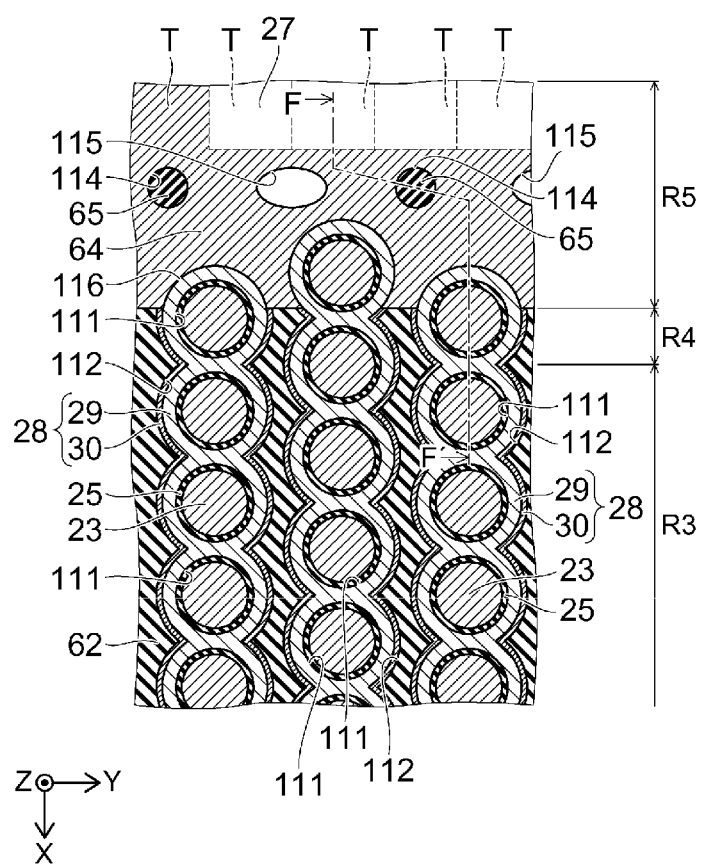
FIG. 29A is a cross-sectional view illustrating a method for manufacturing the resistance-change type memory device according to the second embodiment.
Figure 29B:
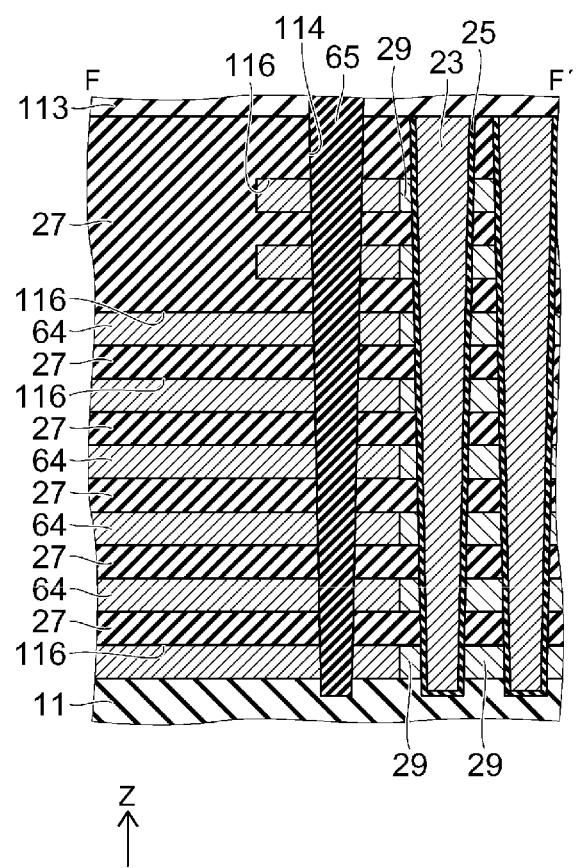
FIG. 29B is a cross-sectional view taken along the line F-F' in FIG. 29A.

Next, as illustrated in FIG. 29A and FIG. 29B, isotropic etching such as wet etching may be performed to remove portions of the resistance-change film 30 exposed in the space 116, through the hole 115. As a result, both end portions of each silicon film 29 in the X direction can be exposed in the space 116 (see FIG. 29B). Next, a conductive material such as tungsten may be embedded through the hole 115. As a result, a conductive film 64 can be formed in the space 116. In the space 116, the conductive film 64 may be connected to the silicon films (see FIG. 29B).

Figure 30A:
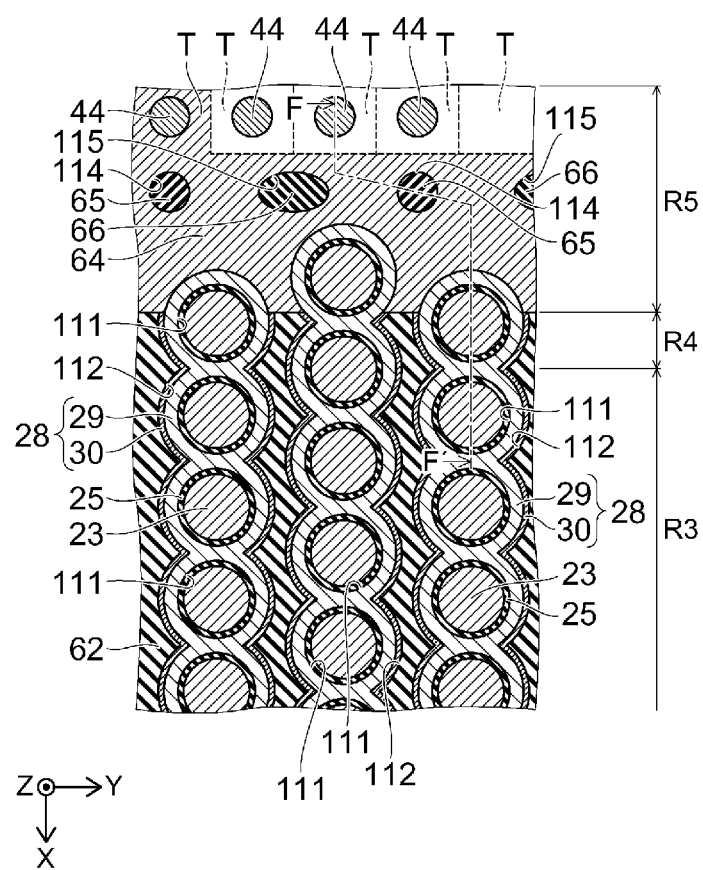
FIG. 30A is a cross-sectional view illustrating a method for manufacturing the resistance-change type memory device according to the second embodiment.
Figure 30B:
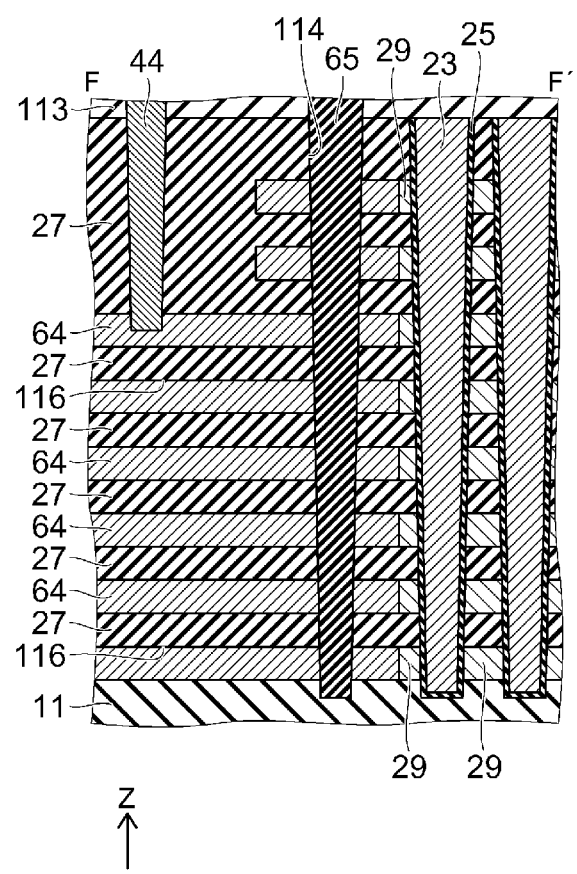
FIG. 30B is a cross-sectional view taken along the line F-F' in FIG. 30A.

Next, as illustrated in FIG. 30A and FIG. 30B, an insulating material such as silicon oxide may be embedded in the hole 115 to form an insulating member 66. Next, a contact 44 may be formed from the upper side of the stacked body 20 and connected to the conductive film 64 in the terrace T.

Next, a trench (not shown) may be formed in the source region R1, and a conductive material such as tungsten is embedded to form a through source line 43 (see FIG. 17). The through source line 43 may be connected to all the conductive films 64.

Next, a contact 44, a gate line 41, a bit line 45, and a select gate line 42 may be formed on the stacked body 20 (e.g., with configuration similar to that shown in FIG. 1). In this manner, the resistance-change type memory device 2 according to the second embodiment can be manufactured.

Third Embodiment

Next, a third embodiment will be described.

Figure 31:
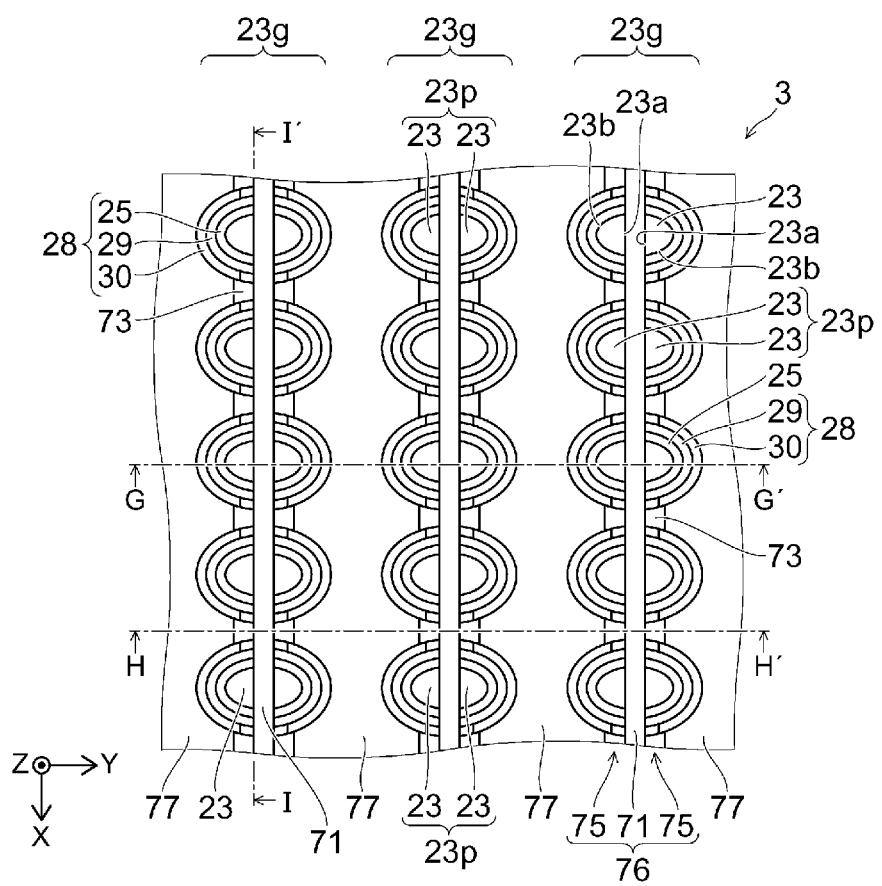
FIG. 31 is a plan view illustrating a resistance-change type memory device according to a third embodiment.

FIG. 31 is a plan view illustrating a resistance-change type memory device according to the third embodiment.

Figure 32A:
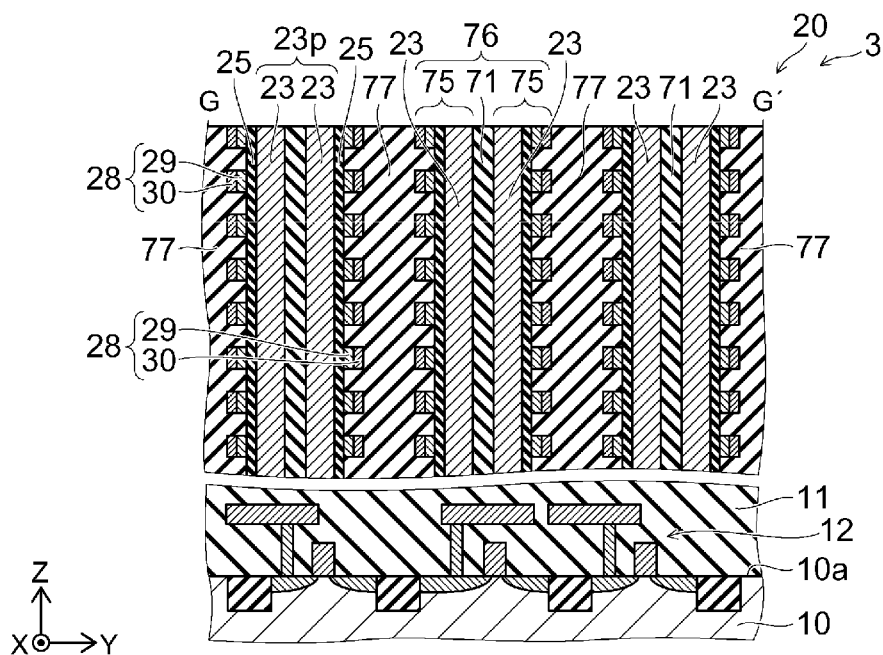
FIG. 32A is a cross-sectional view taken along the line G-G' in FIG. 31.
Figure 32B:
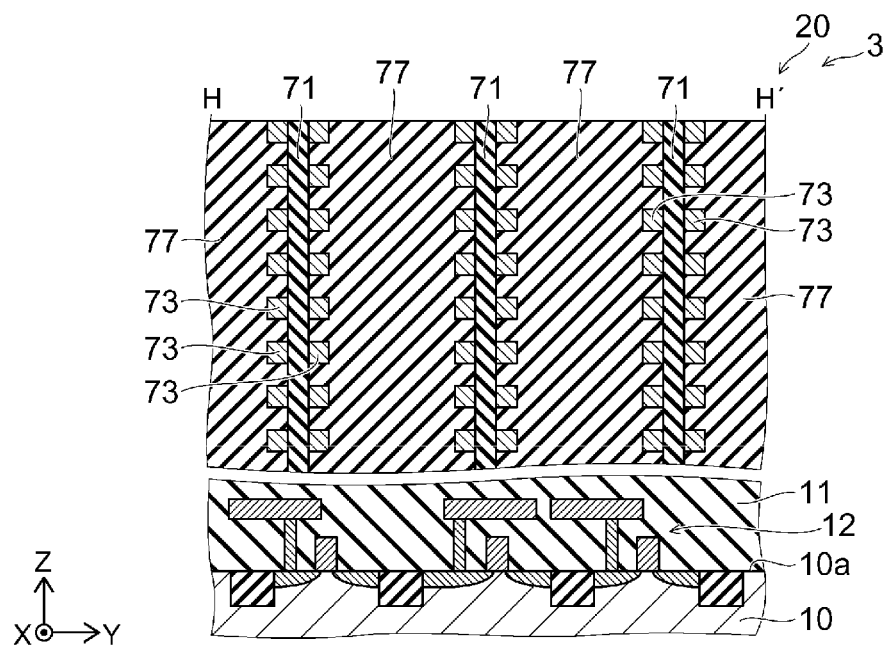
FIG. 32B is a cross-sectional view taken along the line H-H' in FIG. 31.

FIG. 32A is a cross-sectional view taken along the line G-G' in FIG. 31, and FIG. 32B is a cross-sectional view taken along the line H-H' in FIG. 31.

Figure 33:
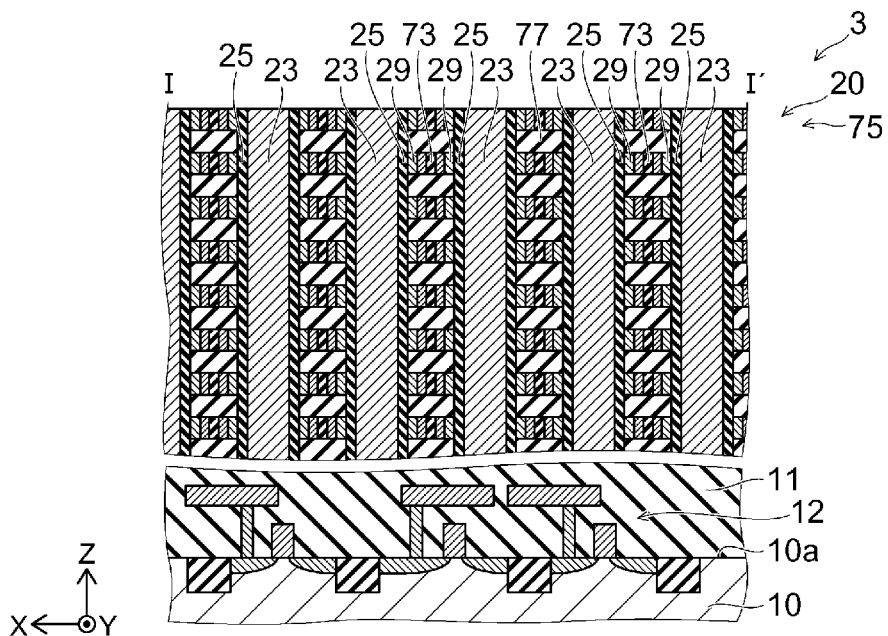
FIG. 33 is a cross-sectional view taken along the line I-I' in FIG. 31.

FIG. 33 is a cross-sectional view taken along the line I-I' in FIG. 31.

Figure 34:
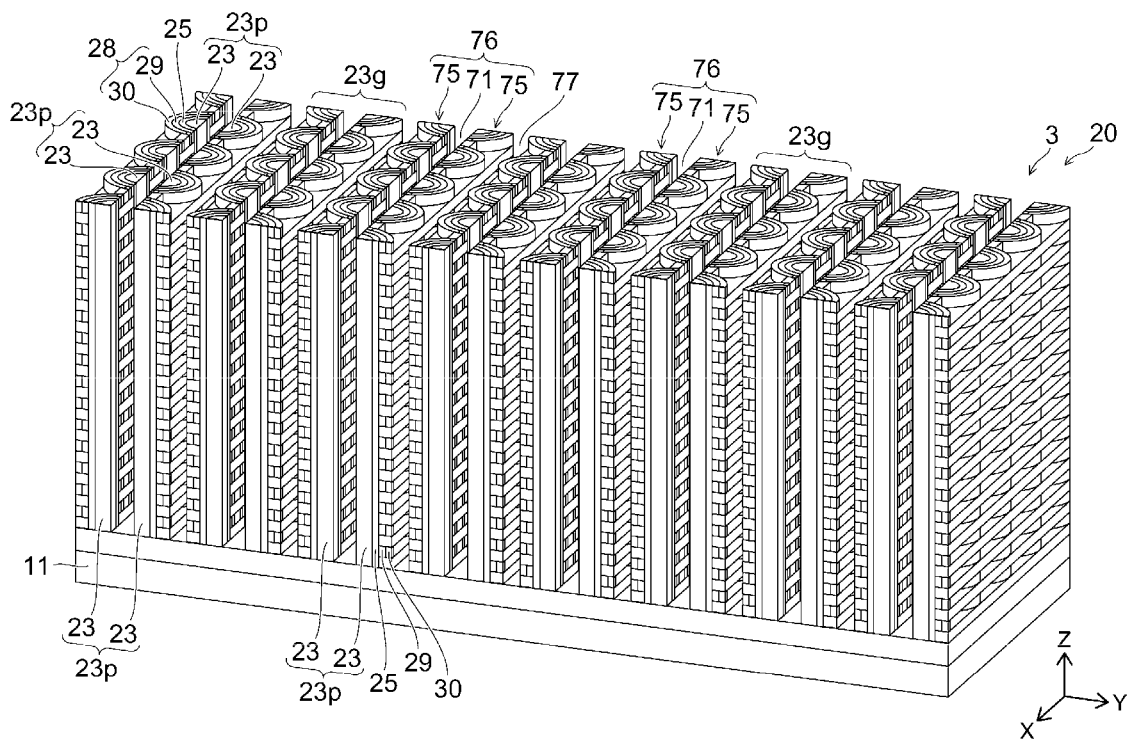
FIG. 34 is a perspective view illustrating the resistance-change type memory device according to the third embodiment.

FIG. 34 is a perspective view illustrating a resistance-change type memory device according to the third embodiment.

As illustrated in FIG. 31 to FIG. 34, in a resistance-change type memory device 3 according to the third embodiment, a silicon substrate 10 may be provided in a manner similar to the resistance-change type memory device 1 according to the first embodiment described above (see FIG. 1, FIG. 2A, and FIG. 2B), and an interlayer insulating film 11 may be provided on the silicon substrate 10. A drive circuit 12 may be formed in an upper layer portion of the silicon substrate 10 and a lower layer portion of the interlayer insulating film 11. A stacked body 20 may be provided on the interlayer insulating film 11.

In the third embodiment, as in the second embodiment, in the stacked body 20, a source region R1, a source-side select transistor region R2, a memory cell region R3, a drain-side select transistor region R4, and a drain region R5 may be set in this order along the X direction. The structure of the source region R1, the source-side select transistor region R2, the drain-side select transistor region R4, and the drain region R5 may be the same as those of the second embodiment described above. Hereinafter, the structure of the memory cell region R3 will be described.

The stacked body 20 may be provided with a plurality of gate electrodes 23 (see FIG. 32A). The plurality of gate electrodes 23 may be arranged in a matrix form along the X direction and the Y direction and may be spaced apart from each other. The gate electrodes 23 may be formed of a conductive material such as tungsten. Each of the gate electrodes 23 may have a columnar shape extending in the Z direction. An electrode pair 23p may include two gate electrodes 23 adjacent to each other in the Y direction. An electrode group 23g may be constituted by a plurality of electrode pairs 23p arranged in a row along the X direction. The plurality of electrode groups 23g may be provided and arranged in the Y direction.

The gate electrode 23 may have, for example, a substantially semi-elliptic cylindrical shape. The central axis of the ellipse may extend in the Z direction, the major axis direction of the ellipse may be the Y direction, and the minor axis direction may be the X direction. However, since the gate electrode 23 is, for example, a substantially semi-elliptic cylindrical shape, the length in the Y direction is not necessarily longer than the length in the X direction. A region 23a on the lateral surface of a gate electrode 23 facing the other gate electrode 23 belonging to the same electrode pair 23p may correspond to (e.g., may be formed in the position and shape corresponding to those of) a chord of an ellipse and may be a plane expanding along the XZ plane. In addition, a region 23b that does not face the other gate electrode 23 may correspond to (e.g., may be formed in the position and shape corresponding to those of) an arc of an ellipse and may be a curved surface that is convex in the Y direction away from the other gate electrode 23. When viewed from the Z direction, the regions 23b of the two gate electrodes 23 belonging to the same electrode pair 23p may be, for example, two different portions of one ellipse.

An insulating film 71 made of, for example, silicon oxide may be provided between two gate electrodes 23 belonging to the electrode pair 23p. The insulating film 71 may expand along the XZ plane and may be disposed throughout the electrode group 23g. The insulating film 71 may be in contact with the regions 23a of all the gate electrodes 23 belonging to a certain electrode group 23g.

A gate insulating film 25 may be provided on the region 23b of each gate electrode 23. The gate insulating film 25 may be disposed over the entire length of the gate electrode 23 in the Z direction. On the gate insulating film 25, a plurality of conductive films 28 which are arranged separately from each other in the Z direction may be provided. Each gate electrode 28 may have, for example, a substantially semi-elliptical annular shape. The silicon film 29 and the resistance-change film 30 may be stacked in the conductive film 28. That is, the resistance-change film 30 may be provided on the region 23b on the lateral surface of the gate electrode 23. The silicon film 29 as a semiconductor film may be provided between the gate electrode 23 and the resistance-change film 30. The gate insulating film 25 may be provided between the gate electrode 23 and the silicon film 29.

A conductive film 73 (see FIG. 31) may be provided between adjacent electrode pairs 23p in the X direction and between the conductive films 28 at the same position in the Z direction. That is, a plurality of conductive films 73 may be provided between two adjacent gate electrodes 23 in the X direction and arranged along the Z direction and spaced apart from each other in the Z direction. The conductive films 73 may be formed of a conductive material such as, for example, tungsten and may be in contact with the insulating film 71. The conductive film 73 may be connected to the silicon film 29 and the resistance-change film 30 of the conductive film 28 which are adjacent to each other in the X direction.

In this manner, a silicon film 29 and a resistance-change film 30 provided on the lateral surface of one gate electrode 23 may be connected, via the conductive film 73, to a silicon film 29 and a resistance-change film 30 provided on the lateral surface of the other gate electrode 23 arranged adjacent to the one gate electrode 23 in the X direction. As a result, the conductive films 28, which belong to the same electrode group 23g and are provided on the lateral surfaces of the gate electrodes 23 arranged in a row along the X direction, and whose positions in the Z direction are equal to each other, may be connected in series via the conductive films 73. In each of the conductive films 28, the silicon film 29 and the resistance-change film 30 may be connected in parallel.

Referring to FIG. 33, a memory structure 75 may include a plurality of gate electrodes 23 arranged in a row along the X direction, gate insulating films 25 and conductive films 28 provided on the regions 23b of the gate electrodes 23, and conductive films 73 provided between the conductive films 28. A structure 76 may include a pair of memory structures 75 and an insulating film 71 interposed therebetween (see FIG. 34). The shape of the structure 76 may be a plate shape expanding along the XZ plane. An insulating film 77 made of, for example, silicon oxide may be provided between a plurality of structures 76 arranged in the Y direction. The insulating film 77 may be also disposed between conductive films 28 adjacent to each other in the Z direction and between conductive films 73 adjacent to each other in the Z direction.

Next, an operation of the resistance-change type memory device according to the third embodiment will be described.

Figure 35A:
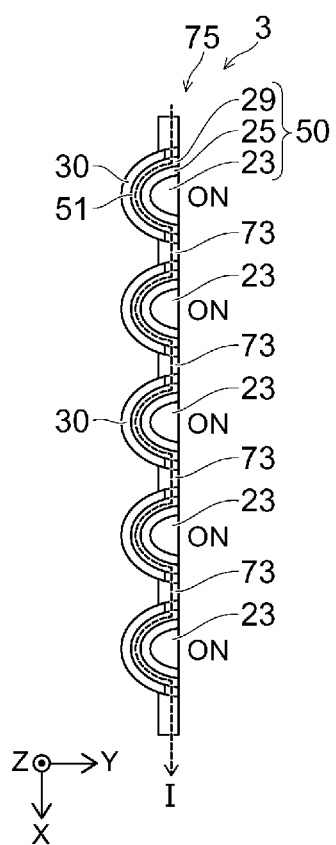
FIG. 35A to FIG. 35D are views illustrating an operation of the resistance-change type memory device according to the third embodiment.
Figure 35B:
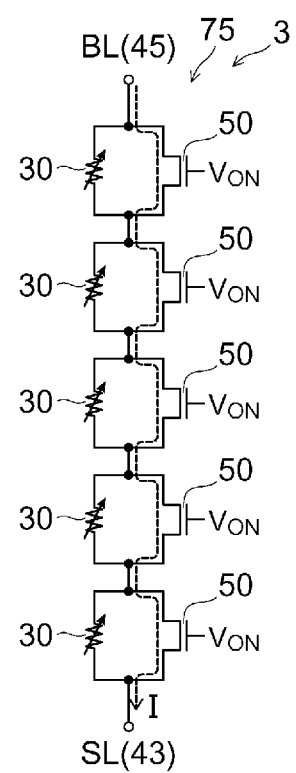
Figure 35C:
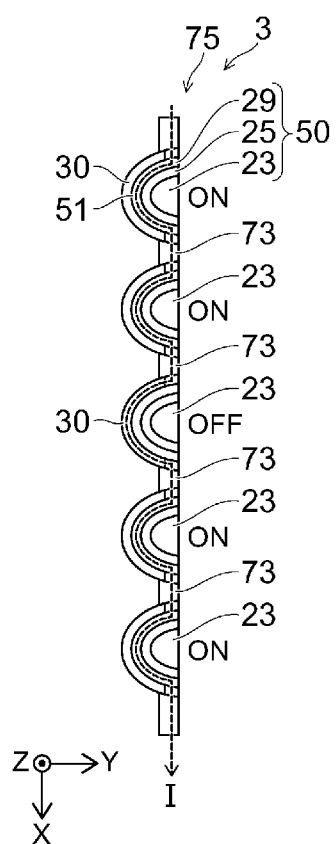
Figure 35D:
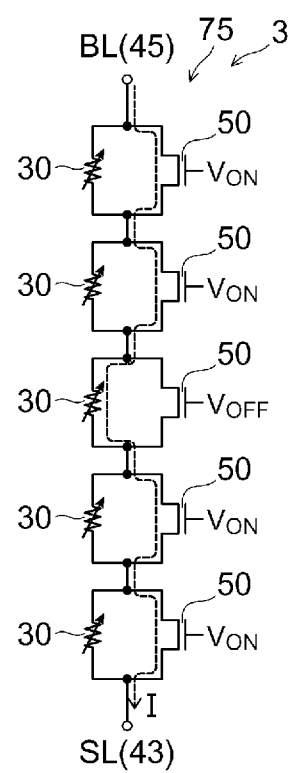

FIG. 35A to FIG. 35D are views illustrating an operation of the resistance-change type memory device according to the third embodiment. FIG. 35A is a plan view illustrating a state where no memory cell is selected, FIG. 35B is an equivalent circuit diagram thereof, FIG. 35C is a plan view illustrating a state where one memory cell is selected, and FIG. 35D is an equivalent circuit diagram thereof.

As illustrated in FIG. 35A and FIG. 35B, the resistance-change type memory device 3 may be provided with field effect transistors 50 each including the gate electrode 23 as a gate, the gate insulating film 25 as agate insulating film, and the silicon film 29 as a channel. Further, the transistor 50 and a resistance-change film 30 may constitute a memory cell. One memory cell may be formed for each conductive film 28. In each memory cell, the silicon film 29 and the resistance-change film 30 may form a parallel current path. The memory cells arranged in a row along the X direction may be connected in series via the conductive films 73.

The method of determining the Z coordinate and the Y coordinate of the selected memory cell in the third embodiment is the same as that in the first embodiment. Hereinafter, descriptions will be made on a method of determining the X coordinate of the selected memory cell.

As illustrated in FIG. 35A and FIG. 35B, when an ON potential Von is applied to a gate electrodes 23, a depletion layer 51 may be formed in the silicon film located around the gate electrode 23, so that the transistor 50 is turned ON. When the ON potential Von is applied to all the gate electrodes 23 belonging to a certain memory structure 75, all the transistors 50 belonging to the memory structure 75 may be turned ON, so that a current I flows through the current path formed by the silicon films 29 and the conductive films 73.

Meanwhile, as illustrated in FIG. 35C and FIG. 35D, when an OFF potential Voff is applied to one gate electrode 23 and the ON potential Von is applied to the other gate electrodes 23, the transistor 50 formed by the gate electrode 23 to which the OFF potential Voff is applied may be turned OFF, and the resistance value of the silicon film 29 may increase. As a result, the current I can flow through the resistance-change film 30, and a bit-source voltage can be applied to the resistance-change film 30. In this manner, the X coordinate of the selected memory cell can be determined. The bit-source voltage in the write operation, the read operation, and the erasing operation is as described in the first embodiment.

Next, effects of the third embodiment will be described.

Also in the third embodiment, as in the second embodiment, in each memory cell, the silicon film 29, which is a channel of the transistor 50, and the resistance-change film 30 may form a parallel current path. Therefore, the supply and cutoff of the current to the resistance-change film 30 may be selected by switching the transistor 50. Therefore, it is possible to implement a resistance-change type memory device having high stability in operation.

Further, in the third embodiment, since the silicon film 29 and the resistance-change film 30 are not disposed between the two gate electrodes 23 constituting the electrode pair 23p, the two gate electrodes 23 may be disposed close to each other. As a result, the degree of integration of the memory cell can be improved.

Furthermore, in the third embodiment, the memory cells may be connected to each other by the conductive film 73. Therefore, the resistance of the entire current path may be reduced, and since the depletion layer 51 generated in the silicon film 29 of a certain memory cell does not expand to the inside of the silicon film 29 of a neighboring memory cell, the interference between the memory cells may be reduced.

The configuration, operation, and effect other than those described above in the third embodiment are the same as those in the second embodiment.

Next, a method of manufacturing the resistance-change type memory device according to the third embodiment will be described.

FIG. 36 to FIG. 74D are views illustrating a method for manufacturing the resistance-change type memory device according to the third embodiment.

Figure 36:
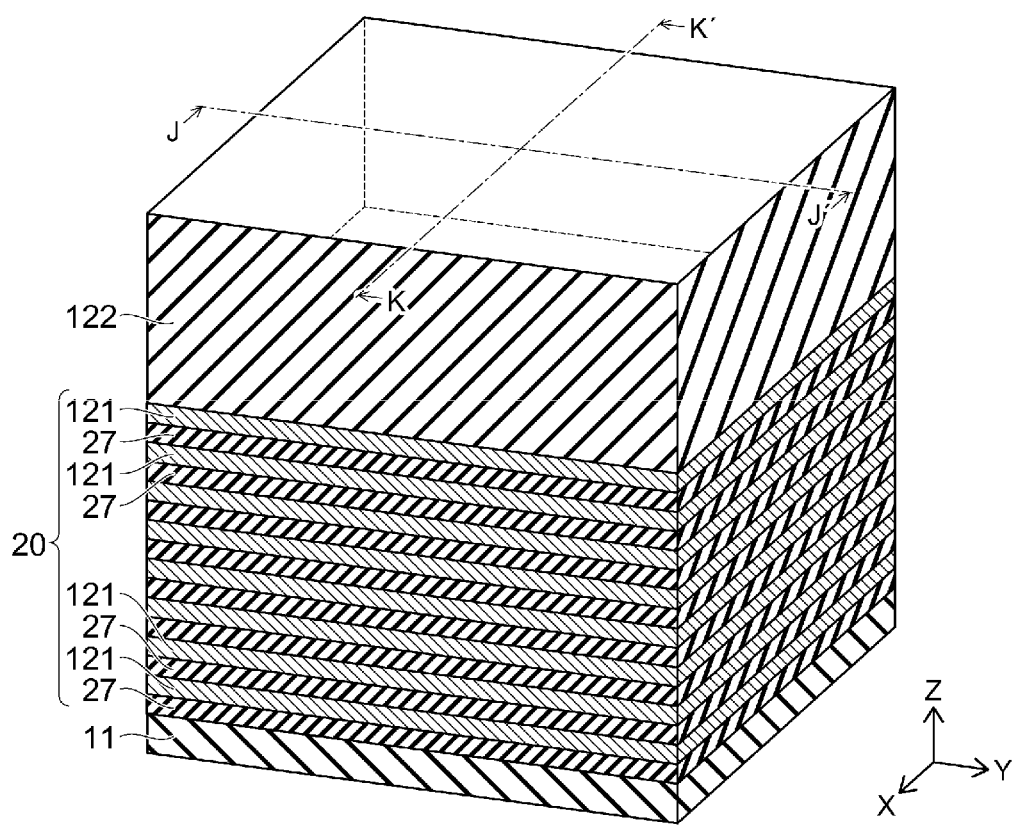
FIG. 36 is a perspective sectional view illustrating a method for manufacturing the resistance-change type memory device according to the third embodiment.
Figure 37A:
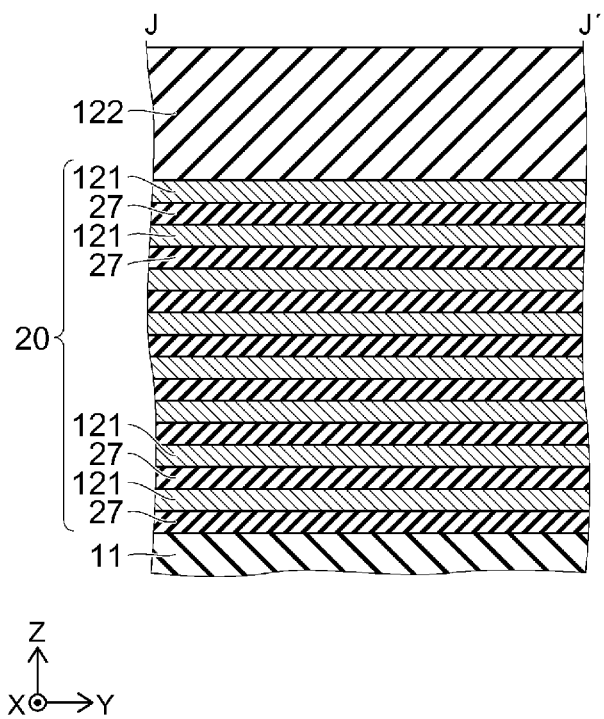
FIG. 37A is a cross-sectional view taken along the line J-J' in FIG. 36.
Figure 37B:
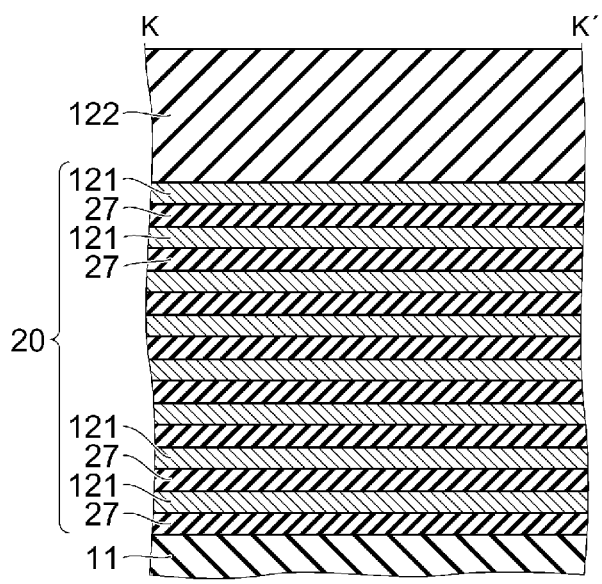
FIG. 37B is a cross-sectional view taken along the line K-K' in FIG. 36.
Figure 38:
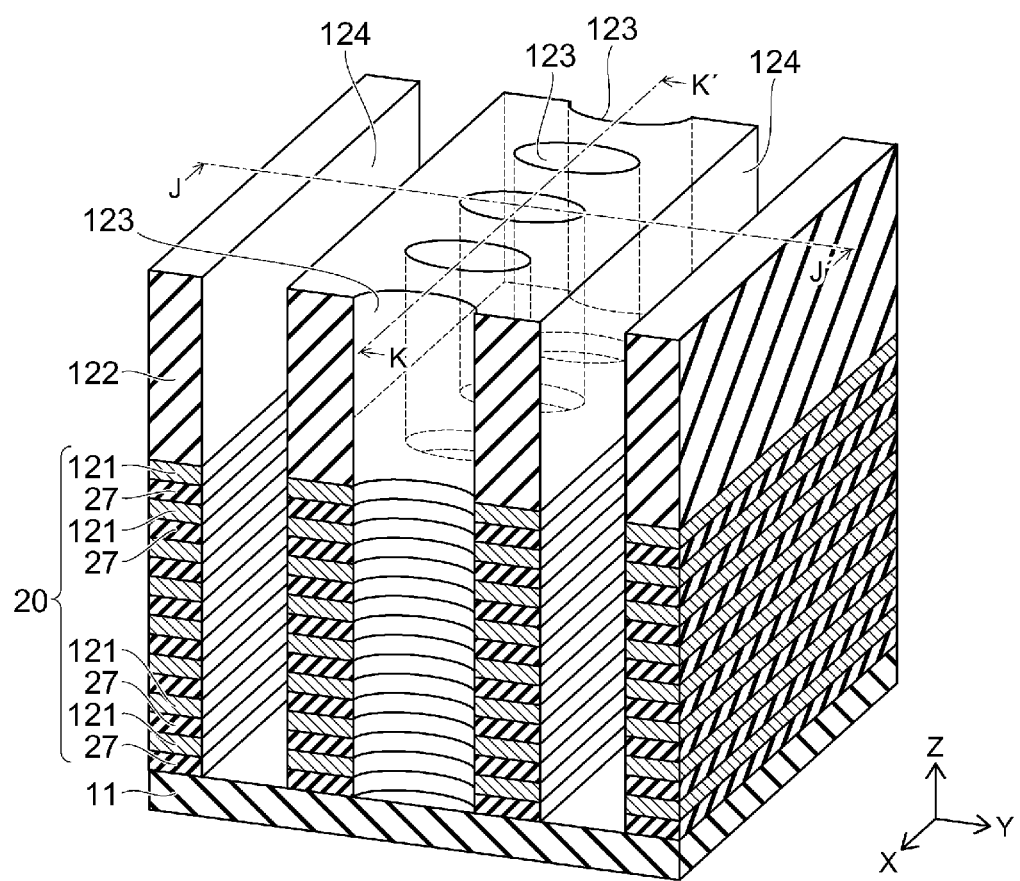
FIG. 38 is a perspective sectional view illustrating a method for manufacturing the resistance-change type memory device according to the third embodiment.
Figure 39A:
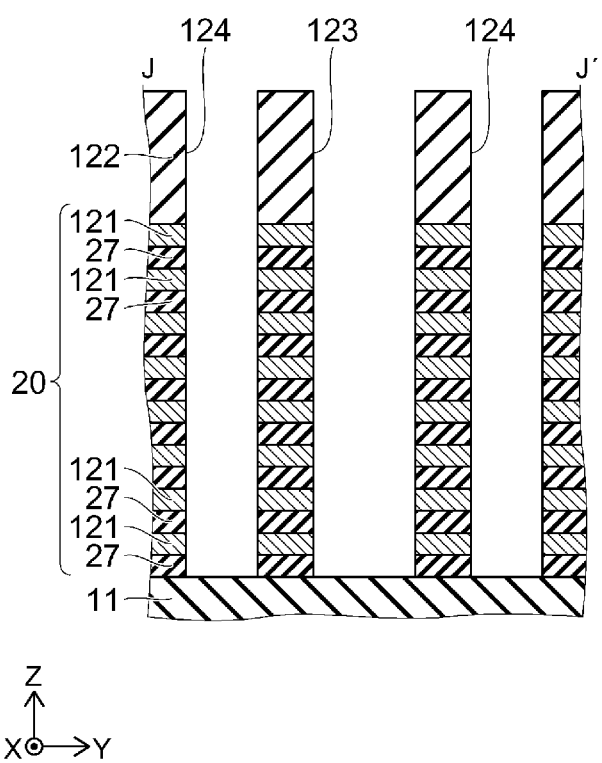
FIG. 39A is a cross-sectional view taken along the line J-J' in FIG. 38.
Figure 39B:
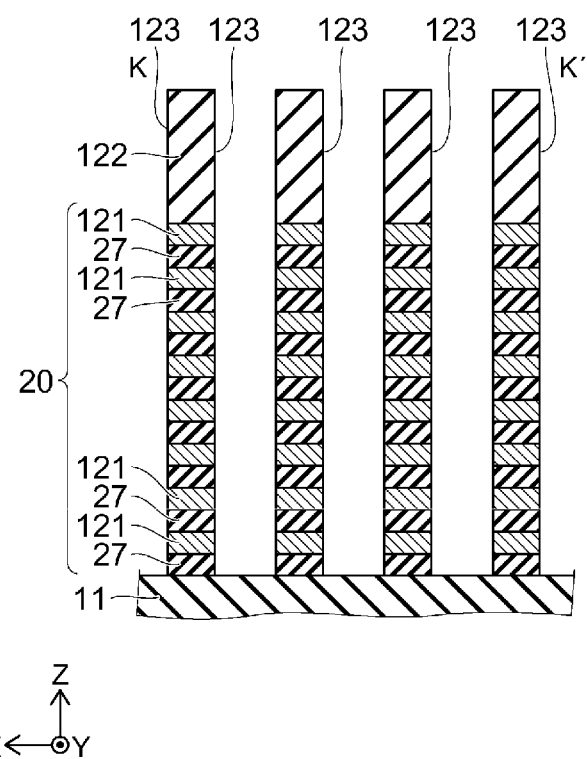
FIG. 39B is a cross-sectional view taken along the line K-K' in FIG. 38.
Figure 72:
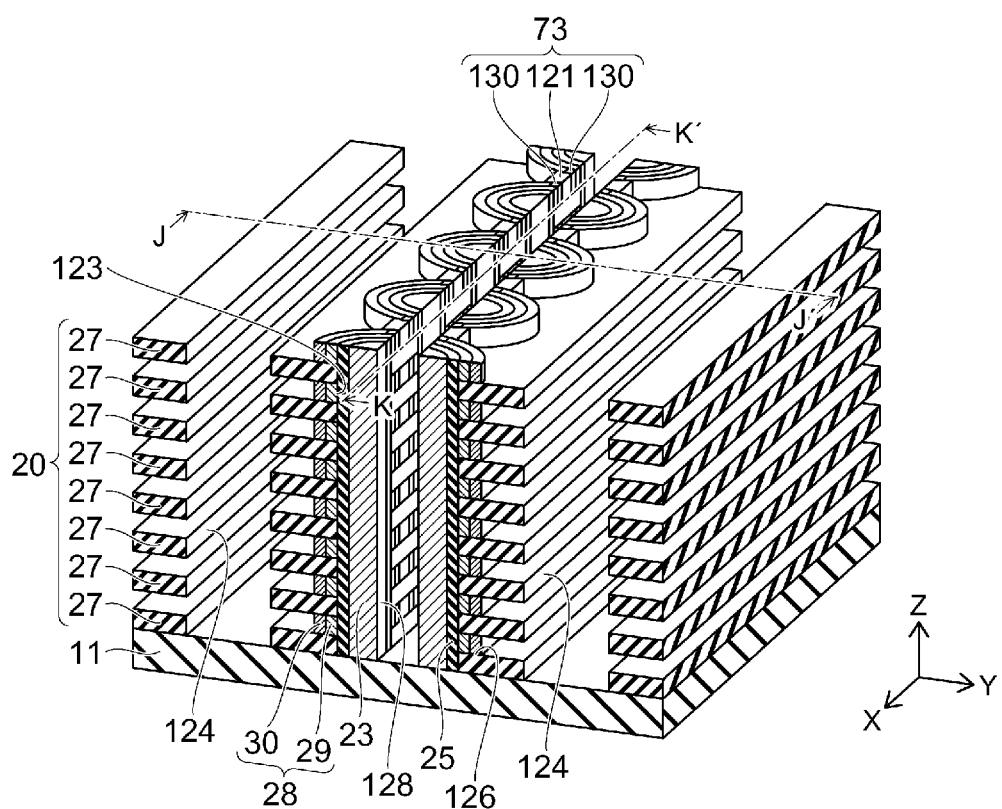
FIG. 72 is a perspective sectional view illustrating a method for manufacturing the resistance-change type memory device according to the third embodiment.
Figure 73A:
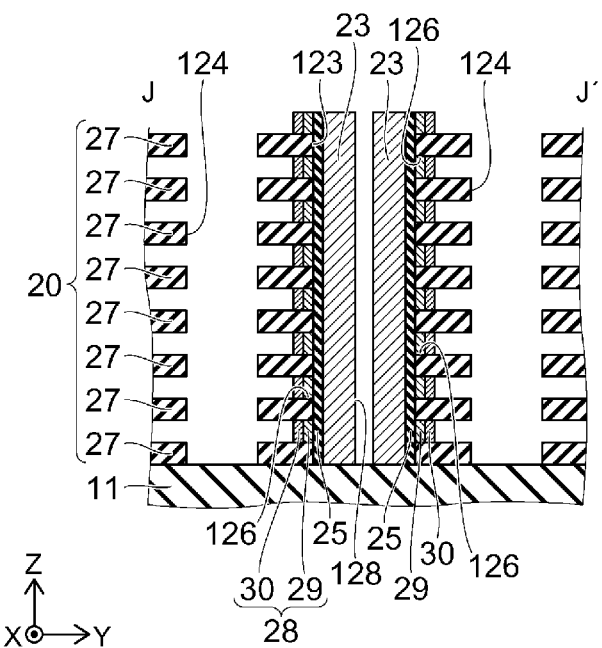
FIG. 73A is a cross-sectional view taken along the line J-J' in FIG. 72.
Figure 73B:
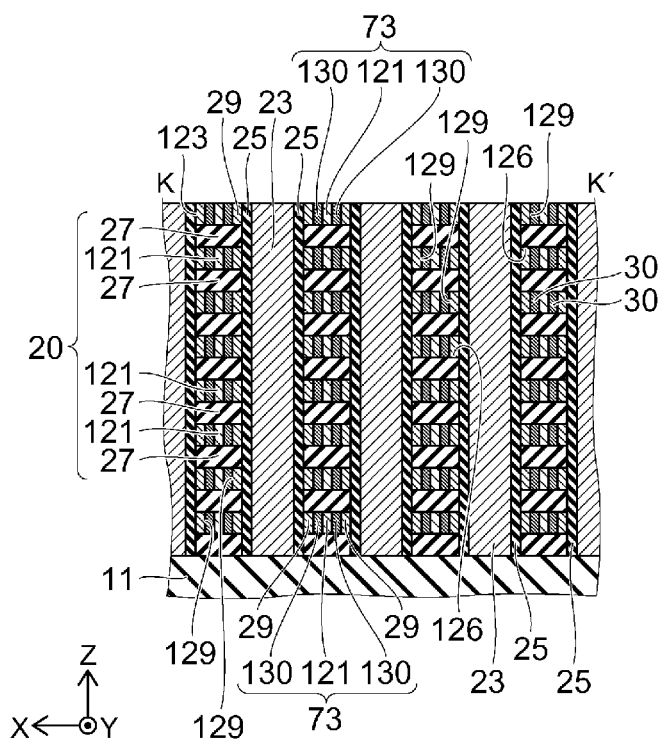
FIG. 73B is a cross-sectional view taken along the line K-K' in FIG. 72.

FIG. 36 is a perspective sectional view, FIG. 37A is a cross-sectional view taken along the line J-J' in FIG. 36, and FIG. 37B is a cross-sectional view taken along the line K-K' in FIG. 36. The same is true for FIG. 38 to FIG. 73B. That is, FIG. 39A is a cross-sectional view taken along the line J-J' in FIG. 38, and FIG. 39B is a cross-sectional view taken along the line K-K' in FIG. 38, . . . , and FIG. 73A is a cross-sectional view taken along the line J-J' in FIG. 72, and FIG. 73B is a cross-sectional view taken along the line K-K' in FIG. 72.

Figure 60:
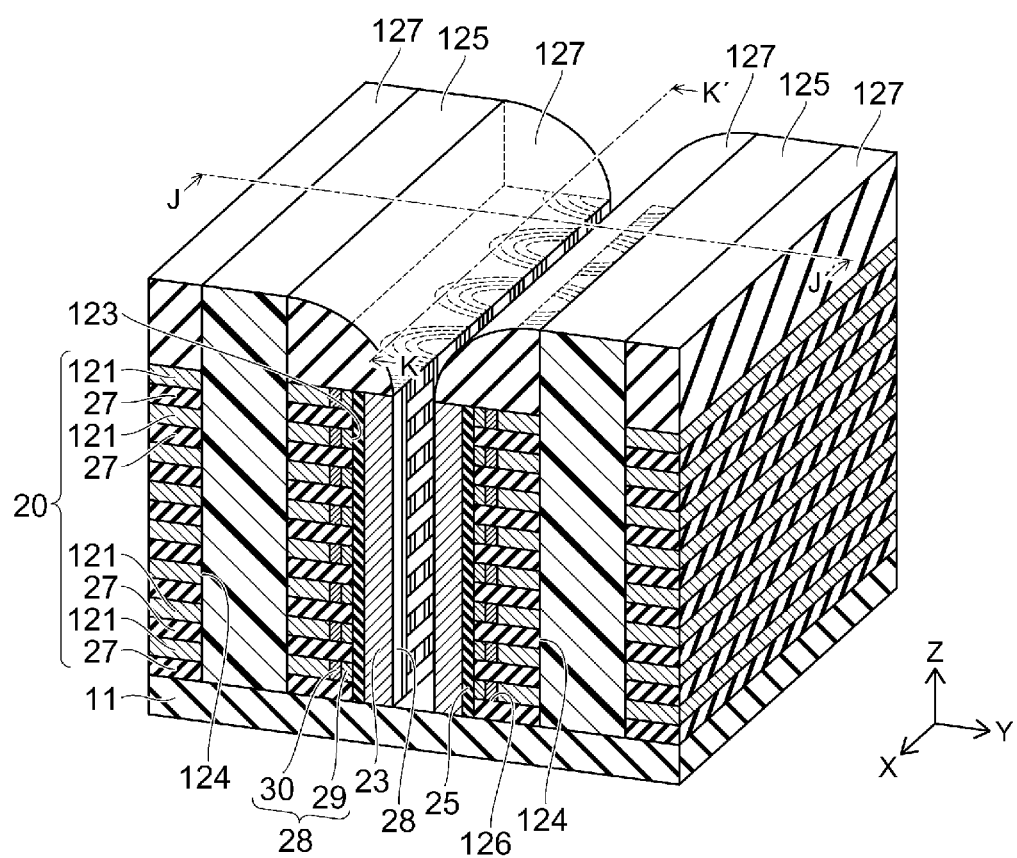
FIG. 60 is a perspective sectional view illustrating a method for manufacturing the resistance-change type memory device according to the third embodiment.
Figure 61A:
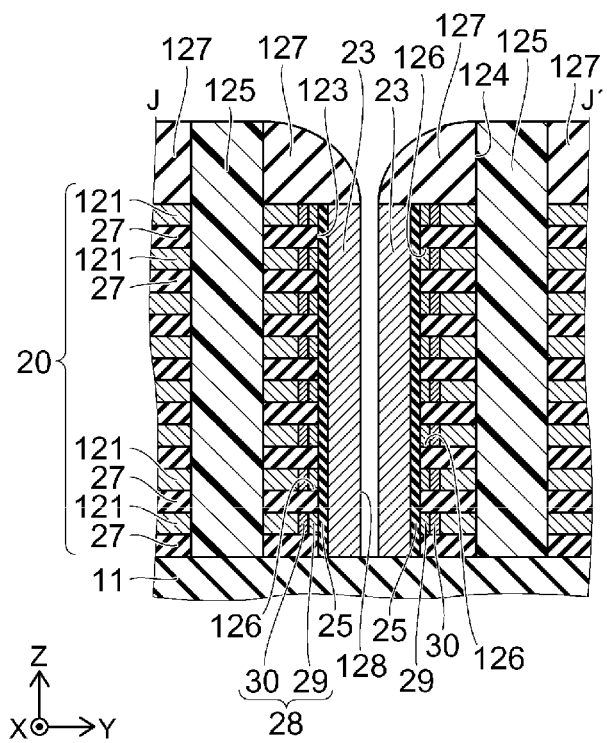
FIG. 61A is a cross-sectional view taken along the line J-J' in FIG. 60.
Figure 61B:
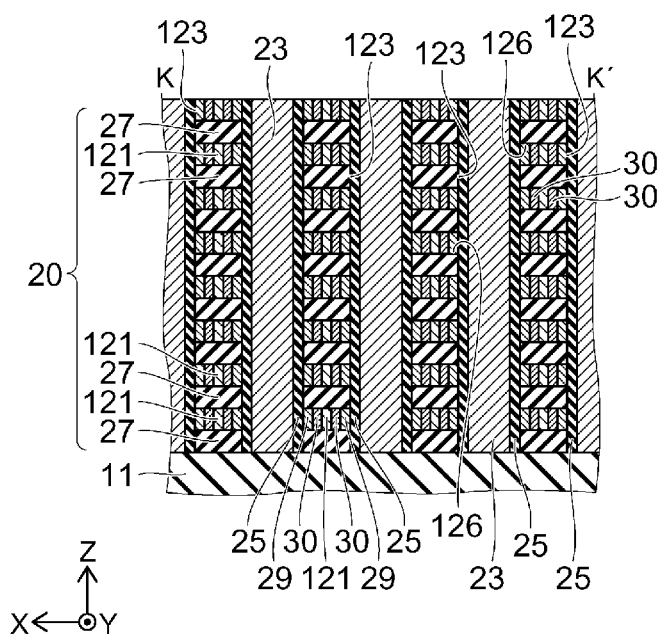
FIG. 61B is a cross-sectional view taken along the line K-K' in FIG. 60.
Figure 62:
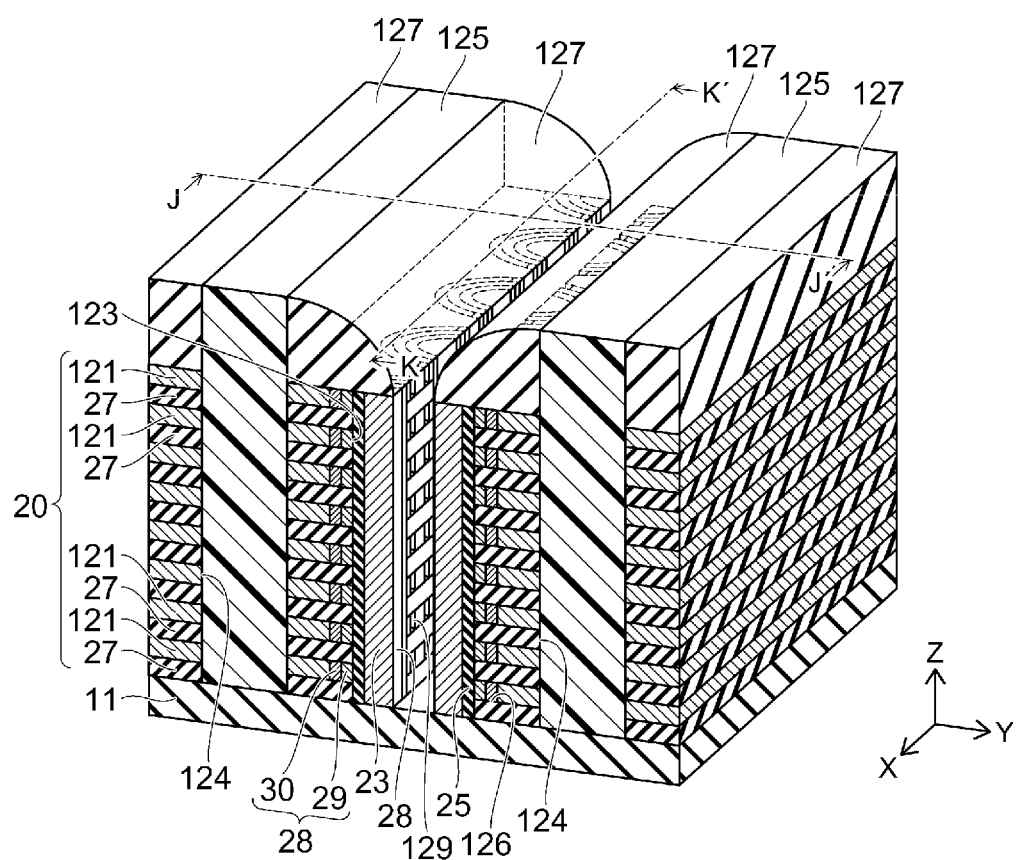
FIG. 62 is a perspective sectional view illustrating a method for manufacturing the resistance-change type memory device according to the third embodiment.
Figure 63A:
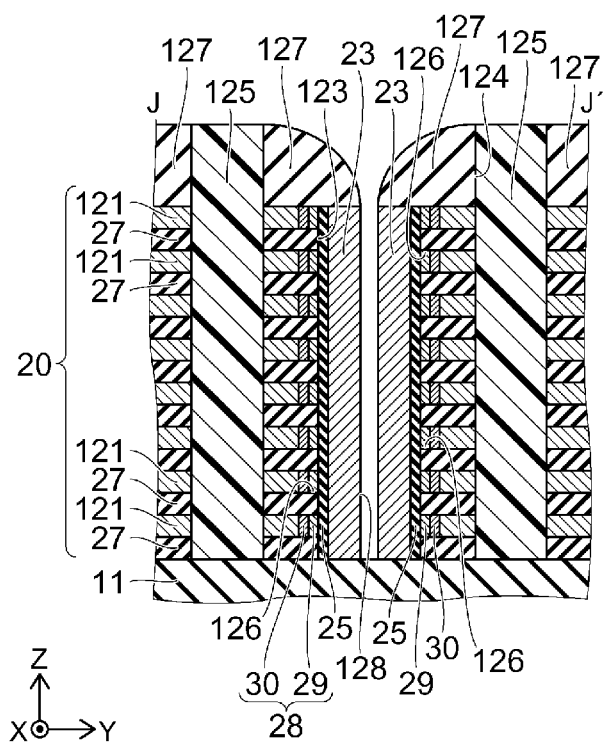
FIG. 63A is a cross-sectional view taken along the line J-J' in FIG. 62.
Figure 63B:
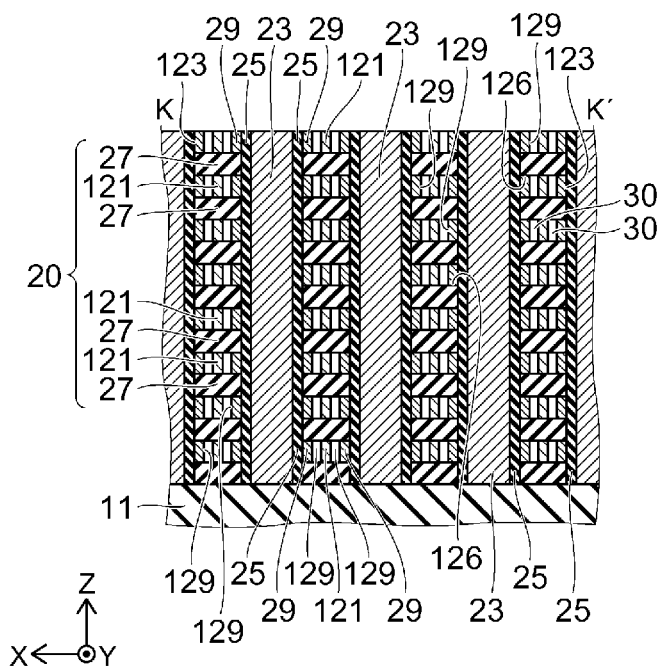
FIG. 63B is a cross-sectional view taken along the line K-K' in FIG. 62.
Figure 64:
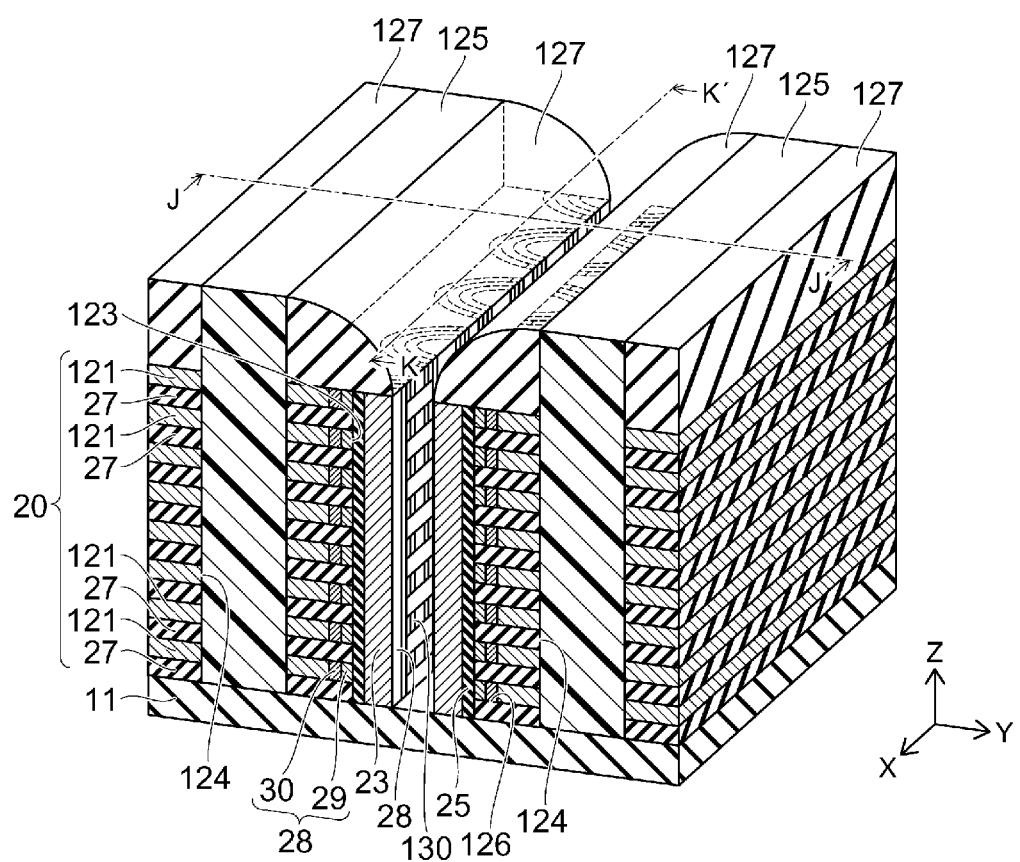
FIG. 64 is a perspective sectional view illustrating a method for manufacturing the resistance-change type memory device according to the third embodiment.
Figure 65A:
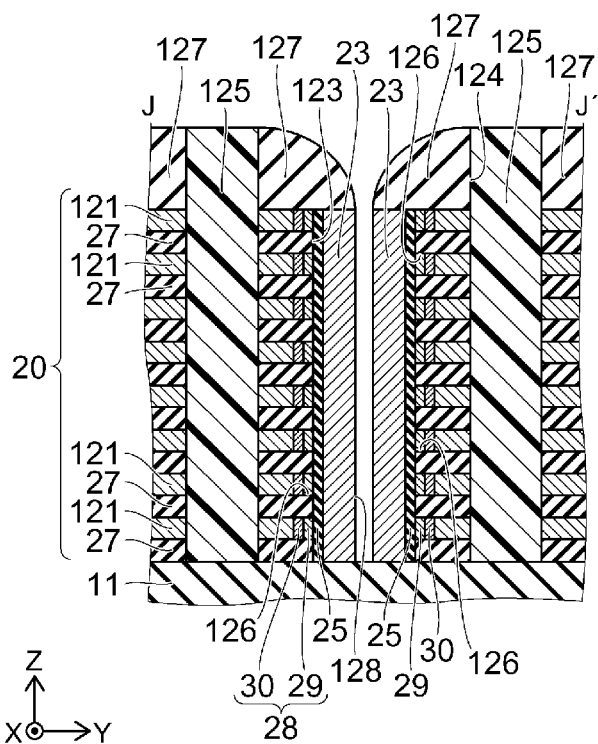
FIG. 65A is a cross-sectional view taken along the line J-J' in FIG. 64.
Figure 65B:
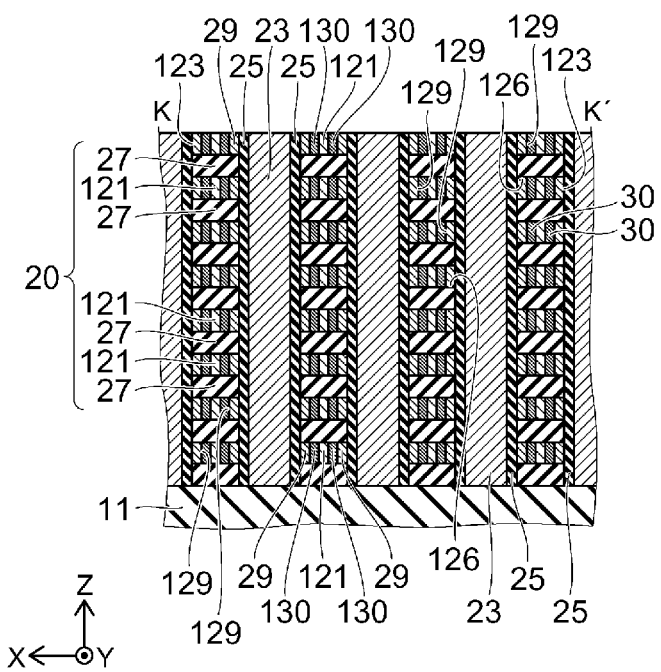
FIG. 65B is a cross-sectional view taken along the line K-K' in FIG. 64.
Figure 70:
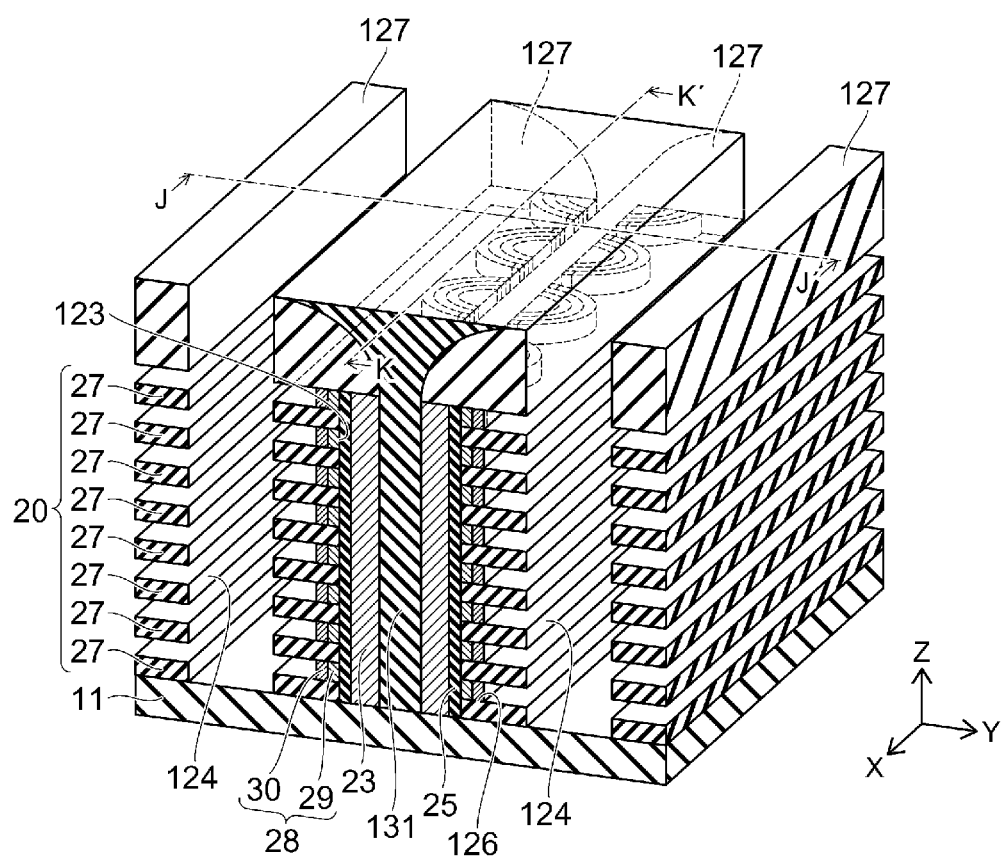
FIG. 70 is a perspective sectional view illustrating a method for manufacturing the resistance-change type memory device according to the third embodiment.
Figure 74A:
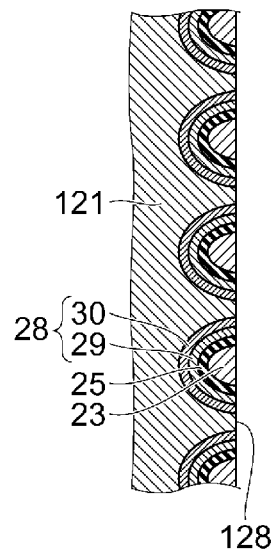
FIG. 74A to FIG. 74D are cross-sectional views illustrating a method for manufacturing the resistance-change type memory device according to the third embodiment.
Figure 74B:
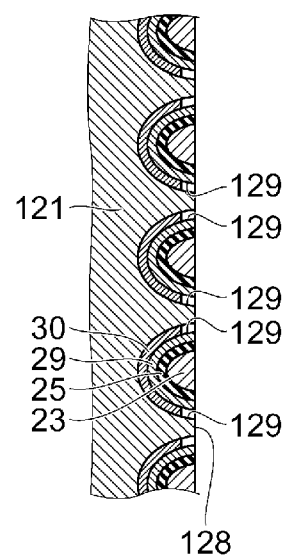
Figure 74C:
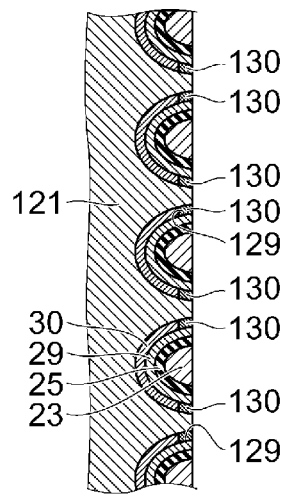
Figure 74D:
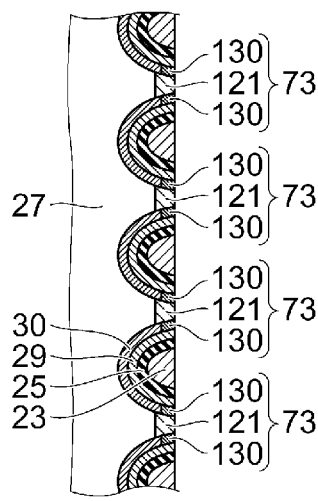

FIG. 74A is an XY sectional view corresponding to FIG. 60, FIG. 74B is an XY cross sectional view corresponding to FIG. 62, FIG. 74C is an XY cross sectional view corresponding to FIG. 64, and FIG. 74D is an XY sectional view corresponding to FIG. 70.

First, as illustrated in FIG. 33, an interlayer insulating film 11 may be formed on a silicon substrate 10, and a drive circuit 12 may be formed in an upper layer portion of the silicon substrate 10 and a lower layer portion of the interlayer insulating film 11.

Next, as illustrated in FIG. 36, FIG. 37A, and FIG. 37B, insulating films 27 made of, for example, silicon oxide and tungsten films 121 made of, for example, tungsten may be alternately deposited on the interlayer insulating film 11 to form a stacked body 20. Next, the end portion on the side of the drain region R5 (see FIG. 17) in the stacked body 20 may be processed into a step shape (not illustrated). As a result, a terrace T (see FIG. 17) can be formed for each tungsten film 121. Next, an interlayer insulating film (not illustrated) may be formed around the stacked body 20, and the end portion of the stacked body 20 may be embedded. Next, a hard mask 122 made of, for example, silicon nitride may be formed on the stacked body 20 and the interlayer insulating film.

Next, as illustrated in FIG. 38, FIG. 39A, and FIG. 39B, holes 123 and trenches 124 may be formed in the stacked body 20 and the hard mask 122 by, for example, lithography and RIE. The holes 123 and trenches 124 may penetrate the hard mask 122 and the stacked body 20 so as to reach the interlayer insulating film 11. The hole 123 may have a columnar shape in which the central axis extends in the Z direction, for example, an elliptic cylindrical shape in which the major axis direction is the Y direction and the minor axis direction is the X direction. The trenches 124 may have a plate-like shape expanding along the XZ plane.

When viewed from the Z direction, the holes 123 may be arranged in a matrix form along the X direction and the Y direction. The trenches 124 may be arranged between the rows of holes 123 arranged in a row along the X direction. That is, the rows of holes 123 and the trenches 124 may be alternately arranged along the Y direction. The holes 123 and the trenches 124 may be spaced apart from each other.

Figure 40:
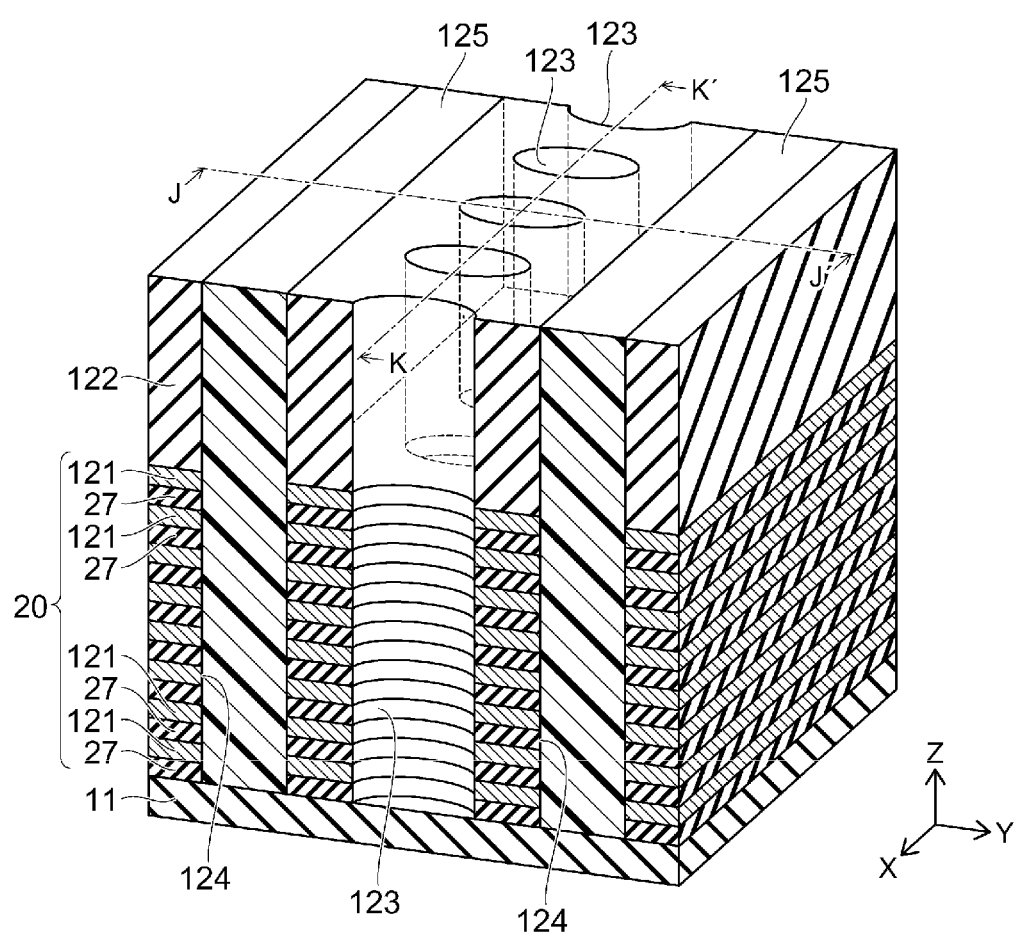
FIG. 40 is a perspective sectional view illustrating a method for manufacturing the resistance-change type memory device according to the third embodiment.
Figure 41A:
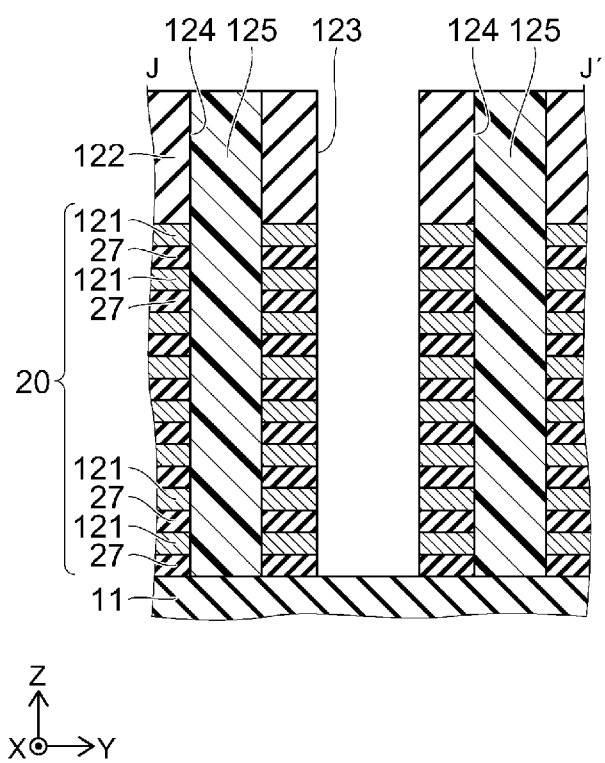
FIG. 41A is a cross-sectional view taken along the line J-J' in FIG. 40.
Figure 41B:
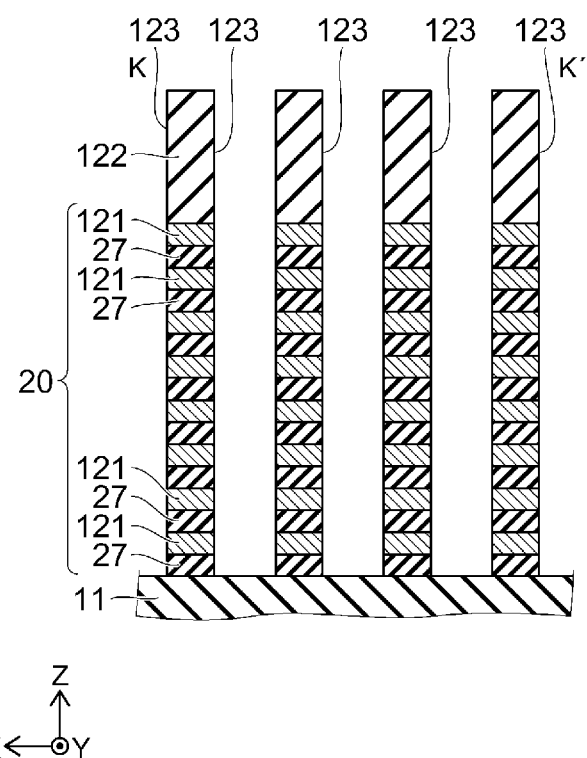
FIG. 41B is a cross-sectional view taken along the line K-K' in FIG. 40.

Next, as illustrated in FIG. 40, FIG. 41A, and FIG. 41B, an organic material may be embedded in the holes 123 and the trenches 124 by a coating method. Next, a hard mask pattern (not illustrated) covering the trenches 124 may be formed. Next, ashing may be performed to remove the organic material filled in the holes 123. At this time, the organic material filled in the trenches 124 is not removed because it is covered with the hard mask pattern. Next, the hard mask pattern may be removed. As a result, sacrificial members 125 made of an organic material can be formed in the trenches 124.

Figure 42:
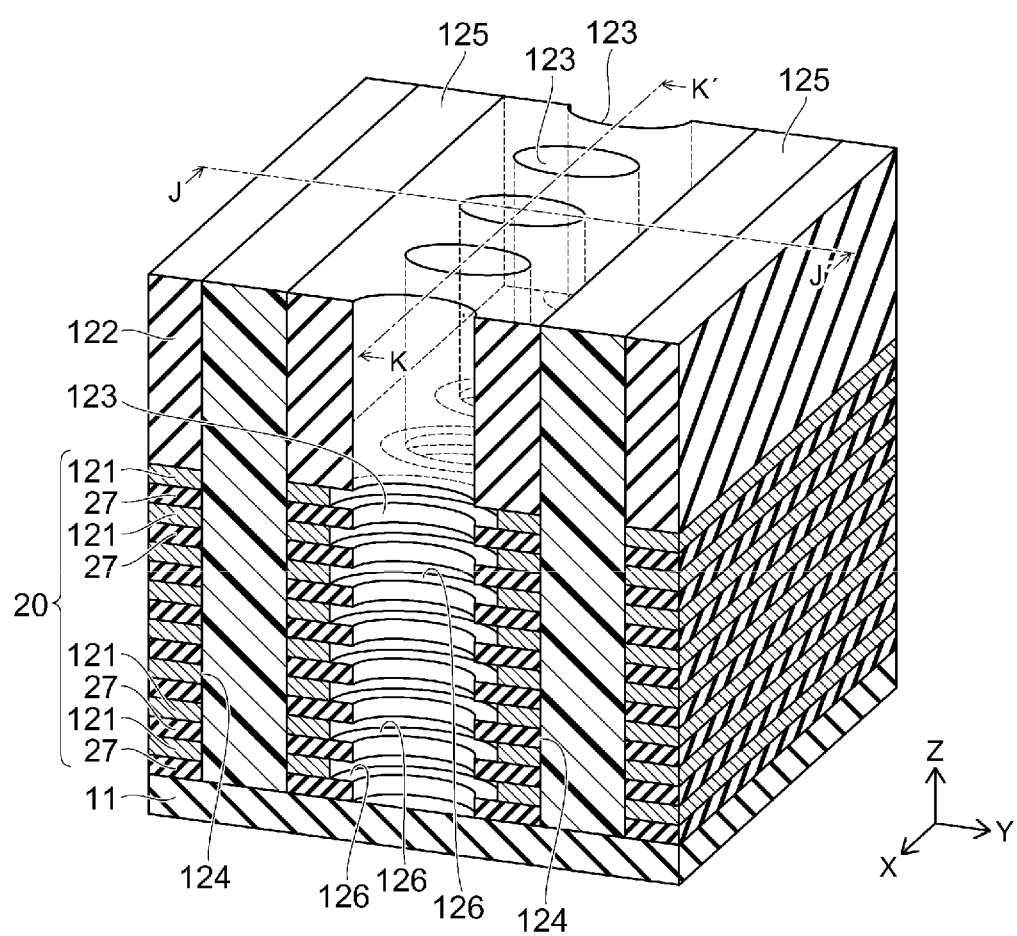
FIG. 42 is a perspective sectional view illustrating a method for manufacturing the resistance-change type memory device according to the third embodiment.
Figure 43A:
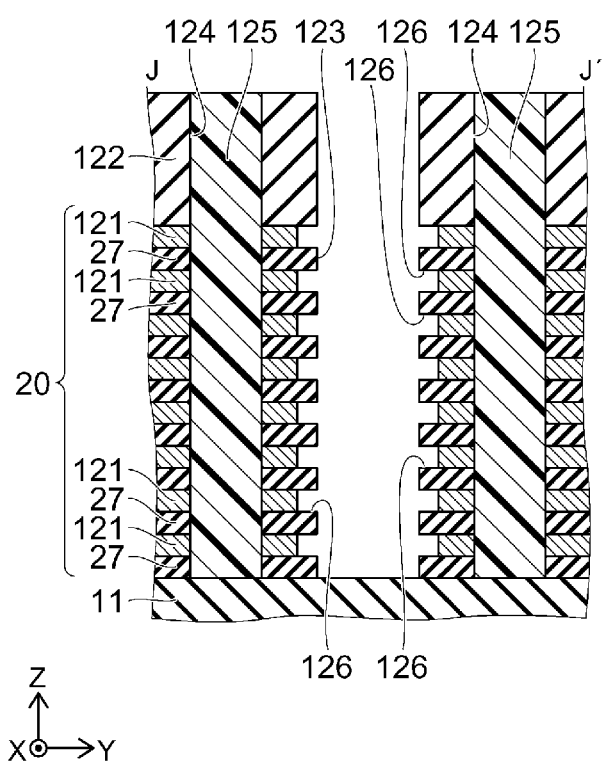
FIG. 43A is a cross-sectional view taken along the line J-J' in FIG. 42.
Figure 43B:
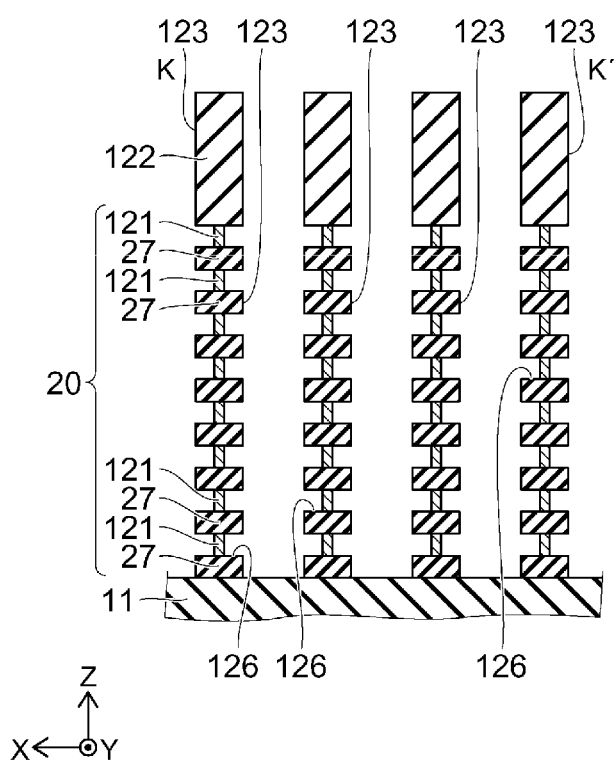
FIG. 43B is a cross-sectional view taken along the line K-K' in FIG. 42.

Next, as illustrated in FIG. 42, FIG. 43A, and FIG. 43B, a tungsten film 121 may be recessed (e.g., partly removed) through a hole 123 by, for example, wet etching using phosphoric-nitric-acetic acid. As a result, for example, an elliptical annular recessed portion 126 can be formed on the lateral surface of the hole 123.

Figure 44:
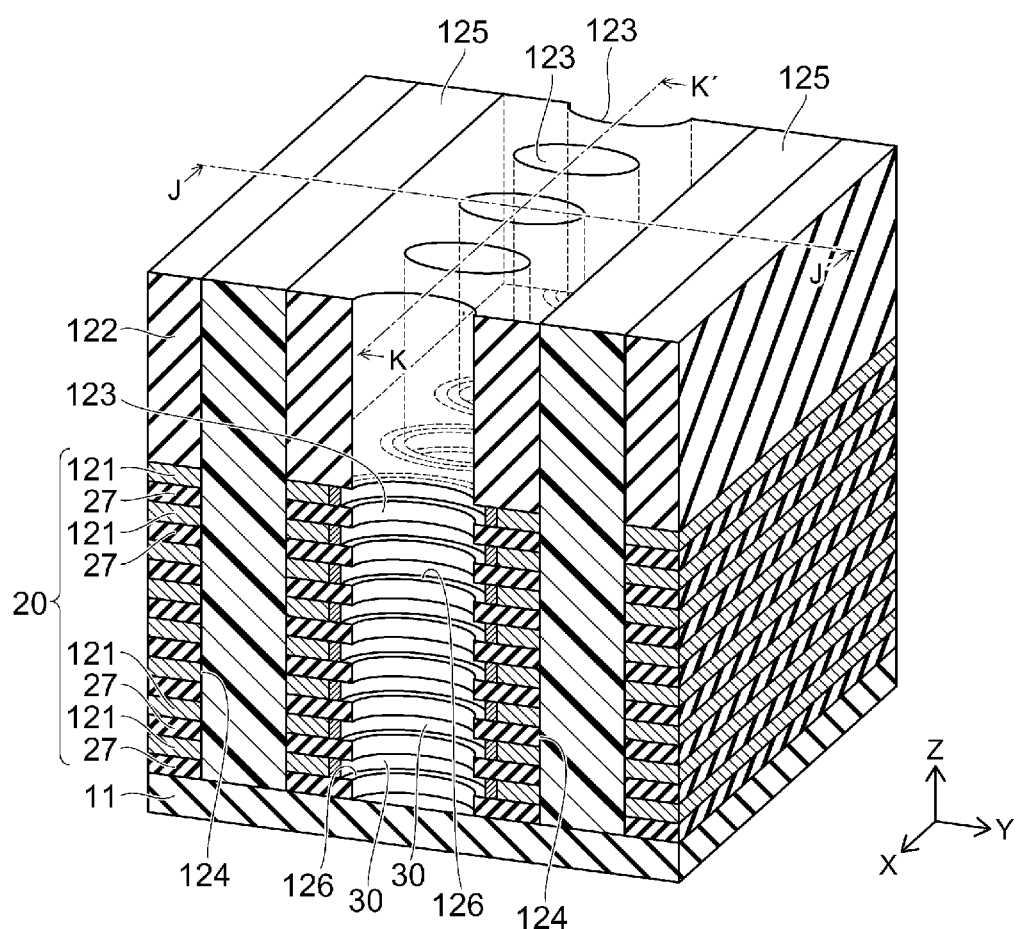
FIG. 44 is a perspective sectional view illustrating a method for manufacturing the resistance-change type memory device according to the third embodiment.
Figure 45A:
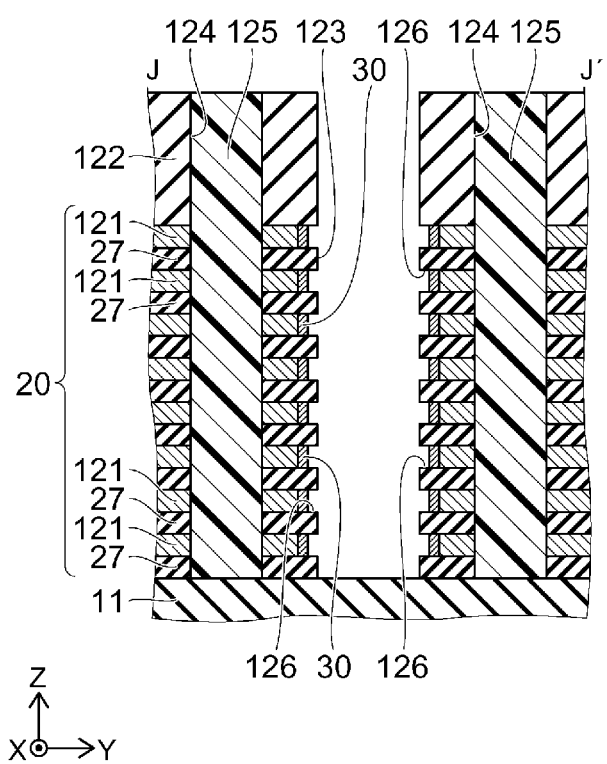
FIG. 45A is a cross-sectional view taken along the line J-J' in FIG. 44.
Figure 45B:
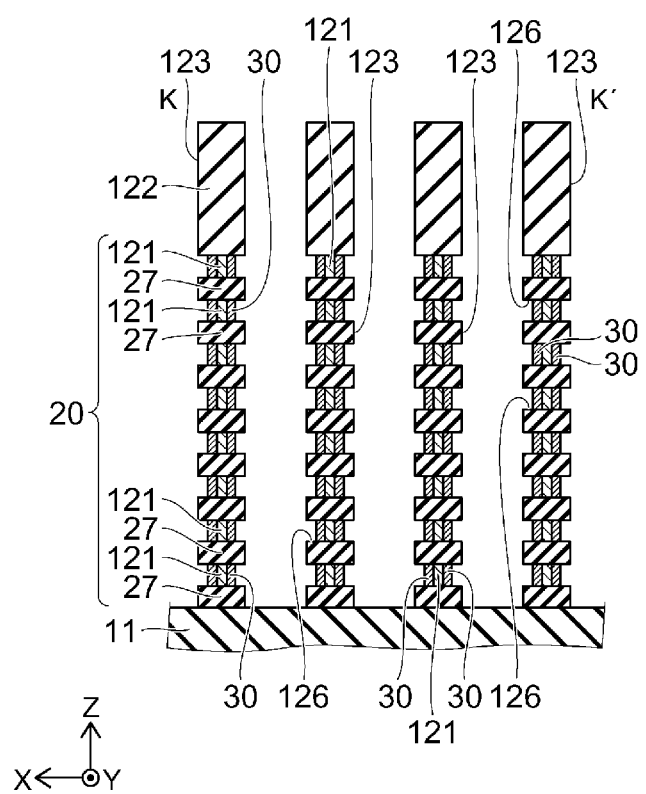
FIG. 45B is a cross-sectional view taken along the line K-K' in FIG. 44.

Next, as illustrated in FIG. 44, FIG. 45A, and FIG. 45B, a resistance-change material may be deposited on the back surface and etched back to form a resistance-change film 30 on the back surface of the recessed portion 126, that is, on the exposed surface of the tungsten film 121. At this stage, the resistance-change film 30 may have, for example, a substantially elliptical annular shape.

Figure 46:
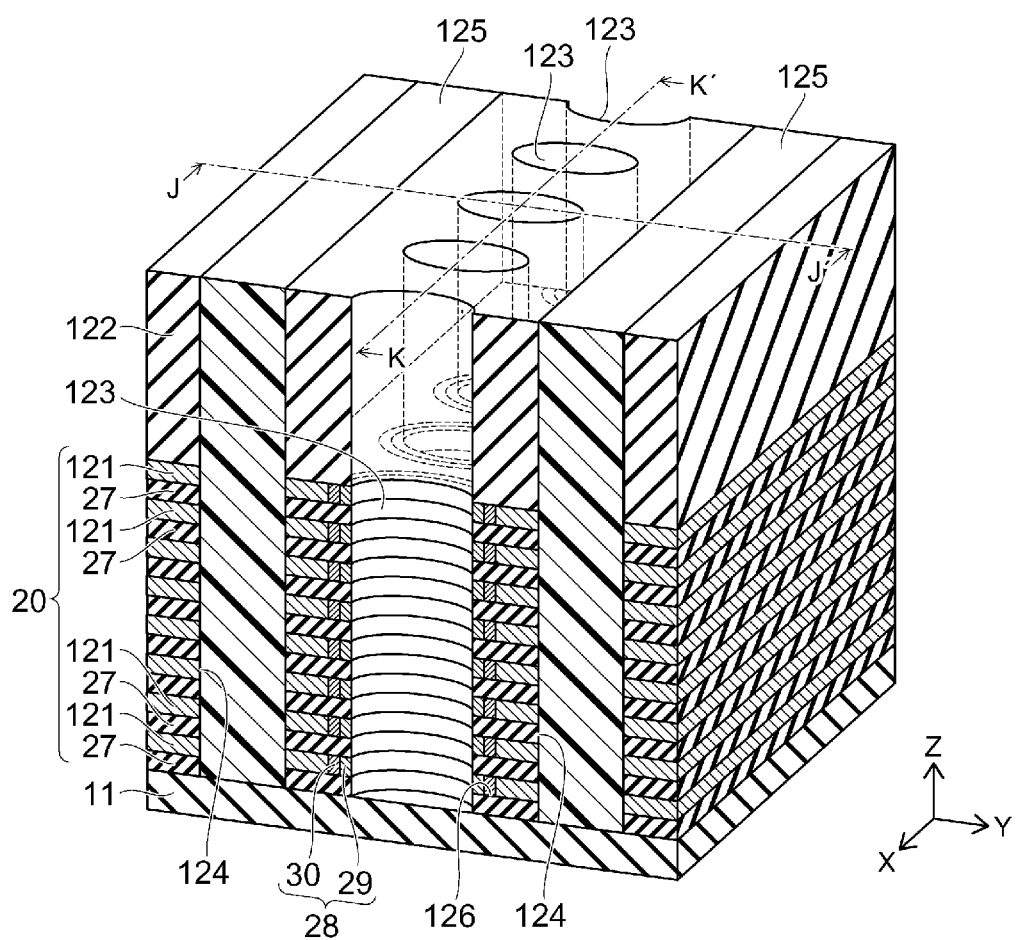
FIG. 46 is a perspective sectional view illustrating a method for manufacturing the resistance-change type memory device according to the third embodiment.
Figure 47A:
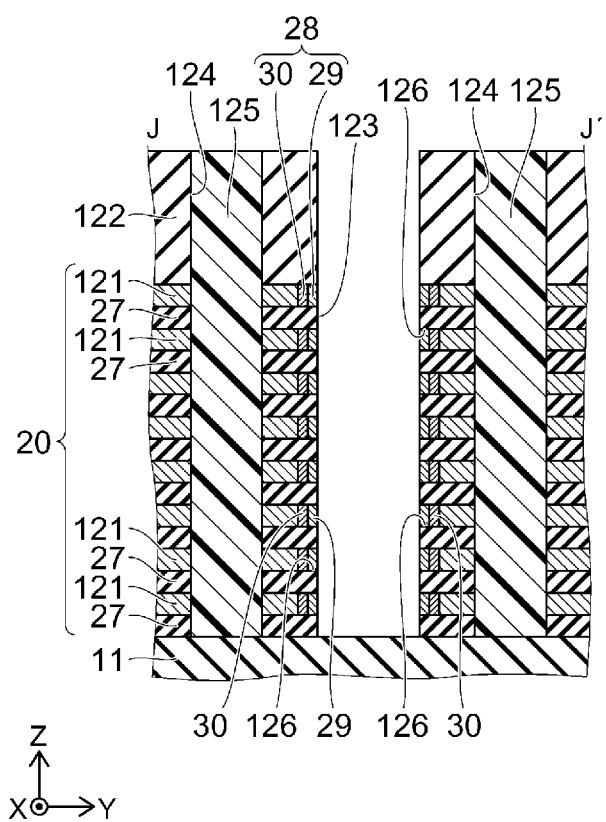
FIG. 47A is a cross-sectional view taken along the line J-J' in FIG. 46.
Figure 47B:
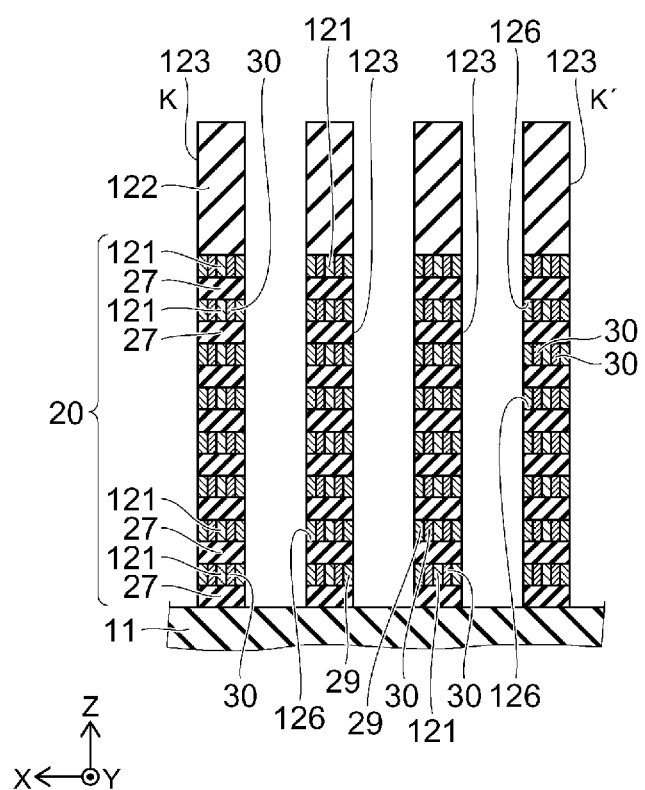
FIG. 47B is a cross-sectional view taken along the line K-K' in FIG. 46.

Next, as illustrated in FIG. 46, FIG. 47A, and FIG. 47B, silicon may be deposited on the entire surface and etched back to form a silicon film 29 made of polysilicon in the recessed portion 126. At this stage, the silicon film 29 may have, for example, a substantially elliptical annular shape. A conductive film 28 may include the resistance-change film 30 and the silicon film 30. The conductive film 28 may have a double ring structure in which the resistance-change film 30 constitutes an outer ring and the silicon film 29 constitutes an inner ring (see FIG. 46).

Figure 48:
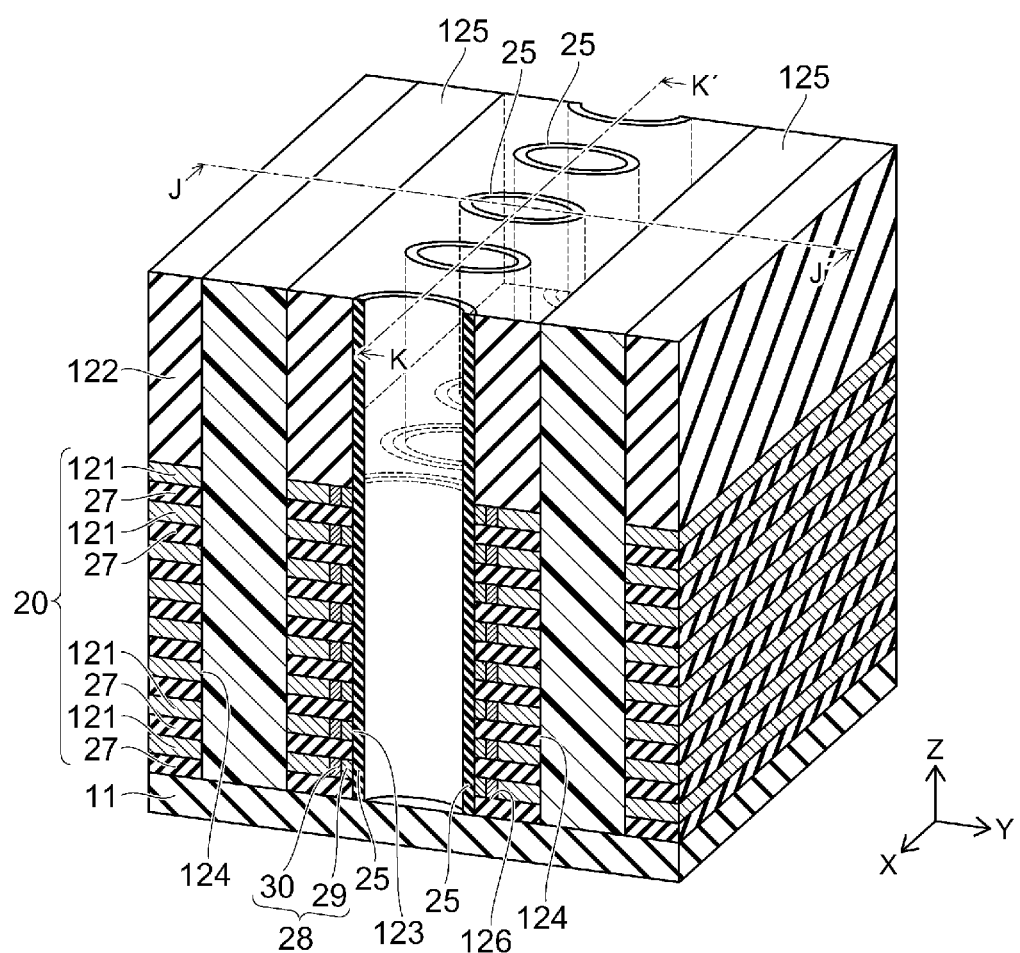
FIG. 48 is a perspective sectional view illustrating a method for manufacturing the resistance-change type memory device according to the third embodiment.
Figure 49A:
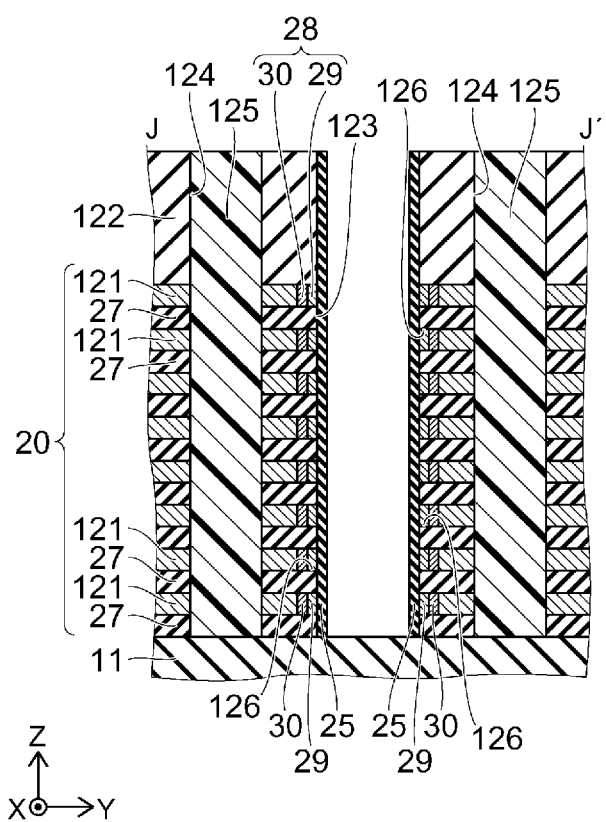
FIG. 49A is a cross-sectional view taken along the line J-J' in FIG. 48.
Figure 49B:
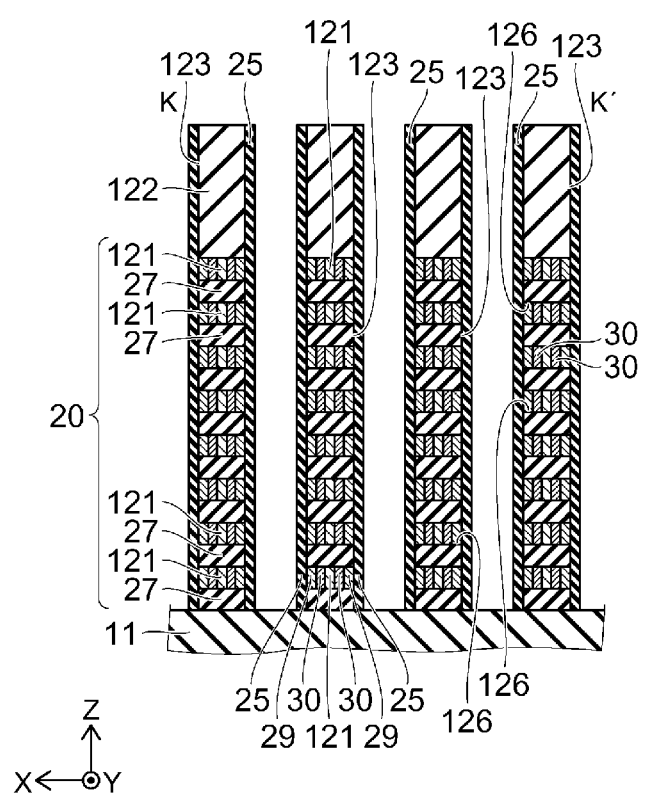
FIG. 49B is a cross-sectional view taken along the line K-K' in FIG. 48.

Next, as illustrated in FIG. 48, FIG. 49A, and FIG. 49B, silicon oxide may be deposited by, for example, a chemical vapor deposition (CVD) method. Thus, a gate insulating film 25 may be formed on the inner surface of the hole 123. At this stage, the gate insulating film 25 may have, for example, a substantially elliptic cylindrical shape.

Figure 50:
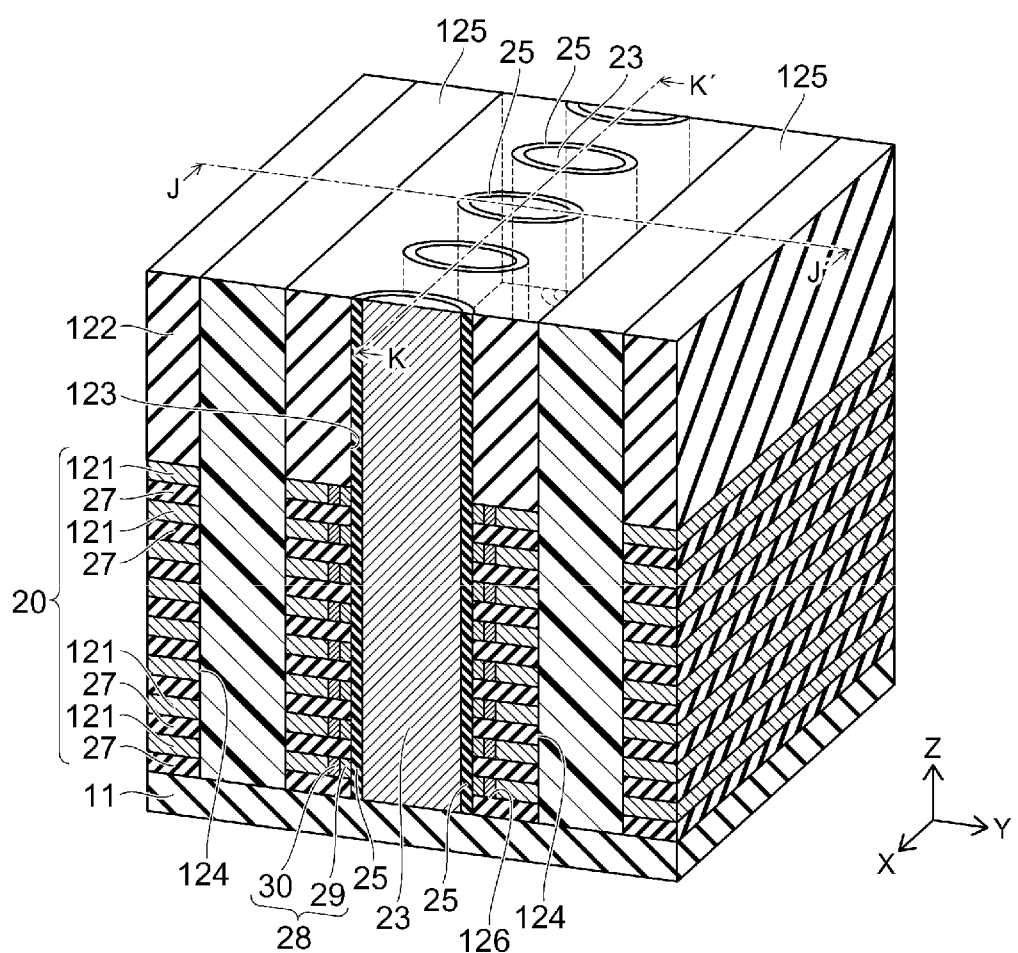
FIG. 50 is a perspective sectional view illustrating a method for manufacturing the resistance-change type memory device according to the third embodiment.
Figure 51A:
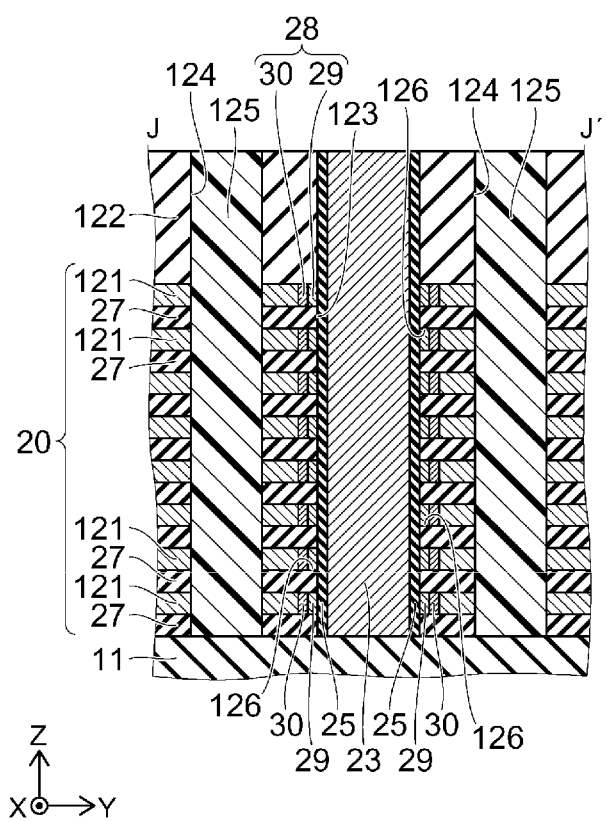
FIG. 51A is a cross-sectional view taken along the line J-J' in FIG. 50.
Figure 51B:
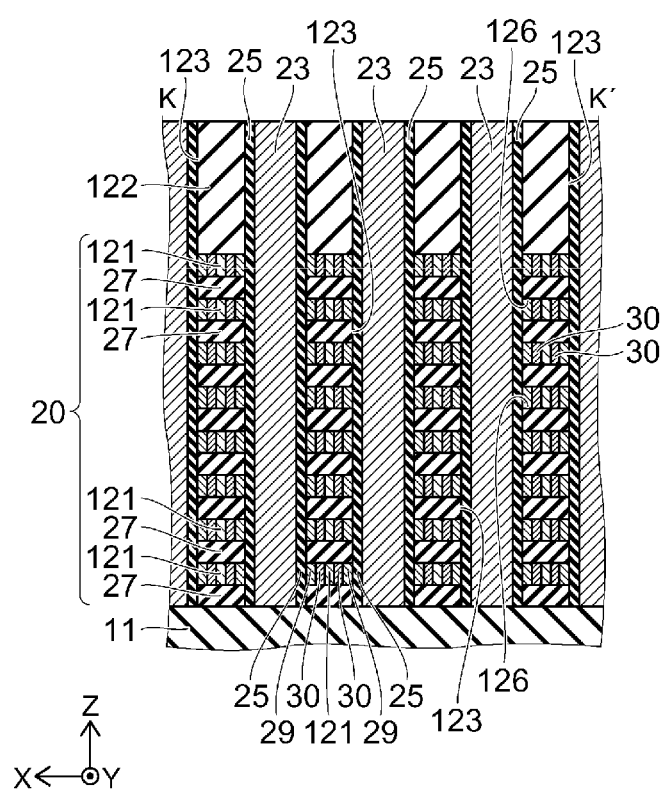
FIG. 51B is a cross-sectional view taken along the line K-K' in FIG. 50.

Next, as illustrated in FIG. 50, FIG. 51A, and FIG. 51B, a conductive material such as, for example, tungsten may be deposited to form a gate electrode 23 on the inner surface of the hole 123. At this stage, the gate electrode 23 may have, for example, a substantially elliptic cylindrical shape.

Figure 52:
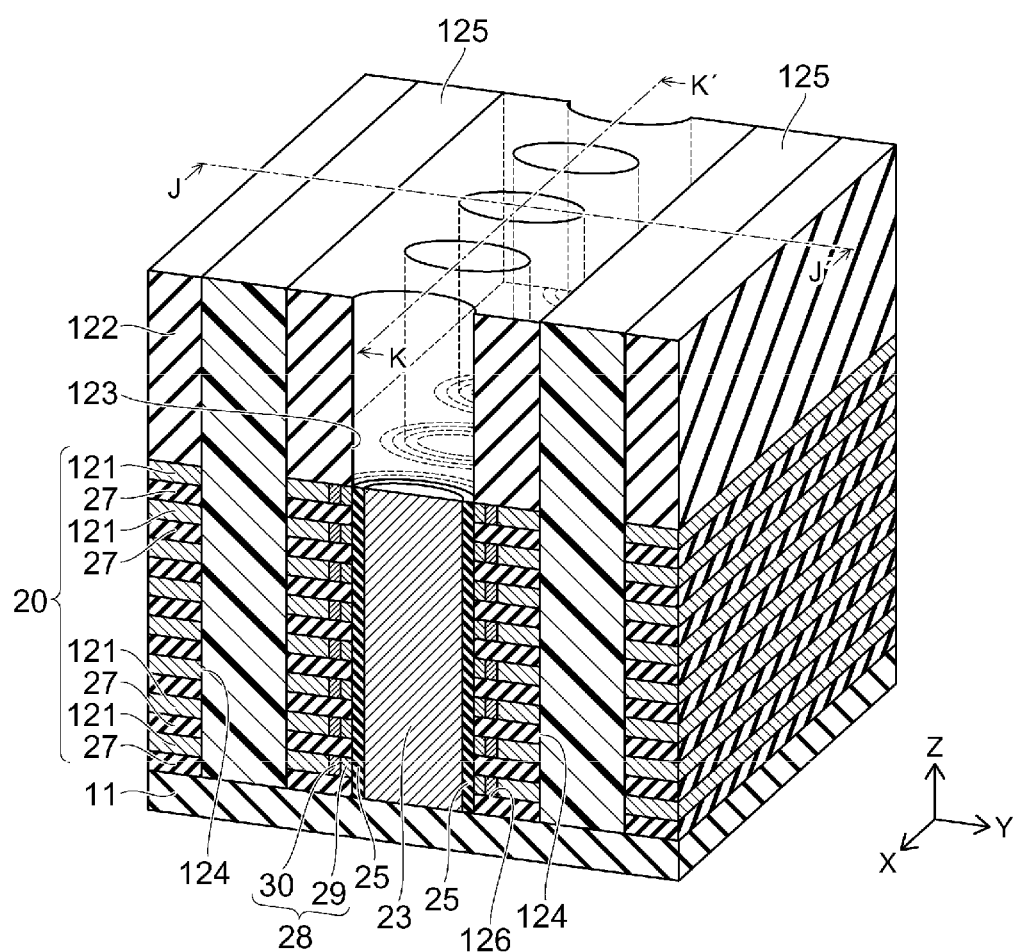
FIG. 52 is a perspective sectional view illustrating a method for manufacturing the resistance-change type memory device according to the third embodiment.
Figure 53A:
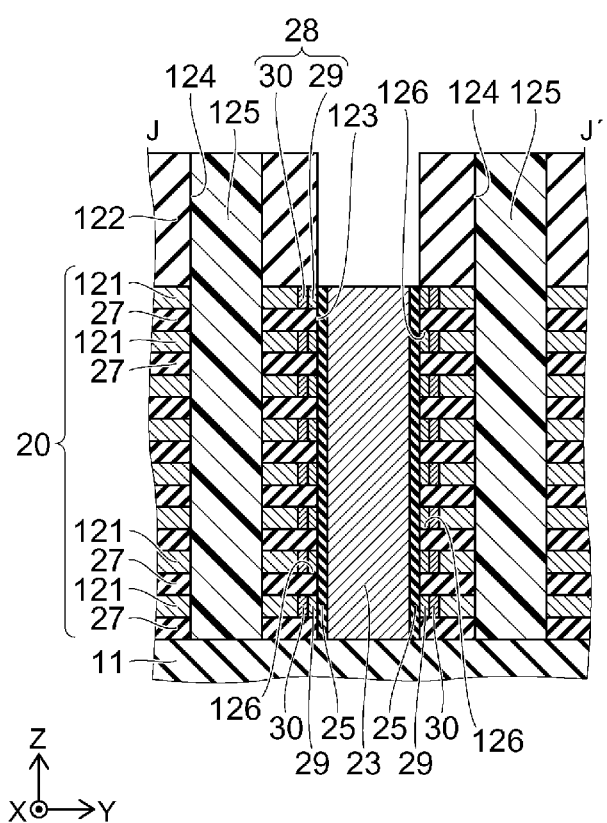
FIG. 53A is a cross-sectional view taken along the line J-J' in FIG. 52.
Figure 53B:
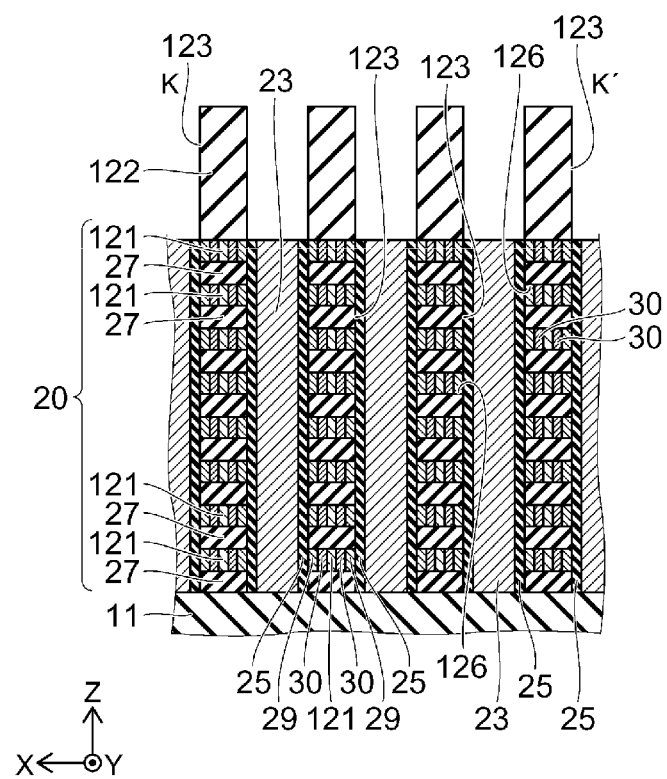
FIG. 53B is a cross-sectional view taken along the line K-K' in FIG. 52.

Next, as illustrated in FIG. 52, FIG. 53A, and FIG. 53B, the gate electrode 23 and the gate insulating film 25 may be etched back from the upper side. As a result, the portion of the gate electrode 23 and the gate insulating film 25 disposed in the hard mask 122 can be removed, and the portion disposed in the stacked body 20 can remain.

Figure 54:
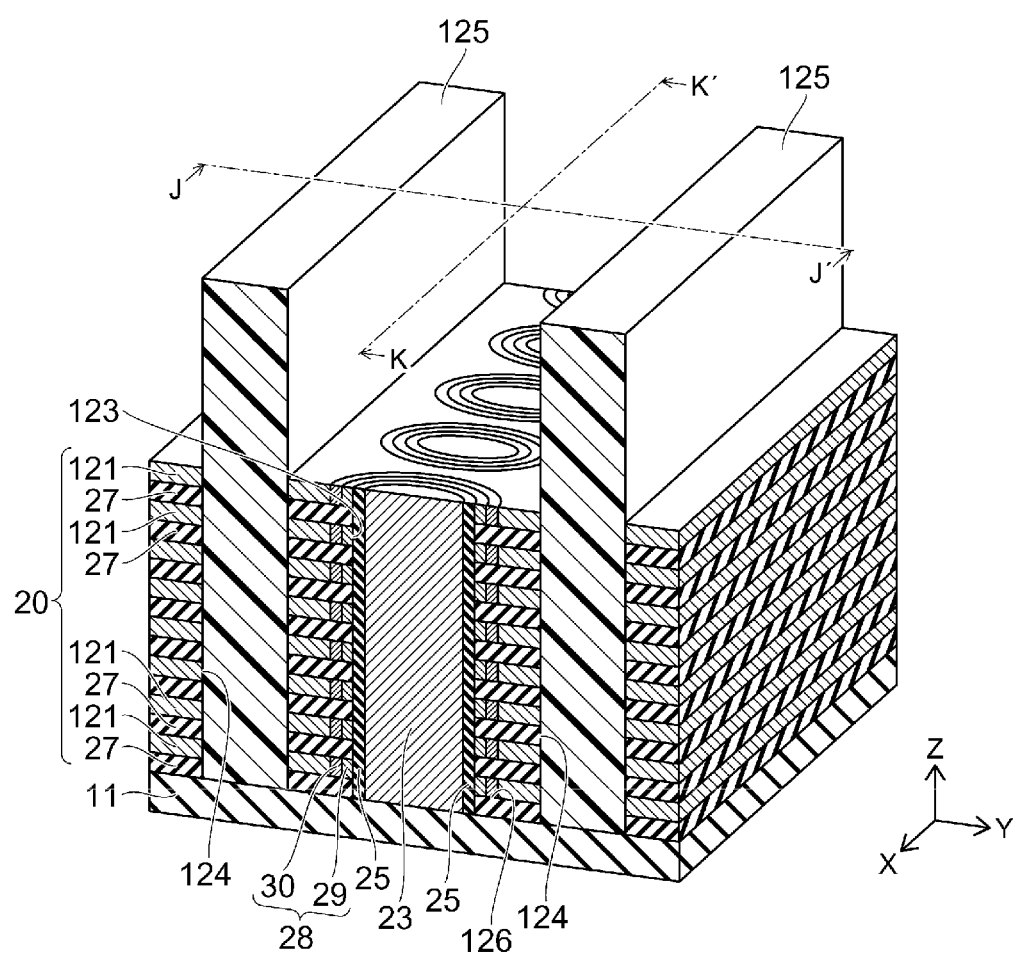
FIG. 54 is a perspective sectional view illustrating a method for manufacturing the resistance-change type memory device according to the third embodiment.
Figure 55A:
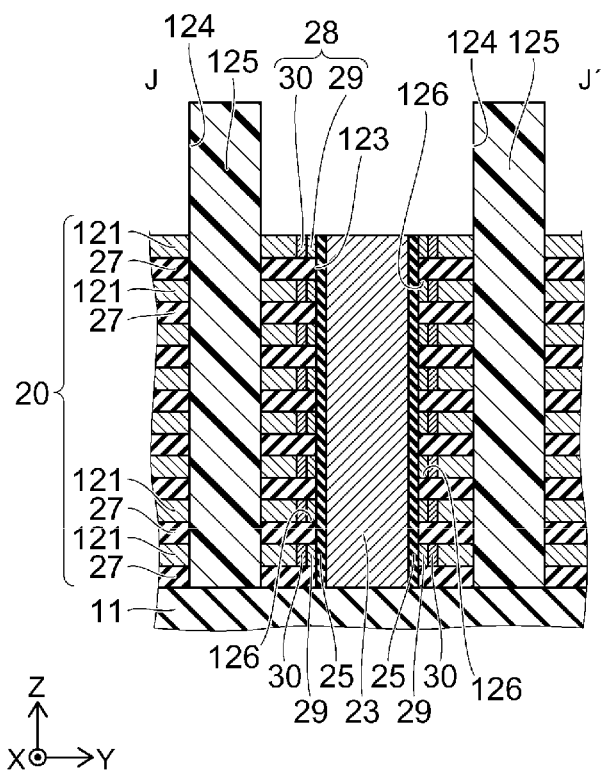
FIG. 55A is a cross-sectional view taken along the line J-J' in FIG. 54.
Figure 55B:
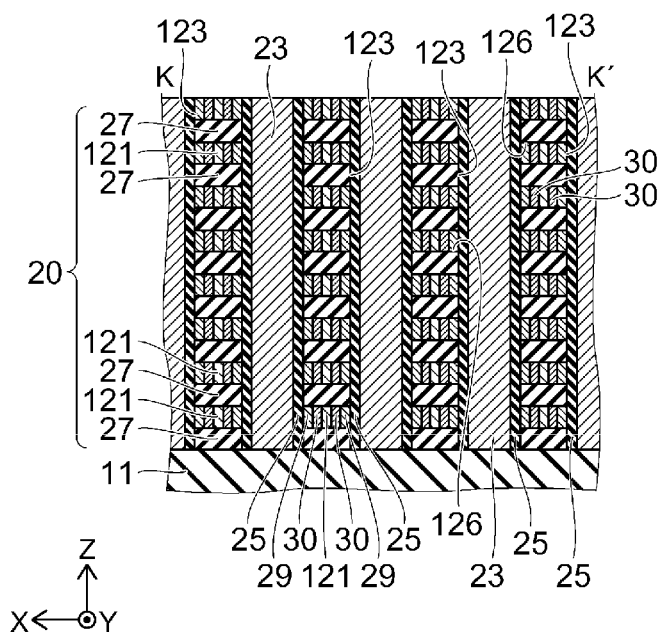
FIG. 55B is a cross-sectional view taken along the line K-K' in FIG. 54.

Next, as illustrated in FIG. 54, FIG. 55A, and FIG. 55B, the hard mask 122 (see FIG. 52) may be removed. As a result, the upper portion of the sacrificial member 125 and the upper surface of the stacked body 20 can be exposed. The upper portion of the sacrificial member 125 may protrude from the upper surface of the stacked body 20.

Figure 56:
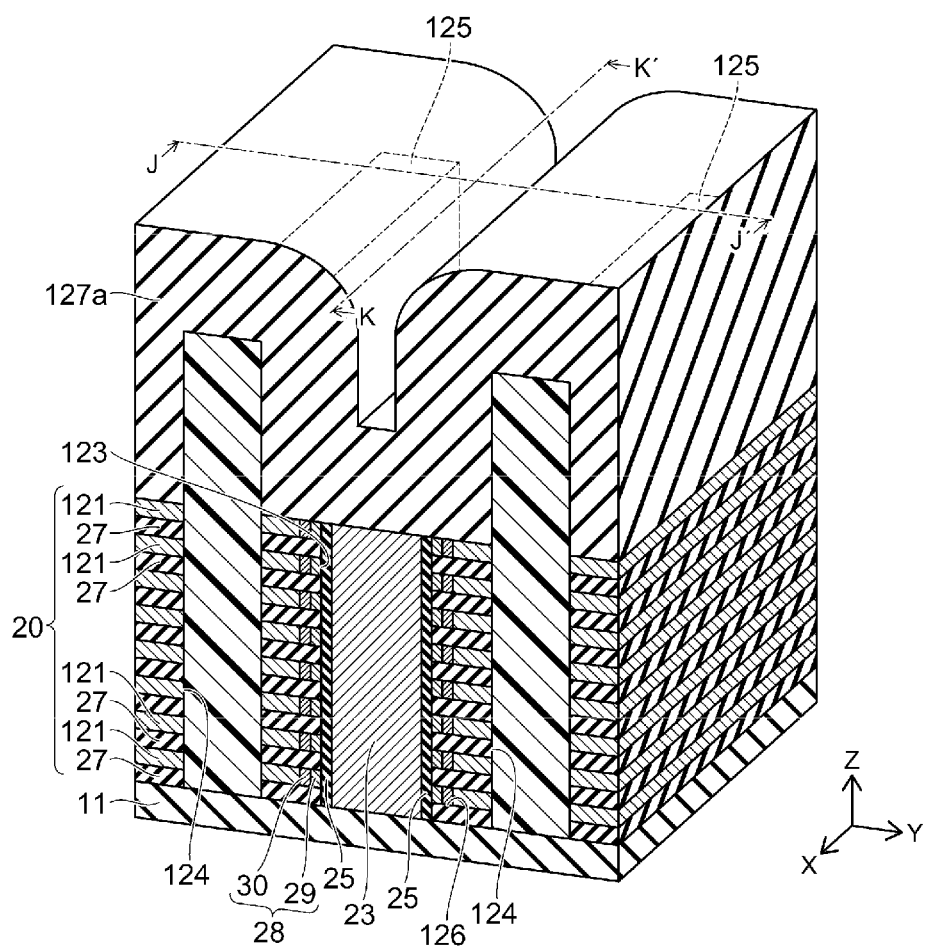
FIG. 56 is a perspective sectional view illustrating a method for manufacturing the resistance-change type memory device according to the third embodiment.
Figure 57A:
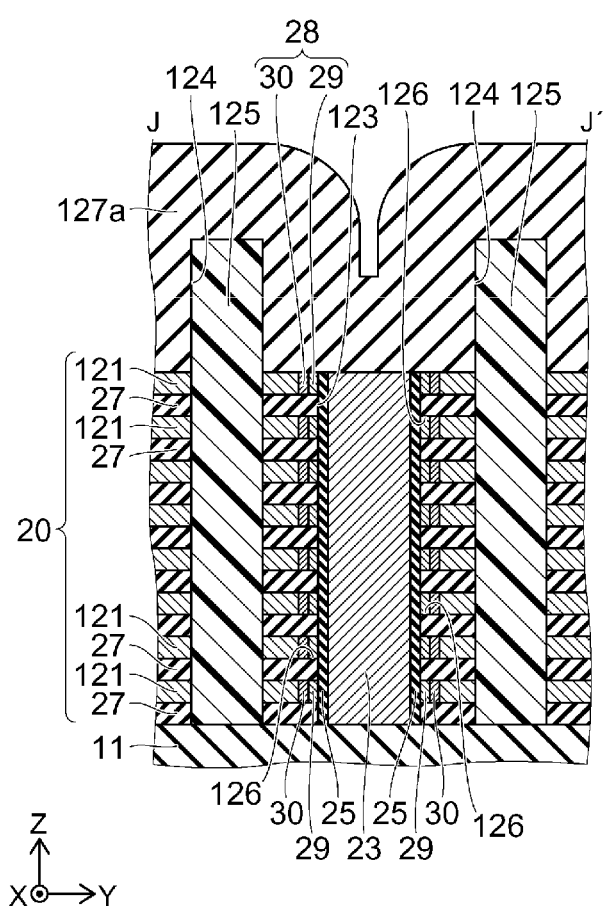
FIG. 57A is a cross-sectional view taken along the line J-J' in FIG. 56.
Figure 57B:
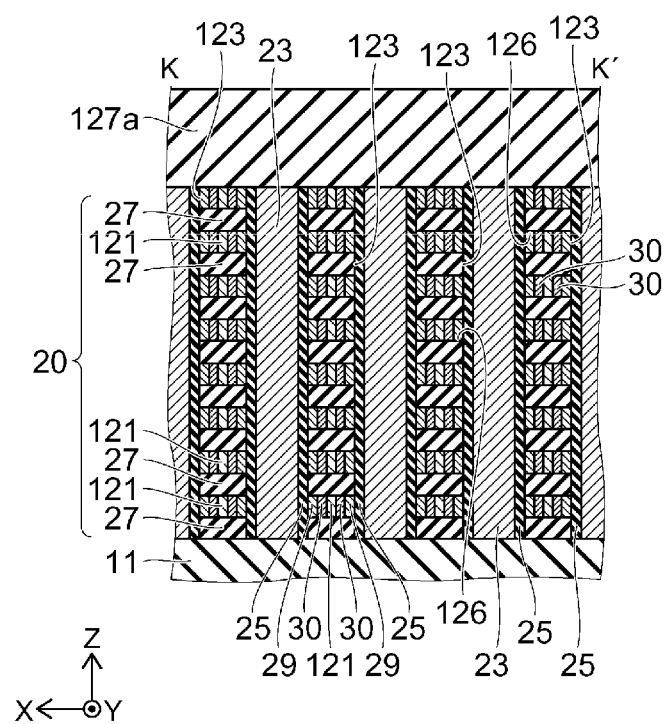
FIG. 57B is a cross-sectional view taken along the line K-K' in FIG. 56.

Next, as illustrated in FIG. 56, FIG. 57A, and FIG. 57B, silicon nitride may be deposited on the entire surface. Thus, a silicon nitride film 127a may be formed so as to cover the stacked body 20 and the sacrificial member 125. The silicon nitride film 127a may have a shape reflecting the projecting portion of the sacrificial member 125 (for example, the silicon nitride film 127a may have edges corresponding to edges of the sacrificial member 125).

Figure 58:
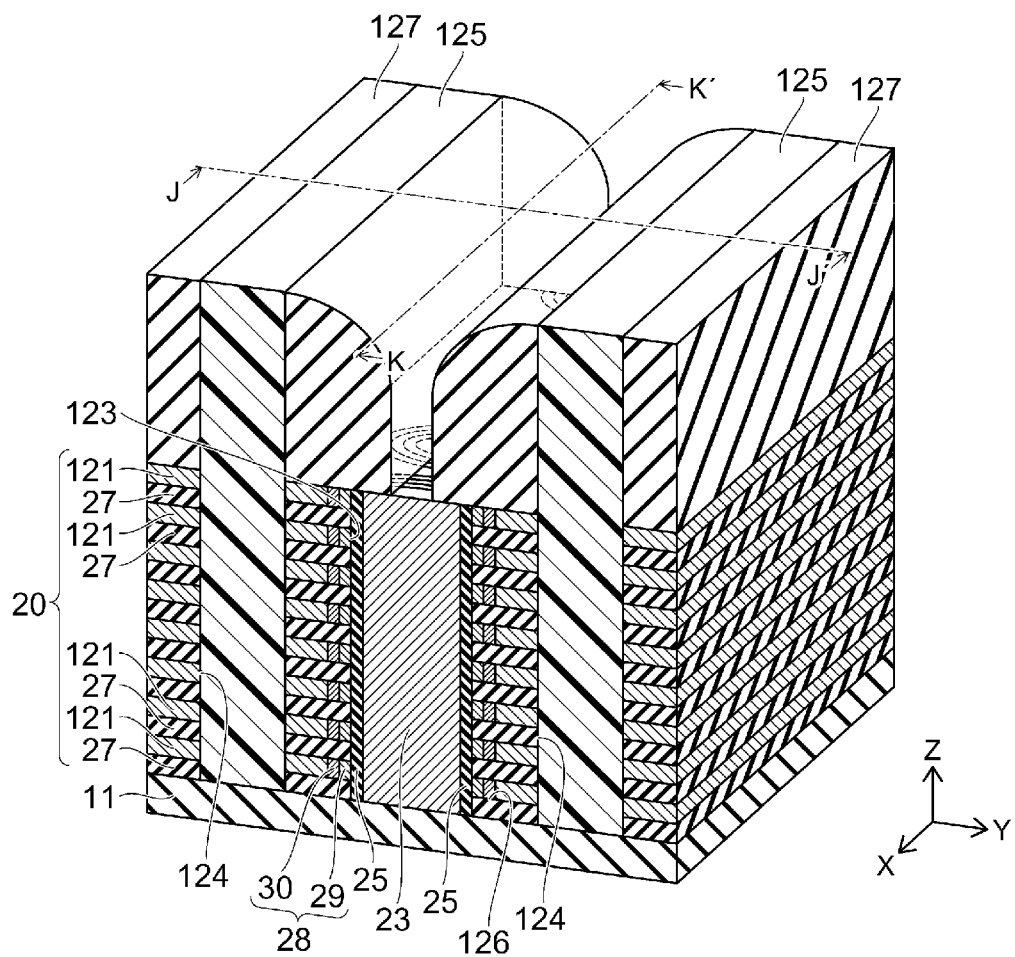
FIG. 58 is a perspective sectional view illustrating a method for manufacturing the resistance-change type memory device according to the third embodiment.
Figure 59A:
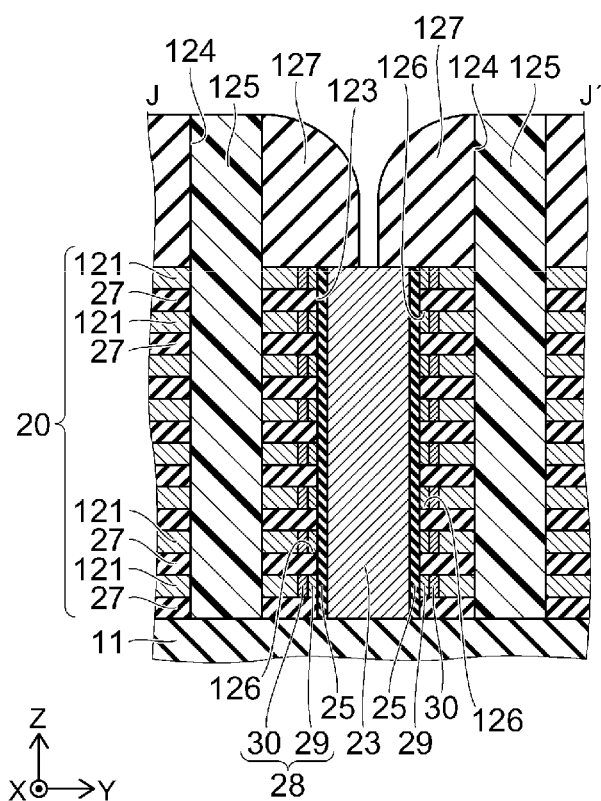
FIG. 59A is a cross-sectional view taken along the line J-J' in FIG. 58.
Figure 59B:
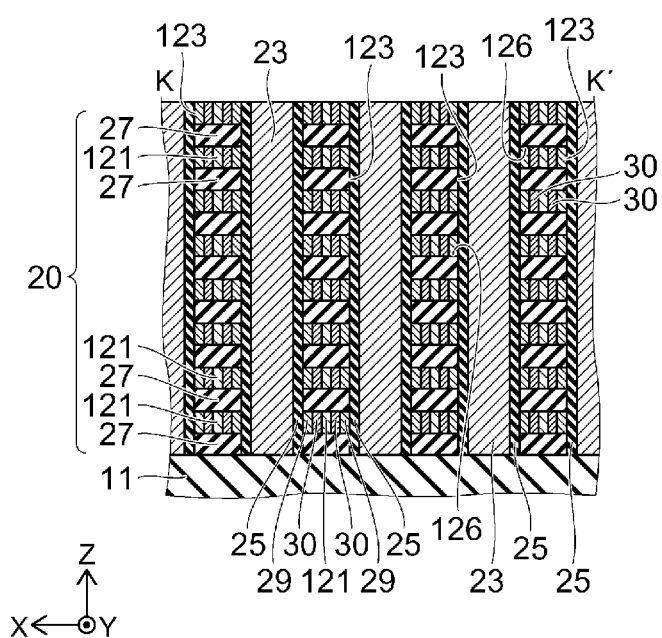
FIG. 59B is a cross-sectional view taken along the line K-K' in FIG. 58.

Next, as illustrated in FIG. 58, FIG. 59A, and FIG. 59B, RIE may be performed on the silicon nitride. Thus, the silicon nitride film 127a may be etched back from the upper surface side. As a result, the silicon nitride film 127a can remain on the lateral surface of the protruding portions of the sacrificial member 125, and can be removed from the region between the protruding portions of the sacrificial member 125 to become side walls 127. A gap extending in the X direction may be formed between the side walls 127, and a part of the stacked body 20, a part of the gate electrode 23, and the like are exposed in this gap (see FIG. 58). Specifically, the center portion in the Y direction of each gate electrode 23, the central portion in the Y direction of each gate insulating film 25, the central portion in the Y direction in each silicon film 29, the central portion in the Y direction in each resistance-change film 30, the central portion in the Y direction of the portion disposed between the adjacent gate electrodes 23 in the X direction in the stacked body 20 may be exposed.

Next, as illustrated in FIG. 60, FIG. 61A, FIG. 61B, and FIG. 74A, RIE may be performed using the side wall 127 and the sacrificial member 125 as a mask to remove the exposed portions of the stacked body 20, the gate electrode 23, and the like. As a result, a trench 128 (see FIG. 61A) can be formed in the stacked body 20. The trench 128 may be formed to reach the interlayer insulating film 11. At this stage, the lateral surface of the trench 128 may be a flat surface expanding along the XZ plane. Further, at this time, the side wall 127 may be also etched and contracted, and the upper surface of the sacrificial member 125 may be exposed.

By the trench 128, the elliptic cylindrical gate electrode 23 may be divided into two portions of semi-elliptic cylindrical shape, the elliptic cylindrical gate insulating film 25 may be divided into two portions of semi-elliptic cylindrical shape, the elliptic annular silicon film 29 may be divided into two portions of a semi-elliptical annular shape, and the elliptic annular resistance-change film 30 may be divided into two portions of a semi-elliptical annular shape. Hereinafter, each of the two divided portions of the gate electrode 23 is referred to as a gate electrode 23. The same is true for the gate insulating film 25, the silicon film 29, and the resistance-change film 30.

Next, as illustrated in FIG. 62, FIG. 63A, FIG. 63B, and FIG. 74B, the resistance-change film 30 may be recessed (e.g., partly removed) through the trench 128. As a result, the portions of the resistance-change film 30 exposed in the trench 128 can be removed to form a recessed portion 129 (see FIG. 63B).

Next, as illustrated in FIG. 64, FIG. 65A, FIG. 65B, and FIG. 74C, tungsten may be deposited and etched back to embed the tungsten member 130 in the recessed portion 129. The tungsten member 130 may be in contact with the tungsten film 121, the silicon film 29, and the resistance-change film 30.

Figure 66:
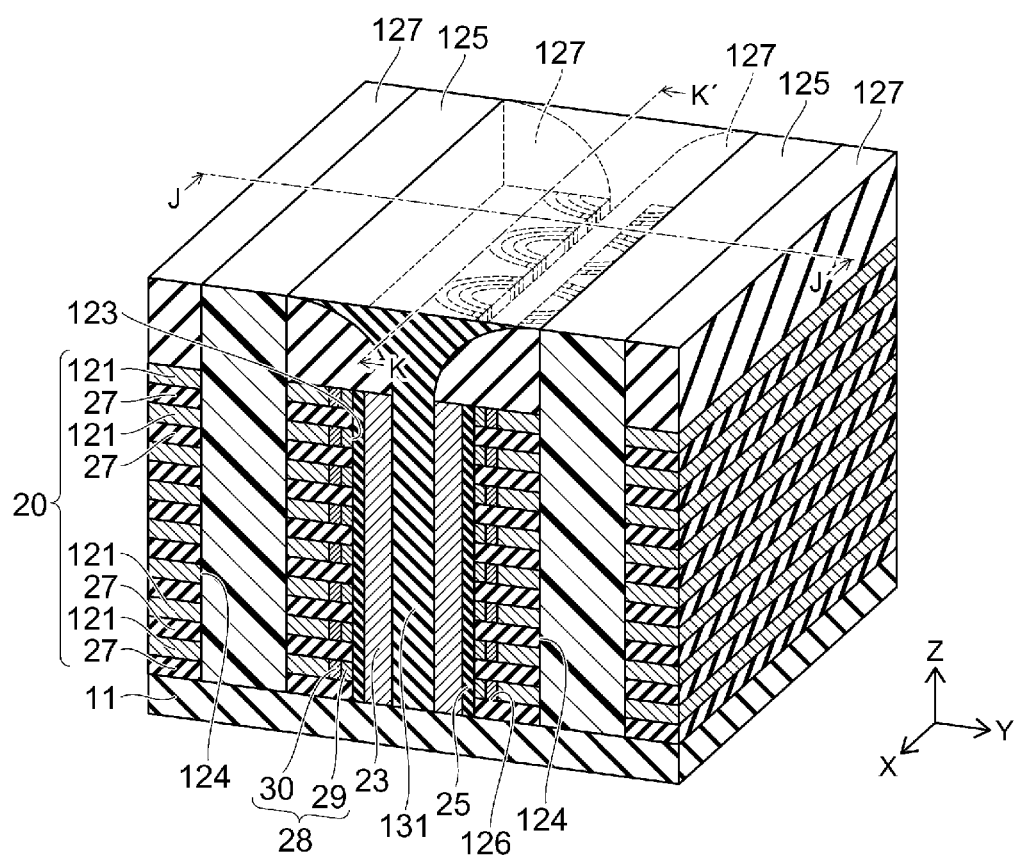
FIG. 66 is a perspective sectional view illustrating a method for manufacturing the resistance-change type memory device according to the third embodiment.
Figure 67A:
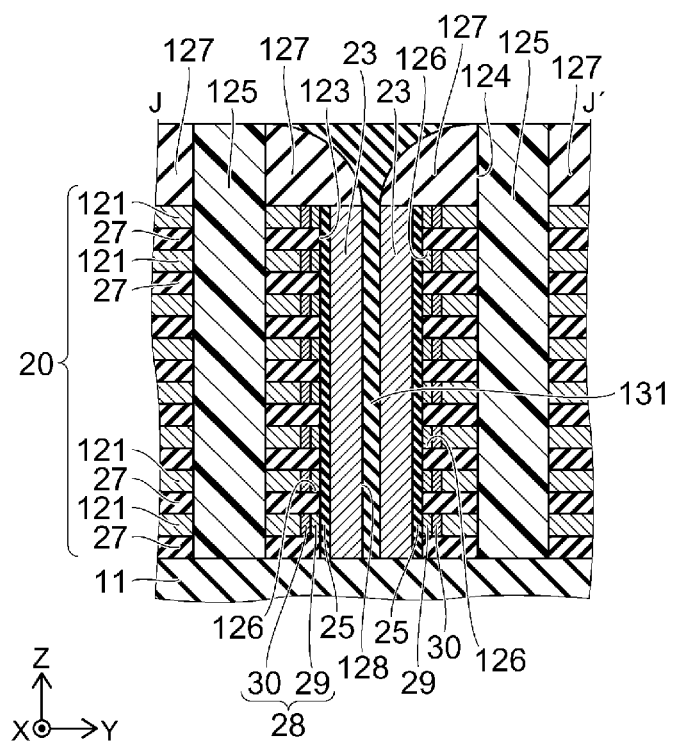
FIG. 67A is a cross-sectional view taken along the line J-J' in FIG. 66.
Figure 67B:
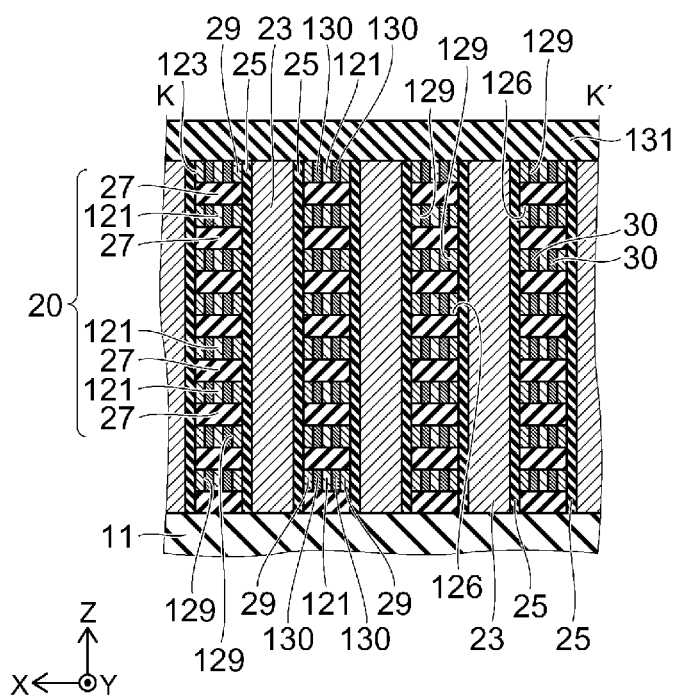
FIG. 67B is a cross-sectional view taken along the line K-K' in FIG. 66.

Next, as illustrated in FIG. 66, FIG. 67A, and FIG. 67B, a spin-on-glass (SOG) material may be applied to the entire surface. As a result, an SOG member 131 containing silicon oxide can be embedded in the trench 128 and between the side walls 127.

Figure 68:
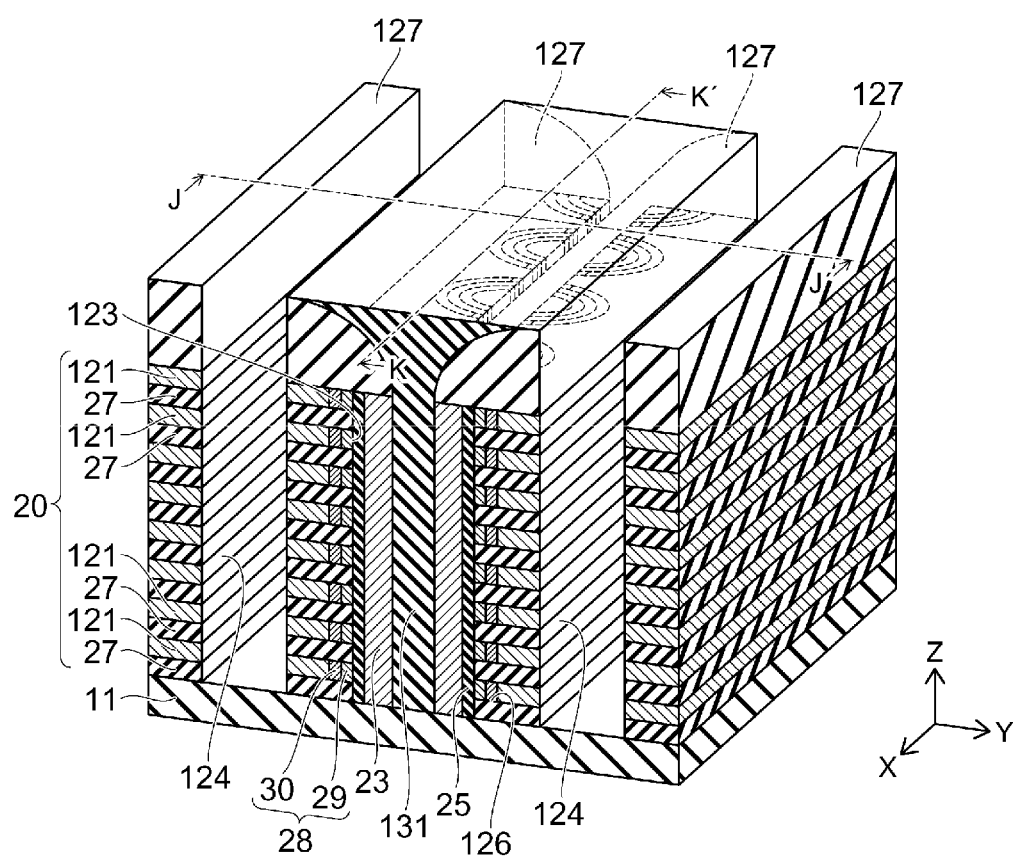
FIG. 68 is a perspective sectional view illustrating a method for manufacturing the resistance-change type memory device according to the third embodiment.
Figure 69A:
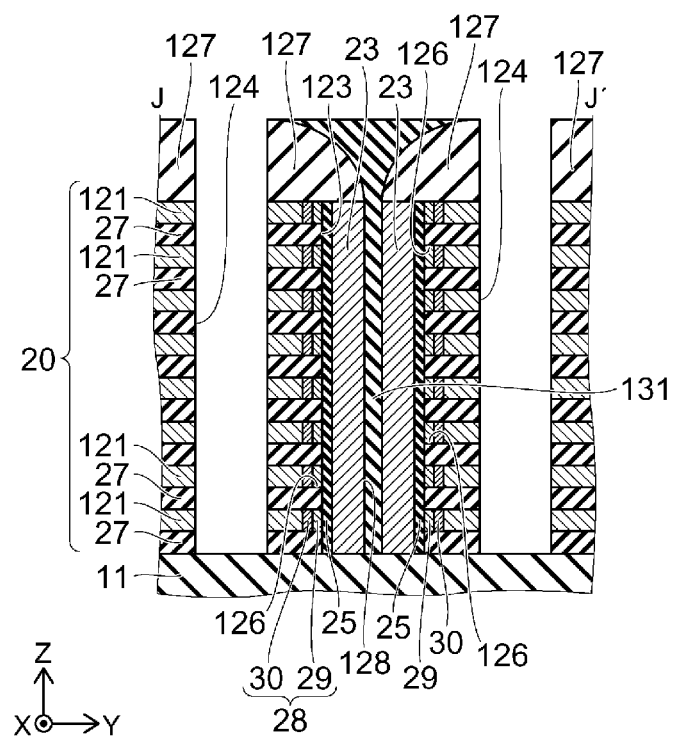
FIG. 69A is a cross-sectional view taken along the line J-J' in FIG. 68.
Figure 69B:
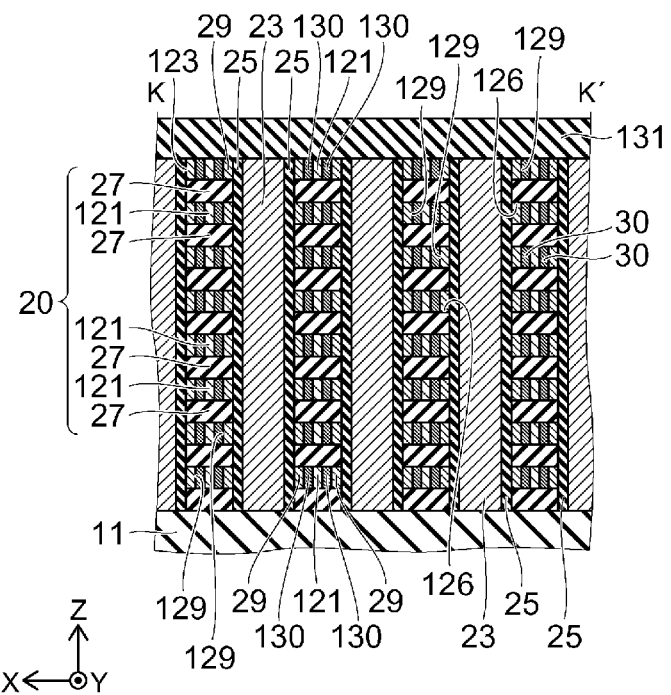
FIG. 69B is a cross-sectional view taken along the line K-K' in FIG. 68.

Next, as illustrated in FIG. 68, FIG. 69A, and FIG. 69B, the sacrificial member 125 made of an organic material (see FIG. 66) may be removed by ashing. As a result, the inner surface of the trench 124 can be exposed again.

Figure 71A:
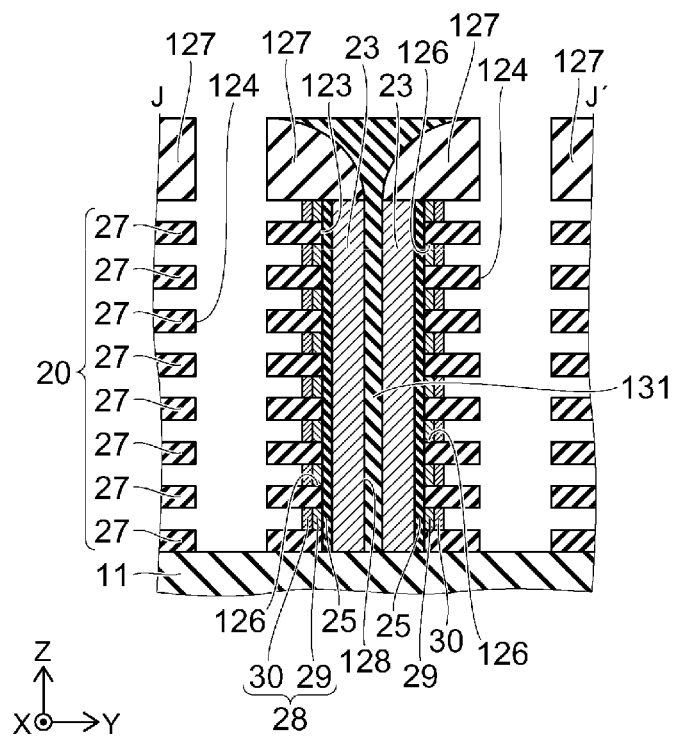
FIG. 71A is a cross-sectional view taken along the line J-J' in FIG. 70.
Figure 71B:
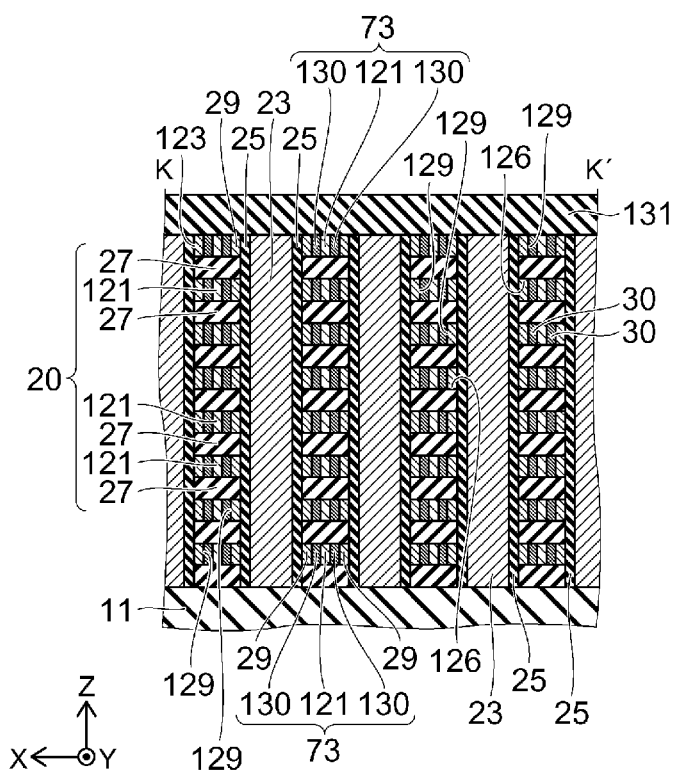
FIG. 71B is a cross-sectional view taken along the line K-K' in FIG. 70.

Next, as illustrated in FIG. 70, FIG. 71A, and FIG. 71B, the tungsten film 121 may be etched back through the trench 124 by, for example, wet etching using phosphoric-nitric-acetic acid. As a result, the tungsten film 121 can be largely retreated from the side of the trench 124 and left in the vicinity of the insulating film 71, that is, in the vicinity of the tungsten members 130 adjacent to each other in the X direction. A conductive film 73 may include the tungsten members 130 adjacent to each other in the X direction and the tungsten film 121 disposed therebetween.

Next, as illustrated in FIG. 72, FIG. 73A, and FIG. 73B, the side wall 127 and the SOG member 131 (see FIG. 70) may be removed. As a result, the inner surface of the trench 128 can be exposed again.

Next, as illustrated in FIG. 31 to FIG. 34, silicon oxide may be deposited on the entire surface, and the upper surface may be planarized. As a result, the insulating film 71 can be embedded in the trench 128, and the insulating film 77 can be embedded in the trench 124. The insulating film 27 may become a part of the insulating film 77. The subsequent manufacturing steps are the same as those in the second embodiment described above. In this manner, the resistance-change type memory device 3 according to the third embodiment is manufactured.

In the third embodiment, when lithography is performed with sufficient accuracy in the steps illustrated in FIG. 38, FIG. 39A, and FIG. 39B, the subsequent steps may be performed in a self-aligned manner.

Modification of Third Embodiment

Next, a modification of the third embodiment will be described.

Figure 75:
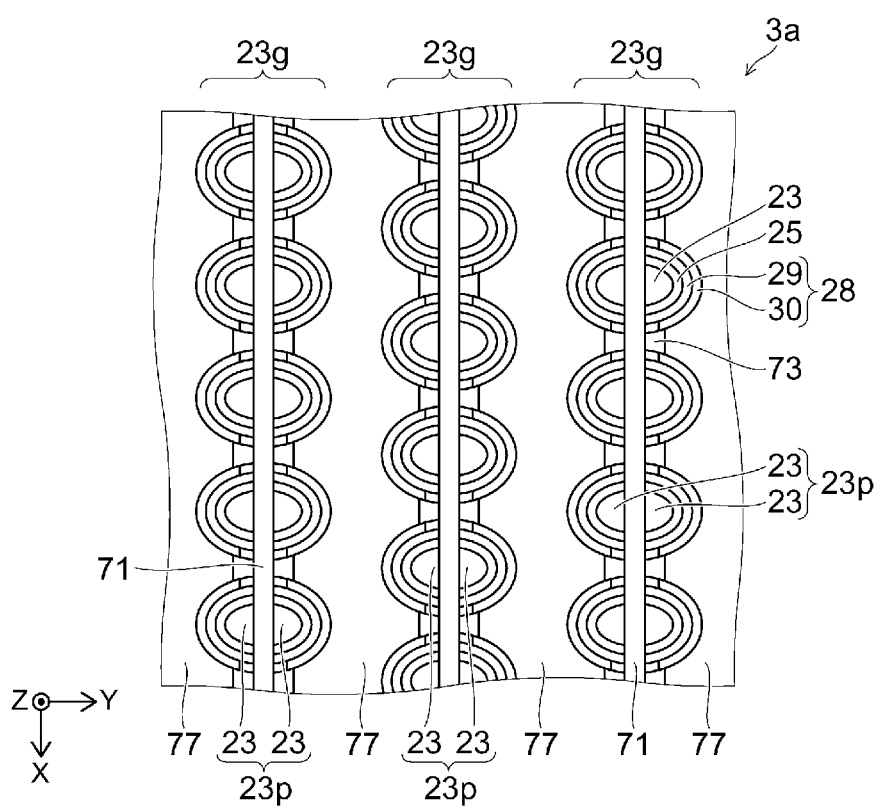
FIG. 75 is a plan view illustrating a resistance-change type memory device according to a modification of the third embodiment.

FIG. 75 is a plan view illustrating a resistance-change type memory device according to the modification.

As illustrated in FIG. 75, in a resistance-change type memory device 3a according to the modification, electrode pairs 23p may be arranged in a zigzag pattern when viewed from the Z direction. That is, in electrode groups 23g adjacent to each other in the Y direction, the positions of the electrode pairs 23p in the X direction may be different from each other, and in electrode groups 23g arranged at every other position in the Y direction, the positions of the electrode pairs 23p in the X direction may be the same as each other.

According to the modification, the arrangement density of the electrode pair 23p in the Y direction may be improved, compared with the third embodiment described above. Thus, the degree of integration of the memory cell can be further improved.

The configuration, operation, effect, and manufacturing method other than those described above in the modification are the same as those in the third embodiment.

According to the above-described embodiments, it is possible to implement a resistance-change type memory device having high stability in operation.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A resistance-change type memory device comprising:
   a substrate;
   a plurality of electrodes arranged in a first direction parallel to an upper surface of the substrate and extending in a second direction intersecting the upper surface;
   a resistance-change film provided in a third direction that is parallel to the upper surface and intersects the first direction when viewed from the plurality of electrodes, the resistance-change film having a resistance value that changes when a current flows therein;
   a semiconductor film provided between the plurality of electrodes and the resistance-change film; and
   an insulating film provided between the plurality of electrodes and the semiconductor film,
   wherein the semiconductor film is continuously formed over the entirety of a length of a column formed of the plurality of electrodes, and
   wherein the resistance-change film is provided on each of the plurality of electrodes such that resistance-change films on every two adjacent electrodes are spaced apart from each other.

2. The resistance-change type memory device according to claim 1, wherein a current path is formed through the resistance-change film and the semiconductor film over the entirety of the length of the column formed of the plurality of electrodes.

3. The resistance-change type memory device according to claim 1, wherein the resistance-change film is continuously formed over the entirety of the length of the column formed of the plurality of electrodes.

4. The resistance-change type memory device according to claim 1, further comprising:
   a conductive film,
   wherein the conductive film is provided on each of the plurality of electrodes such that conductive films on every two adjacent electrodes are spaced apart from each other, and
   the conductive film is connected between semiconductor films adjacent to each other in the first direction.

5. A resistance-change type memory device comprising:
   a substrate; and
   a plurality of first structures and a plurality of second structures provided on the substrate and alternately arranged in a first direction parallel to an upper surface of the substrate,
   wherein each of the first structures includes a first columnar body and a second insulating columnar body arranged alternately in a second direction that is parallel to the upper surface and intersects the first direction,
   a position of the first columnar body of one of two adjacent first structures in the second direction is equal to a position of the second insulating columnar body of a remaining one of the two adjacent first structures in the second direction,
   each of the second structures includes a first insulating film and a first film alternately stacked in a third direction intersecting the upper surface and extending in the second direction,
   the first columnar body includes:
      a first electrode extending in the third direction; and
      a second insulating film provided between the first electrode and the first film, and
   the first film includes:

a single semiconductor film extending in the second direction; and a plurality of resistance-change film provided between the semiconductor film and the second insulating columnar body and having a resistance value that changes when a current flows therein.

6. The resistance-change type memory device according to claim 5, wherein a length of the first columnar body in the first direction is longer than a length of the second insulating columnar body in the first direction.

7. A resistance-change type memory device comprising: a substrate; a semiconductor film extending in a first direction parallel to a surface of the substrate; a first electrode extending in a second direction perpendicular to the surface of the substrate; a second electrode being arranged adjacent to the first electrode in the first direction and extending in the second direction; a third electrode being arranged between the first electrode and the second electrode in the first direction and arranged at a different location from the first electrode and the second electrode in a third direction crossing the first and second directions; a resistance-change film being provided between the first electrode and the second electrode; a first insulating film being provided between the first electrode and the semiconductor film; a second insulating film being provided between the second electrode and the semiconductor film; and a third insulating film being provided between the third electrode and the semiconductor film, wherein the semiconductor film is provided between the resistance-change film and the third insulating film.

8. The resistance-change type memory device according to claim 7, further comprising:

a first insulating member being provided between the first electrode and the second electrode, wherein the resistance-change film is provided between the first insulating member and the semiconductor film.

9. The resistance-change type memory device according to claim 7, further comprising: a fourth electrode being arranged adjacent to the second electrode in the first direction; a fourth insulating film being provided between the fourth electrode and the semiconductor film; and a second insulating member being provided between the second electrode and the fourth electrode.

10. The resistance-change type memory device according to claim 9, wherein the second insulating member is in contact with the semiconductor film.

11. The resistance-change type memory device according to claim 7, further comprising:

a first interconnection being electrically connected to the semiconductor film.

12. The resistance-change type memory device according to claim 7, further comprising:

a second interconnection being electrically connected to the first electrode.

13. The resistance-change type memory device according to claim 9, further comprising:

a third interconnection being electrically connected to the fourth electrode.

14. The resistance-change type memory device according to claim 7, wherein a current path is formed through the resistance-change film and the semiconductor film over a column formed of the first and the second electrodes.

15. The resistance-change type memory device according to claim 7, wherein a part of the first electrode protrudes from an interface between the resistance change film and the semiconductor film in the third direction.

* * * * *